(12) United States Patent
Yamazaki et al.

(10) Patent No.: US 12,720,951 B2
(45) Date of Patent: Aug. 25, 2026

(54) LIGHT-EMITTING APPARATUS, ELECTRONIC EQUIPMENT, DISPLAY APPARATUS, AND LIGHTING DEVICE

(71) Applicant: SEMICONDUCTOR ENERGY LABORATORY CO., LTD., Atsugi (JP)

(72) Inventors: Shunpei Yamazaki, Tokyo (JP); Satoshi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 406 days.

(21) Appl. No.: 18/262,408

(22) PCT Filed: Jan. 13, 2022

(86) PCT No.: PCT/IB2022/050223
§ 371 (c)(1),
(2) Date: Jul. 21, 2023

(87) PCT Pub. No.: WO2022/162482
PCT Pub. Date: Aug. 4, 2022

(65) Prior Publication Data

US 2024/0121990 A1 Apr. 11, 2024

(30) Foreign Application Priority Data

Jan. 27, 2021 (JP) ................................ 2021-011206
Jan. 27, 2021 (JP) ................................ 2021-011354

(51) Int. Cl.
*H10K 50/813* (2023.01)
*H10K 59/122* (2023.01)
(Continued)

(52) U.S. Cl.
CPC ......... *H10K 50/813* (2023.02); *H10K 59/122* (2023.02); *H10K 59/80515* (2023.02); *H10K 59/35* (2023.02)

(58) Field of Classification Search
CPC .............. H10K 50/813; H10K 59/122; H10K 59/80515; H10K 59/35
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001610461 A 4/2005
CN 001658725 A 8/2005
(Continued)

OTHER PUBLICATIONS

JP2010-021138, machine translation, 2010 (Year: 2010).*
(Continued)

*Primary Examiner* — Tracie Y Green
(74) *Attorney, Agent, or Firm* — Fish & Richardson P.C.

(57) ABSTRACT

A light-emitting apparatus can be provided at low cost. The light-emitting apparatus includes a plurality of partitions formed over an insulating surface and extending in a first direction, a plurality of pixel electrodes each having an island shape formed over the insulating surface, an EL layer formed over the pixel electrodes, and a second electrode formed over the EL layer. The partition has an insulating property, the pixel electrodes that are aligned in the first direction are positioned column by column between adjacent partitions in the plurality of partitions, and the EL layer is in contact with the insulating surface between the pixel elec-
(Continued)

trodes adjacent to each other in the first direction in the pixel electrodes aligned in the first direction.

20 Claims, 22 Drawing Sheets

(51) Int. Cl.
*H10K 59/35* (2023.01)
*H10K 59/80* (2023.01)

(56) References Cited

U.S. PATENT DOCUMENTS 7,692,197 B2 4/2010 Park et al.
7,893,438 B2 2/2011 Kim et al.
8,283,219 B2 10/2012 Kim et al.
9,012,927 B2 4/2015 Okamoto et al.
9,960,382 B2 5/2018 Kon
10,763,311 B2 9/2020 Kim
10,770,528 B2 9/2020 Kim
2002/0072139 A1 6/2002 Kashiwabara
2005/0110021 A1 5/2005 Park et al.
2010/0244673 A1* 9/2010 Nomura ................ H05B 33/14 313/504
2011/0148290 A1 6/2011 Oota
2012/0256204 A1 10/2012 Yoshizumi et al.
2012/0273804 A1 11/2012 Hatano
2012/0276484 A1 11/2012 Izumi et al.
2013/0075708 A1 3/2013 Kurihara et al.
2013/0084531 A1 4/2013 Hamaguchi et al.
2013/0084664 A1 4/2013 Yoshitoku et al.
2013/0084666 A1 4/2013 Oshige
2013/0134452 A1 5/2013 Okamoto et al.
2013/0280839 A1 10/2013 Sonoda et al.
2013/0295705 A1 11/2013 Sonoda et al.
2014/0004640 A1 1/2014 Hamaguchi et al.
2014/0004642 A1 1/2014 Otsuka et al.
2015/0060826 A1 3/2015 Matsumoto et al.
2015/0069360 A1 3/2015 Sato
2015/0076476 A1 3/2015 Odaka et al.
2016/0172595 A1 6/2016 Malinowski et al.
2016/0315133 A1 10/2016 Sato
2017/0141167 A1 5/2017 Naganuma
2017/0256754 A1 9/2017 Defranco et al.
2018/0190908 A1 7/2018 Ke et al.
2020/0013985 A1 1/2020 Park et al.
2020/0176692 A1 6/2020 Watabe et al.
2020/0194513 A1 6/2020 Kim
2020/0194521 A1 6/2020 Kim
2020/0203662 A1 6/2020 Mollard et al.
2021/0122928 A1 4/2021 Higashi
2021/0296588 A1 9/2021 Murakaji et al.
2022/0181572 A1 6/2022 Ohsawa et al.
2022/0209162 A1 6/2022 Seo et al.

FOREIGN PATENT DOCUMENTS

CN 102823326 A 12/2012
CN 103137652 A 6/2013
CN 111312756 A 6/2020
CN 111312757 A 6/2020
CN 112368857 A 2/2021
CN 112469780 A 3/2021
EP 2555596 A 2/2013
EP 3819958 A 5/2021
EP 3828234 A 6/2021
JP 2000-036385 A 2/2000
JP 2003-059663 A 2/2003
JP 2005-157312 A 6/2005
JP 2008-098106 A 4/2008
JP 2008-147072 A 6/2008
JP 2008-251270 A 10/2008
JP 2010-021138 A 1/2010
JP 2011-210407 A 10/2011
JP 2012-160473 A 8/2012
JP 2013-137993 A 7/2013
JP 2014-120218 A 6/2014
JP 2014-135251 A 7/2014
JP 2014-232568 A 12/2014
JP 2015-115178 A 6/2015
JP 2016-197494 A 11/2016
JP 2019-179696 A 10/2019
JP 2020-160305 A 10/2020
KR 2005-0049693 A 5/2005
KR 2013-0054255 A 5/2013
KR 2017-0014206 A 2/2017
KR 2020-0072160 A 6/2020
KR 2020-0072162 A 6/2020
KR 2021-0030382 A 3/2021
KR 2021-0036937 A 4/2021
TW 201214823 4/2012
TW 202006061 2/2020
TW 202012557 4/2020
WO WO-2011/122445 10/2011
WO WO-2014/199741 12/2014
WO WO-2020/009138 1/2020
WO WO-2020/022211 1/2020

OTHER PUBLICATIONS

International Search Report (Application No. PCT/IB2022/050223) Dated Apr. 26, 2022.
Written Opinion (Application No. PCT/IB2022/050223) Dated Apr. 26, 2022.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Papadopoulos.N et al., "AMOLED Displays with In-Pixel Photodetector", Liquid Crystals and Display Technology, Jul. 9, 2020, pp. 1-19.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Zakhidov.A et al., "Orthogonal processing: A new strategy for organic electronics", Chem. Sci. (Chemical Science), Apr. 7, 2011, vol. 2, No. 6, pp. 1178-1182.

* cited by examiner

First direction
102-1
101-1
102-2
100
101-2
101-3

103-2
103-1
101
103-3
102
A
B 101
103
100
104
C
D

FIG. 3A1
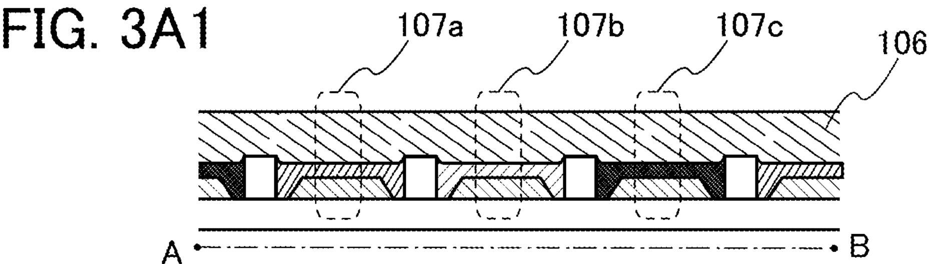
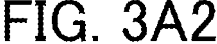
FIG. 3A2
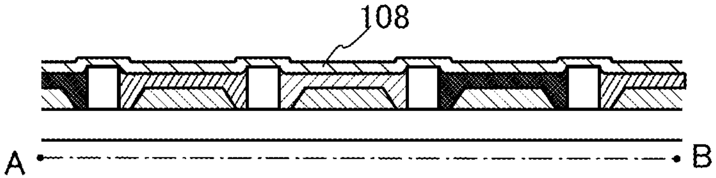
FIG. 3B2
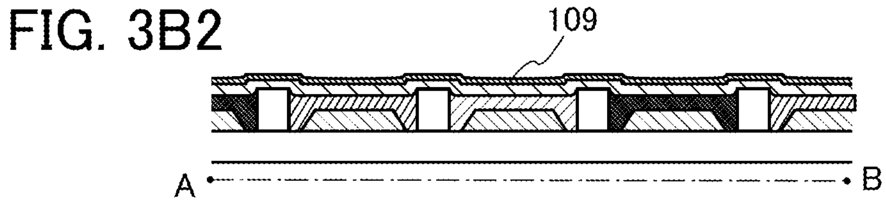
FIG. 3C2
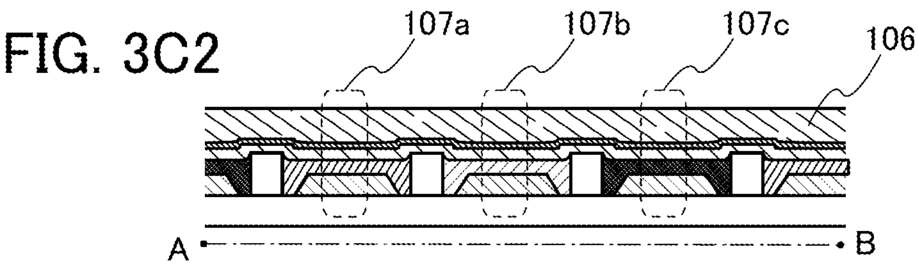

400A 442
228
443
215
213
211
222b
223
205
231
221
222a
430c
B
426c
411c
452
416
430b
G
411b
426b
421
430a
R
426a
411a
417
462
464
201
465
242
466
472
204
214
451
416c
416a
416b
430c
214

400B
454
228
442
215
225
211
462
464
B
430c
G
430b
421
416
417
222b
210
231i
221
223
231n
222a
212
202
465
242
466
472
214
204
453
455

218
215
222b
225
223
231n
231i
231
221
222a
209

400C
442
228
443
215
213
211
205
430c
B
452
416
411c
205
430b
411b
462
G
222a
221
421
231
223
205
430a
222b
R
411a
464
201
242
465
466
472
204
214
451

20
25
4420
4411
4430
103
21

20
25
4420-2
4420-1
4411
4430-2
4430-1
103
21

20
25
4420
4411
4412
4413
4430
103
21

20
25
4411
103
21

25
4420
4411
4430
103a
4440
4420
4412
4430
103b
21

FIG. 11A
FIG. 11B
FIG. 11C
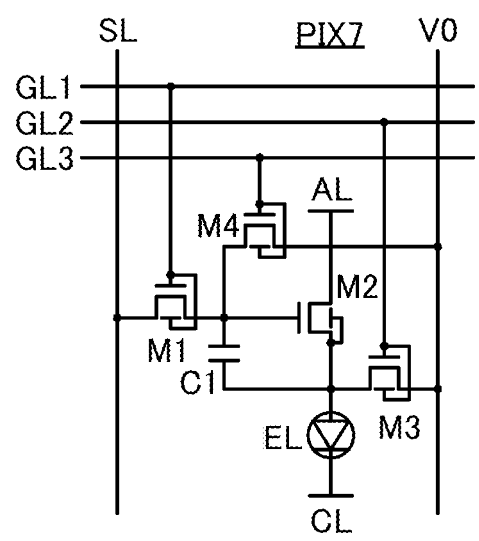
FIG. 11D
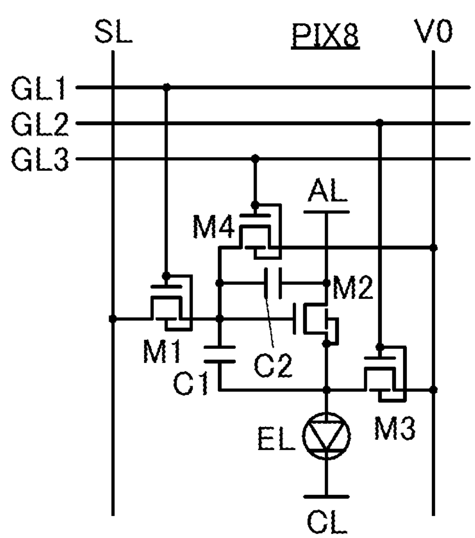

7100
7101
7000
7103
7111

7200
7211
7000
7212
7213
7214

FIG. 15A
FIG. 15B
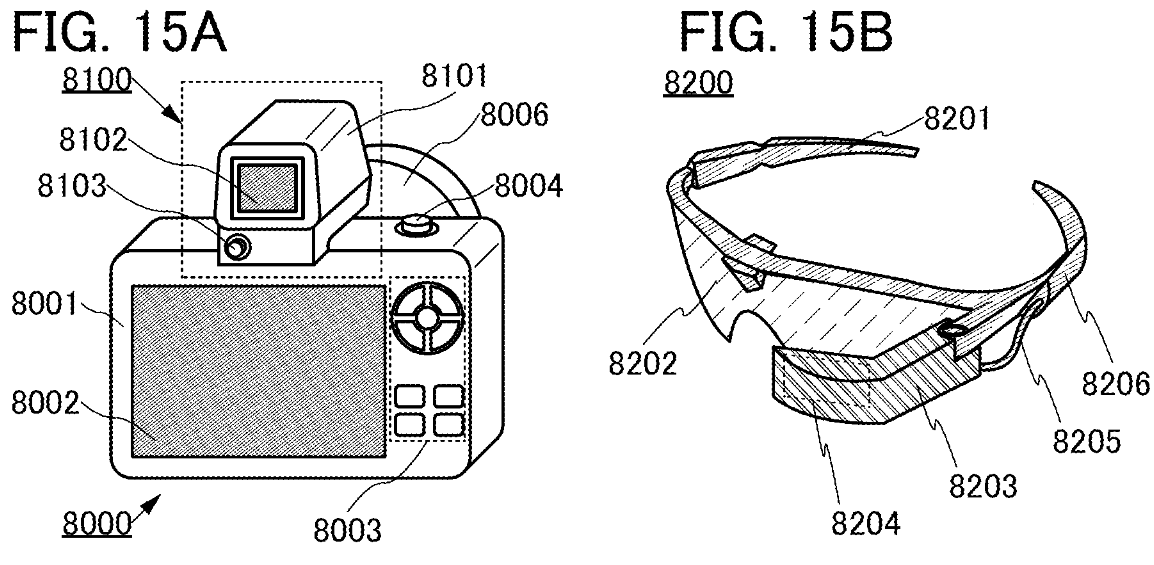
FIG. 15C
FIG. 15D
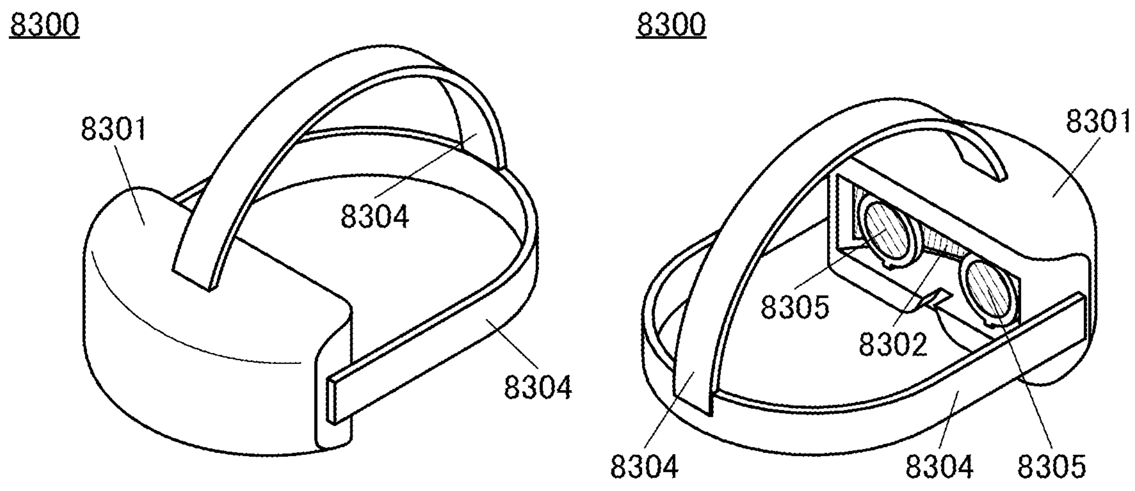
FIG. 15E
FIG. 15F
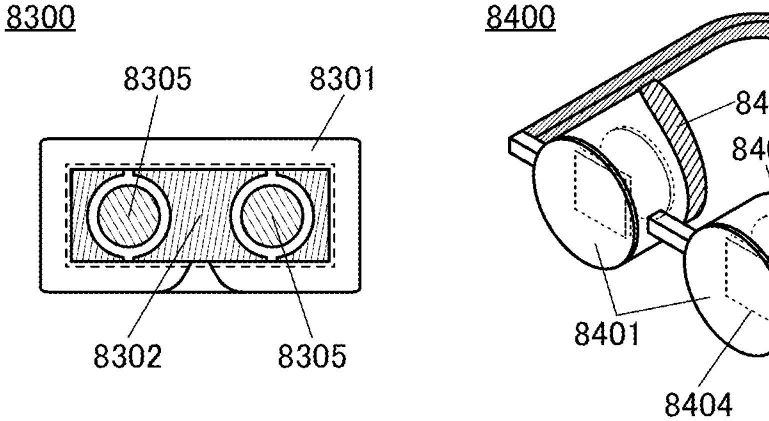

9101
9001
9050
9051
9005
9000

9102
9053
9052
9001
9000
9054

9200
9001
9000
9007
19:34
9005
9008
9003
9006
9005

9201
9001
9055
9000

9201
9001
9055
9000

9201
9055
9000
9001

First direction
102-1
101-1
102-2
100
101-2
101-3

A
103-1
103-2
103-3
D
C
B
101

103-1
103-2
101
103-3
102
A
B 101
103
100
104
C
D

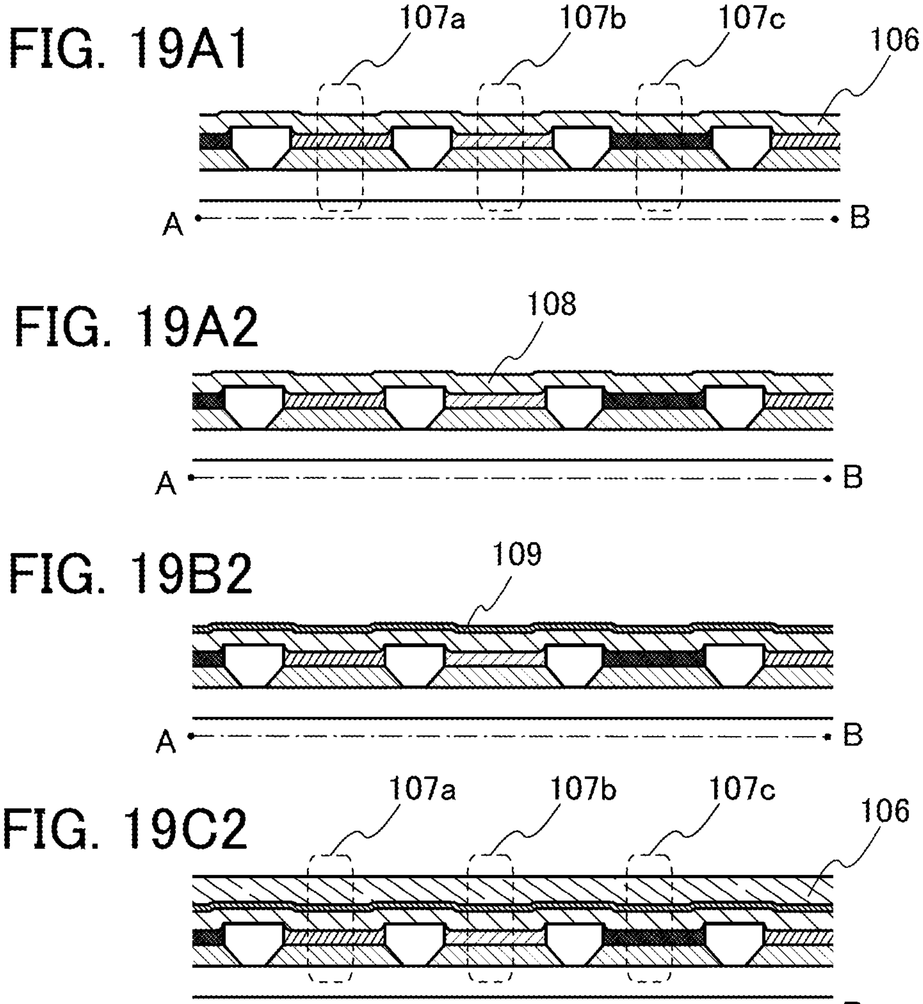
FIG. 19A1
107a
107b
107c
106
A
B
FIG. 19A2
108
A
B
FIG. 19B2
109
A
B
FIG. 19C2
107a
107b
107c
106
A
B

400A 400B
454
228
442
215
225
211
462
464
430c
B
430b
G
421
416
417
242
466
472
214
222b
210
231i
221
223
231n
222a
212
202
465
204
453
455

218
215
222b
231n
231i
231
225
223
221
222a
209

400C
442
228
443
215
213
211
205
430c
B
452
411c
416
205
430b
411b
462
G
222a
421
221
231
223
205
430a
222b
R
411a
464
201
242
465
472
466
204
214
454

LIGHT-EMITTING APPARATUS, ELECTRONIC EQUIPMENT, DISPLAY APPARATUS, AND LIGHTING DEVICE

CROSS REFERENCE TO RELATED APPLICATIONS

This application is a U.S. National Phase Application under 35 U.S.C. § 371 of International Application PCT/IB2022/050223, filed on Jan. 13, 2022, which is incorporated by reference and claims the benefit of foreign priority applications filed in Japan on Jan. 27, 2021, as Application No. 2021-011206 and Application No. 2021-011354.

TECHNICAL FIELD

One embodiment of the present invention relates to an organic compound, a light-emitting element, a light-emitting device, a display module, a lighting module, a display apparatus, a light-emitting apparatus, electronic equipment, a lighting device, and an electronic device. Note that one embodiment of the present invention is not limited to the above technical field. The technical field of one embodiment of the invention disclosed in this specification relates to an object, a method, or a manufacturing method. Alternatively, one embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an image-capturing device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer including a light-emitting material (an EL layer) is sandwiched between a pair of electrodes. Carriers are injected by application of a voltage to the device, and recombination energy of the carriers is used, whereby light emission can be obtained from the light-emitting material.

Such light-emitting devices are of self-luminous type and thus have advantages over liquid crystal devices, such as high visibility and no need for a backlight when used for pixels of a display, and are particularly suitable for flat panel displays. Displays including such light-emitting devices are also highly advantageous in that they can be thin and lightweight. Moreover, such light-emitting devices also have a feature that the response speed is extremely fast.

Since light-emitting layers of such light-emitting devices can be formed two-dimensionally and continuously, planar light emission can be achieved. This feature is difficult to realize with point light sources typified by incandescent lamps and LEDs or linear light sources typified by fluorescent lamps: thus, the light-emitting devices also have great potential as planar light sources, which can be applied to lighting and the like.

Displays or lighting devices including light-emitting devices are suitable for a variety of electronic equipment as described above, and research and development of light-emitting devices have been promoted for more favorable characteristics.

Commercialized organic EL devices are often manufactured by an evaporation method, which is costly in maintaining material efficiency, the manufacturing atmosphere, and the like: thus, employing a wet film formation method is expected to enable inexpensive manufacture.

REFERENCE

Patent Document

[Patent Document 1] United States Patent Application Publication No. 2020/0176692

SUMMARY OF THE INVENTION

Problems to be Solved by the Invention

One object of one embodiment of the present invention is to provide a light-emitting apparatus with high display quality. Another object of one embodiment of the present invention is to provide an inexpensive light-emitting apparatus. Another object of one embodiment of the present invention is to provide a light-emitting apparatus with high emission efficiency. Another object of one embodiment of the present invention is to provide an inexpensive light-emitting apparatus with high display quality.

It is only necessary that at least one of the above-described objects be achieved in the present invention.

Means for Solving the Problems

One embodiment of the present invention is a light-emitting apparatus including a plurality of partitions formed over an insulating surface and extending in a first direction, a plurality of pixel electrodes each having an island shape formed over the insulating surface, an EL layer formed over the pixel electrodes, and a second electrode formed over the EL layer, the partition has an insulating property, the pixel electrodes that are aligned in the first direction are positioned column by column between adjacent partitions in the plurality of partitions, and the EL layer is in contact with the insulating surface between the pixel electrodes adjacent to each other in the first direction in the pixel electrodes aligned in the first direction.

Another embodiment of the present invention is a light-emitting apparatus includes a plurality of partitions formed over an insulating surface and extending in a first direction, a plurality of pixel electrodes having island-shapes formed over the insulating surface, an EL layer formed over the pixel electrodes, and a second electrode formed over the EL layer, the partition has an insulating property, the pixel electrodes that are aligned in the first direction are positioned column by column between adjacent partitions in the plurality of partitions, end portions of the pixel electrodes, which are substantially parallel to the first direction, are covered by the partitions, and the EL layer is in contact with the insulating surface between the pixel electrodes adjacent to each other in the first direction in the pixel electrodes aligned in the first direction.

In the above structure, another embodiment of the present invention is the light-emitting apparatus in which the EL layer is continuous and provided over the pixel electrodes aligned in the first direction in the above structure.

In the above structure, another embodiment of the present invention is the light-emitting apparatus including a plurality of columns of the pixel electrodes aligned in the first direction, and one partition is positioned between adjacent columns of the pixel electrodes.

In the above structure, another embodiment of the present invention is the light-emitting apparatus in which in the EL layer, layers that are from a layer in contact with the pixel electrode to the light-emitting layer, are independent between columns of the pixel electrodes aligned in the first direction.

In the above structure, another embodiment of the present invention is the light-emitting apparatus in which the EL layers in adjacent columns of the pixel electrodes include different light-emitting materials.

In the above structure, another embodiment of the present invention is the light-emitting apparatus including at least three columns of the pixel electrodes aligned in the first direction, and an EL layer formed over any one column of the pixel electrodes of the three columns of the pixel electrodes includes a light-emitting material emitting red light, an EL layer formed over the pixel electrodes in one column of the other two columns of the pixel electrodes includes a light-emitting material emitting green light, and an EL layer formed over the pixel electrodes in the other column includes a light-emitting material emitting blue light.

In the above structure, another embodiment of the present invention is the light-emitting apparatus in which the EL layer in a portion which is independent between columns of the pixel electrodes is formed by a droplet-discharge method.

In the above structure, another embodiment of the present invention is the light-emitting apparatus in which when the EL layer in the portion which is independent between columns of the pixel electrodes is measured by ToF-SIMS, a signal is detected at around m/z=80 in a measurement result of a negative mode.

In the above structure, another embodiment of the present invention is the light-emitting apparatus in which part of the EL layer is continuous over the pixel electrodes in a different column.

In the above structure, another embodiment of the present invention is the light-emitting apparatus in which an electron-transport layer and/or an electron-injection layer in the EL layer is continuous over the pixel electrodes in a different column.

In the above structure, another embodiment of the present invention is the light-emitting apparatus in which the second electrode is continuous and provided over the plurality of pixel electrodes.

In the above structure, another embodiment of the present invention is the light-emitting apparatus in which at least parts of the end portions of the pixel electrodes has a tapered shape.

In the above structure, another embodiment of the present invention is the light-emitting apparatus in which when the pixel electrode is cut substantially perpendicular to the insulating surface, an angle of a portion in the end portion is greater than or equal to 5° and less than or equal to 90°.

Another embodiment of the present invention is a display device including any of the above-described light-emitting apparatuses.

Another embodiment of the present invention is electronic equipment including any of the above-described light-emitting apparatuses, a sensor, an operation button, and a speaker or a microphone.

Another embodiment of the present invention is a lighting device including any of the above-described light-emitting devices and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a TCP (Tape Carrier Package), a module in which a printed wiring board is provided at the end of a TCP, or a module in which an IC (integrated circuit) is directly mounted on a light-emitting device by a COG (Chip On Glass) method. Furthermore, a lighting device or the like may include the light-emitting apparatus.

Effect of the Invention

According to one embodiment of the present invention, a light-emitting apparatus having high display quality can be provided. According to another embodiment of the present invention, an inexpensive light-emitting apparatus can be provided. According to another embodiment of the present invention, a light-emitting apparatus having high emission efficiency can be provided. According to one embodiment of the present invention, an inexpensive light-emitting apparatus having high display quality can be provided.

Note that the description of these effects does not preclude the existence of other effects. One embodiment of the present invention does not need to have all the effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 3A1, FIG. 3A2, FIG. 3B2, and FIG. 3C2 are cross-sectional views illustrating manufacturing steps of a light-emitting apparatus.

FIG. 11A to FIG. 11D are each a circuit diagram of a light-emitting apparatus.

FIG. 15A to FIG. 15F are diagrams each illustrating an example of electronic equipment.

FIG. 19A1, FIG. 19A2, FIG. 19B2, and FIG. 19C2 are cross-sectional views illustrating manufacturing steps of a light-emitting apparatus.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or an FMM (fine metal mask, high-resolution metal mask) is referred to as a device having an MM (metal mask) structure in some cases. In this specification and the like, a device formed without using a metal mask or an FMM is referred to as a device having an MML (metal maskless) structure in some cases.

Embodiment 1

FIG. 1A to FIG. 1D are diagrams illustrating a light-emitting apparatus of one embodiment of the present invention. In the light-emitting apparatus of one embodiment of the present invention, a plurality of pixel electrodes 101 and a plurality of partitions 102 are provided over an insulating surface 100. The partitions 102 are formed, extending in a first direction, and the plurality of pixel electrodes 101 (e.g., a pixel electrode 101-1, a pixel electrode 101-2, and a pixel electrode 101-3) that are aligned in the first direction are positioned between adjacent partitions 102 (for example, a partition 102-1 and a partition 102-2). A plurality of columns where the pixel electrodes 101 are aligned in the first direction are formed, and the partition 102 is provided between a column of the pixel electrodes 101 and another column of the pixel electrodes 101.

Figures 1A, 1B, 1C, 1D:
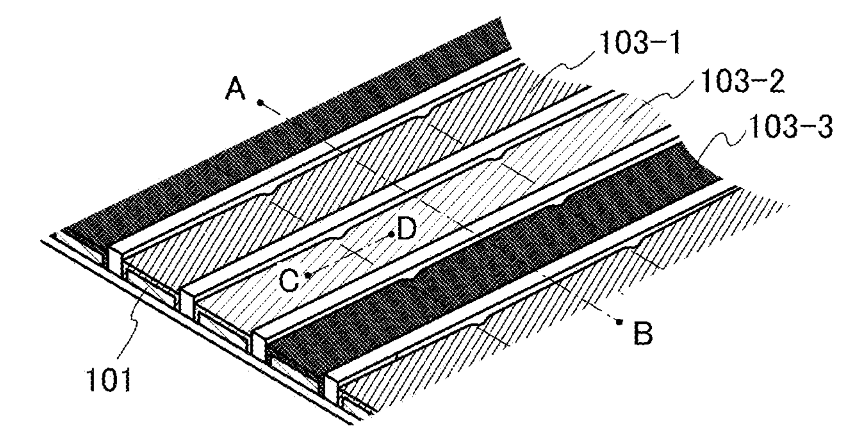
FIG. 1A, FIG. 1B, FIG. 1C and FIG. 1D are perspective views and cross-sectional views of a light-emitting apparatus.

An EL layer 103 is provided over the pixel electrodes 101 (see FIG. 1B). The EL layer 103 includes a light-emitting material, and light is emitted from the light-emitting material due to current excitation. The EL layer 103 is preferably formed by a wet method, especially a droplet-discharge method such as an ink-jet method or a nozzle printing method.

Since the pixel electrodes 101 are formed in line in the first direction, the EL layer 103 can be easily formed by moving a nozzle in the first direction by a droplet-discharge method. In addition, a column of the pixel electrodes 101 is provided between the partitions 102, and thus a composition (also referred to as an ink) discharged can be inhibited from flowing into another column of the pixel electrodes by the partitions 102, and thus, the ink can be prevented from leaking over the adjacent pixel electrodes in the direction perpendicular to the first direction.

Note that the EL layer 103 is preferably continuous and formed over the plurality of pixel electrodes 101 aligned in the first direction. By moving the nozzle in the first direction by a droplet-discharge method, the EL layer 103 that is continuous in the first direction can be formed. In addition, between pixel electrodes (e.g., the pixel electrode 101-3 and the pixel electrode 101-2) adjacent to each other in the first direction, the EL layer 103 includes a portion where the insulating surface 100 and the EL layer 103 are in contact with each other, as in a portion 104 indicated by a circle in FIG. 1D.

As described above, in the light-emitting apparatus of one embodiment of the present invention, partitions 102 are not present between the pixel electrodes aligned in the first direction. When a film is formed by a wet method, there is a region whose thickness is gradually increased from the inside of the pixel electrode toward the partition in some cases. When the thickness of the EL layer is different, the luminance of the portion with a different thickness is low, so that the portion cannot serve as an effective light-emitting region. In addition, concentration of an electric field on a portion having a small thickness may also be caused, resulting in an adverse effect on lifetime.

In the light-emitting apparatus of one embodiment of the present invention, the partition is present not between the pixel electrodes aligned in the first direction, whereby an effective light-emitting area can be enlarged. Thus, a light-emitting apparatus having a high aperture ratio and low power consumption can be easily provided. A light-emitting apparatus with favorable display quality can be provided. A light-emitting apparatus with long lifetime can be provided.

In the case of light-emitting apparatuses for full-color display, there is a method in which white light is obtained directly from an EL layer and a method in which light-emitting devices emitting light of a plurality of colors are used. The light-emitting apparatus of one embodiment of the present invention has a structure that can be easily formed by the latter method that is a separate formation method (also referred to as a Side by Side method).

In the latter method, the EL layer 103 emitting light of a different emission color is preferably formed per column of pixel electrodes, and the EL layers 103 including light-emitting materials emitting light of different emission colors are preferably formed in adjacent columns of pixel electrodes. For example, the EL layers 103 are preferably formed, including the EL layer 103-1 including a light-emitting material emitting red light, the EL layer 103-2 including a light-emitting material emitting green light, and the EL layer 103-3 including a light-emitting material emitting blue light.

Figure 2A:
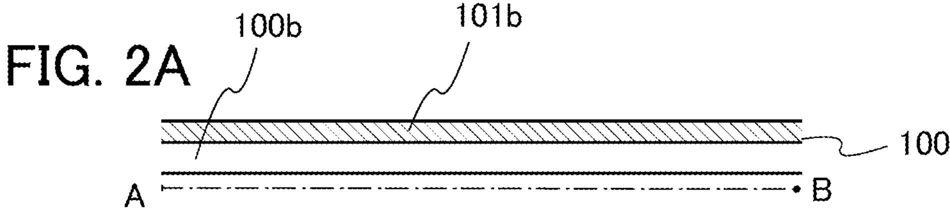
FIG. 2A to FIG. 2F are cross-sectional views illustrating manufacturing steps of a light-emitting apparatus.

Note that in the EL layer 103, layers up to and including the light-emitting layer, that is, a layer including a light-emitting material, may be formed over the pixel electrode by a droplet-discharge method, and then, a carrier-transport layer and/or a carrier-injection layer may be formed in common over different columns of pixel electrodes. In that case, the carrier-transport layer and/or the carrier-injection layer may be formed by another wet process such as a spin coating method or a dry method such as a vacuum evaporation method. Furthermore, the second electrode may also be shared by light-emitting devices having pixel electrodes in different columns. In the case where the pixel electrode is a positive electrode, the carrier-transport layer and/or the carrier-injection layer serve as an electron-transport layer and/or an electron-injection layer, and in the case where the pixel electrode is a negative electrode, the carrier-transport layer and/or the carrier-injection layer serve as a hole-transport layer and/or a hole-injection layer. The pixel electrode formed earlier is preferably a positive electrode for easy formation. Here, a method for manufacturing the light-emitting apparatus of one embodiment of the present invention will be described. First, a conductive film 101*b* is formed over an insulator 100*b* having the insulating surface 100 (FIG. 2A).

Figure 2B:
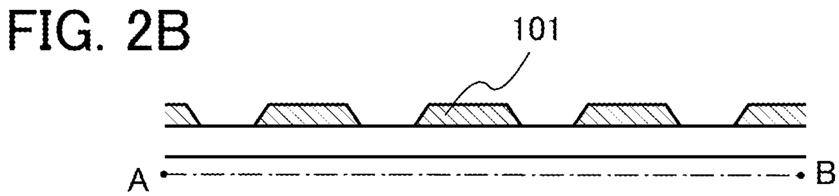

Next, the conductive film 101*b* is patterned to form the pixel electrode 101 (FIG. 2B). As illustrated in FIG. 2B, an end portion of the pixel electrode 101 may have a tapered shape. Such a shape leads to an improvement in coverage with a layer formed later. In this specification and the like, a tapered shape indicates a shape in which at least part of a side surface of a structure is inclined to a substrate surface. For example, the angle between the inclined side surface and the substrate surface (such an angle is also referred to as a taper angle) is preferably from 5° to 90°. The end portion of the pixel electrode 101 has the tapered shape and the taper angle described above, which can inhibit short circuiting between adjacent EL layers.

Figure 2C:
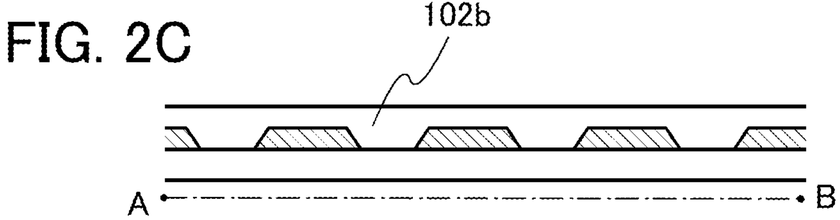

After that, an insulating film 102*b* is formed to cover the insulating surface 100 and the pixel electrode 101 (FIG. 2C). The insulating film 102*b* may be an organic compound or an inorganic compound.

Figure 2D:
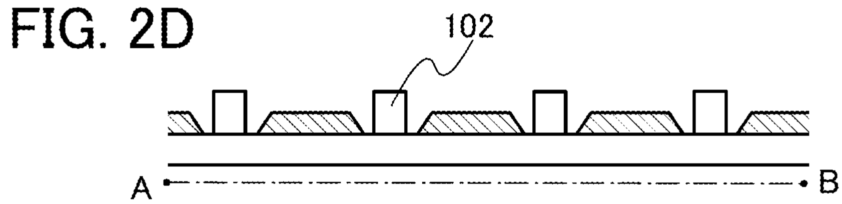

Next, the insulating film is patterned to form the partition 102 (FIG. 2D). The partition 102 is formed between the pixel electrodes 101.

Figure 2E:
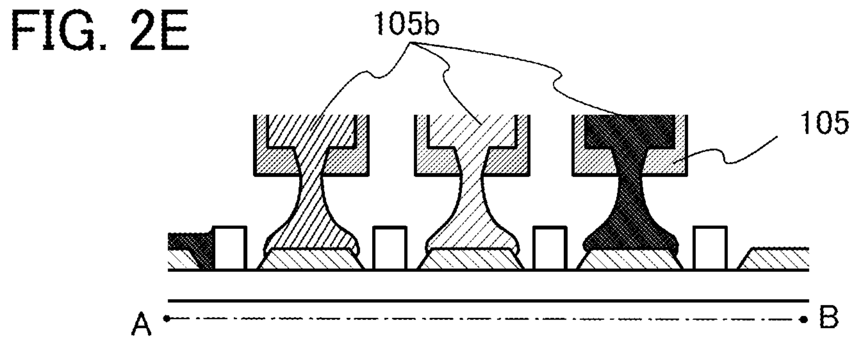

After that, a material 105*b* of the EL layer is discharged from a nozzle by a droplet-discharge method (FIG. 2E). The material is discharged continuously from the nozzle that is moving in the first direction (the depth direction of the sheet of the drawing) so that the material of the EL layer 103 is placed over the pixel electrode between the partitions. Droplets are preferably discharged continuously in the first direction, not on a pixel-by-pixel basis. At this time, a plurality of nozzles can be used to concurrently perform application on a plurality of columns of pixel electrodes, leading to the improvement of manufacturing efficiency.

Figure 2F:
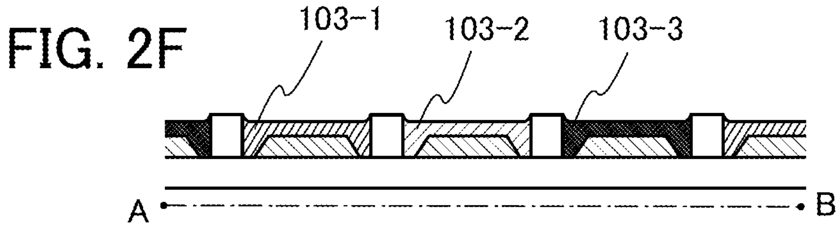

Treatment for removing a solvent or curing treatment is performed on the discharged material 105*b*, so that the EL layer 103 (the EL layer 103-1, the EL layer 103-2, and the EL layer 103-3) can be formed (FIG. 2F).

Figures 8A, 8B, 8C, 8D, 8E:
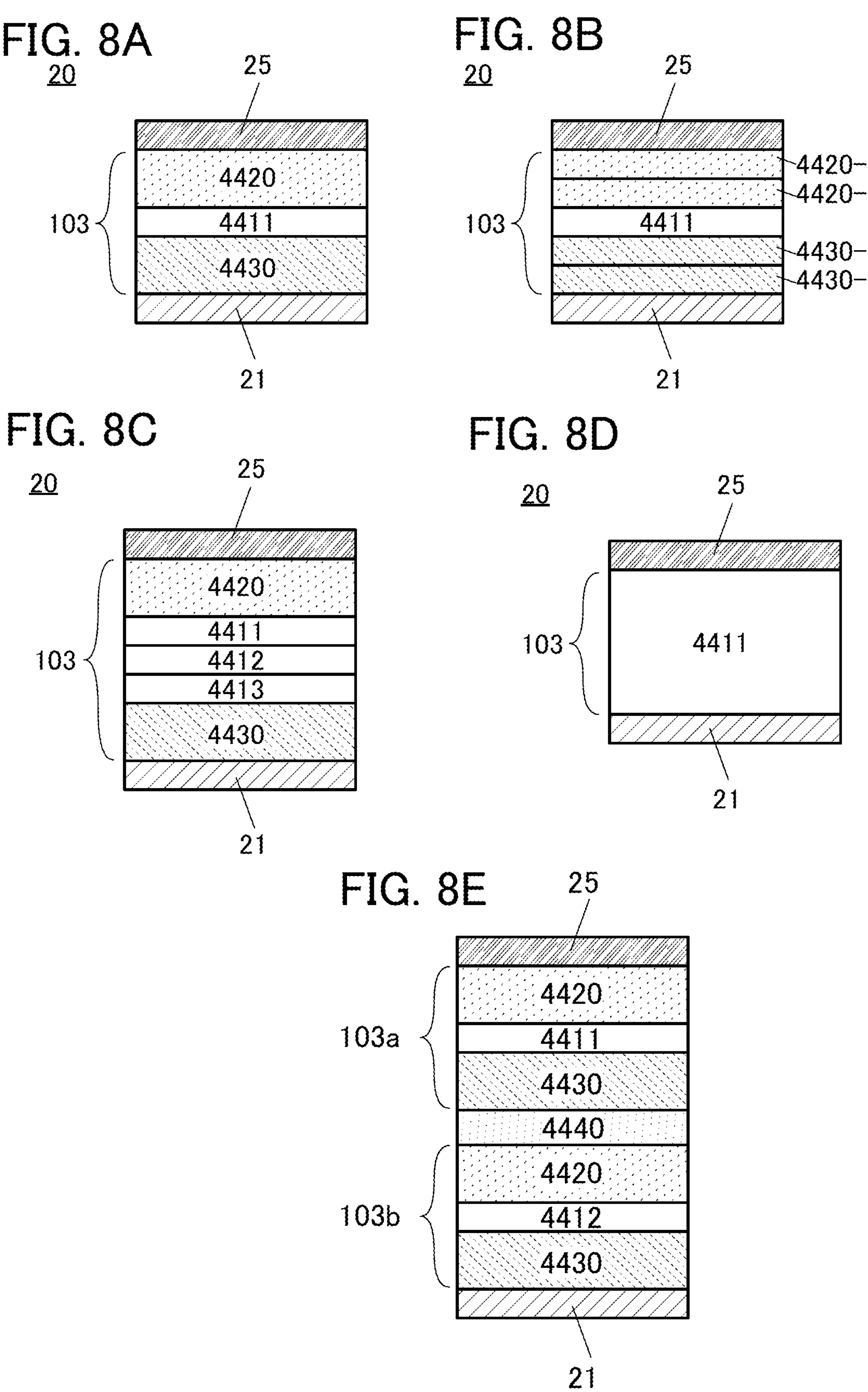
FIG. 8A to FIG. 8E are cross-sectional views of light-emitting devices.

When the EL layer 103 has a single-layer structure as in FIG. 8D, a second electrode 106 is formed as in FIG. 3A1, whereby the light-emitting device 107 (107*a*, 107*b*, and 107*c*) can be formed. In the case where a plurality of layers whose functions are separated are included as illustrated in FIG. 8A to FIG. 8C and the layers are all formed by a droplet-discharge method, the steps in FIG. 2E and FIG. 2F are repeated to form the EL layer 103, and then, the second electrode 106 is formed as in FIG. 3A1, whereby the light-emitting device 107 can be formed. Note that the details of FIG. 8A to FIG. 8C will be described later.

In the light-emitting apparatus of one embodiment of the present invention, at least layers up to and including the layer including a light-emitting material over the pixel electrode 101 are formed by a droplet-discharge method, but subsequent layers to be formed may be formed by any method. Therefore, the layers up to and including the layer including a light-emitting material are formed by a droplet-discharge method, then, each of the carrier-transport layer 108 and the carrier-injection layer 109 is formed as a common layer by evaporation, a spin coating method, or the like, as illustrated in FIG. 3A2 and FIG. 3B2, and then the second electrode 106 is formed, whereby the light-emitting device 107 can be formed (FIG. 3C2). In this case, the common layer can be formed one time, which simplifies the manufacturing process and is advantageous in terms of costs. In FIG. 3A2 and FIG. 3B2, each of the carrier-transport layer and the carrier-injection layer is formed as a common layer: however, either one may be formed as a common layer, or a layer having functions of both the layers may be formed as one layer. Moreover, a functional layer other than the layers may be formed.

After that, a protective layer is formed over the second electrode and sealing is performed with a counter substrate provided with a light-blocking layer or the like, whereby the light-emitting apparatus of one embodiment of the present invention can be manufactured. Note that the light-emitting device 107 is connected to a driving transistor, whereby display of each pixel can be controlled: thus, a light-emitting apparatus with favorable display quality can be provided.

FIG. 17A to FIG. 17D, FIG. 18A to FIG. 18F, FIG. 19A1, FIG. 19A2, FIG. 19B2, and FIG. 19C2 illustrate a light-emitting apparatus of another embodiment of the present invention. In the light-emitting apparatus of the embodiment of the present invention, the plurality of pixel electrodes 101 and the plurality of partitions 102 are provided over the insulating surface 100. The partitions 102 extend in the first direction, and the plurality of pixel electrodes 101 (e.g., the pixel electrode 101-1, the pixel electrode 101-2, and the pixel electrode 101-3) that are aligned in the first direction are exposed between adjacent partitions 102 (for example, the partition 102-1 and the partition 102-2). As illustrated in the drawing, a plurality of columns of the pixel electrodes 101 aligned in the first direction are formed in the light-emitting apparatus, and the partition 102 is present between the columns of pixel electrodes. In addition, the partitions 102 are formed to cover a pair of sides of the pixel electrode, which is different from those in FIG. 1 to FIG. 3, but other structures are similar to those in FIG. 1 to FIG. 3.

Figure 4:
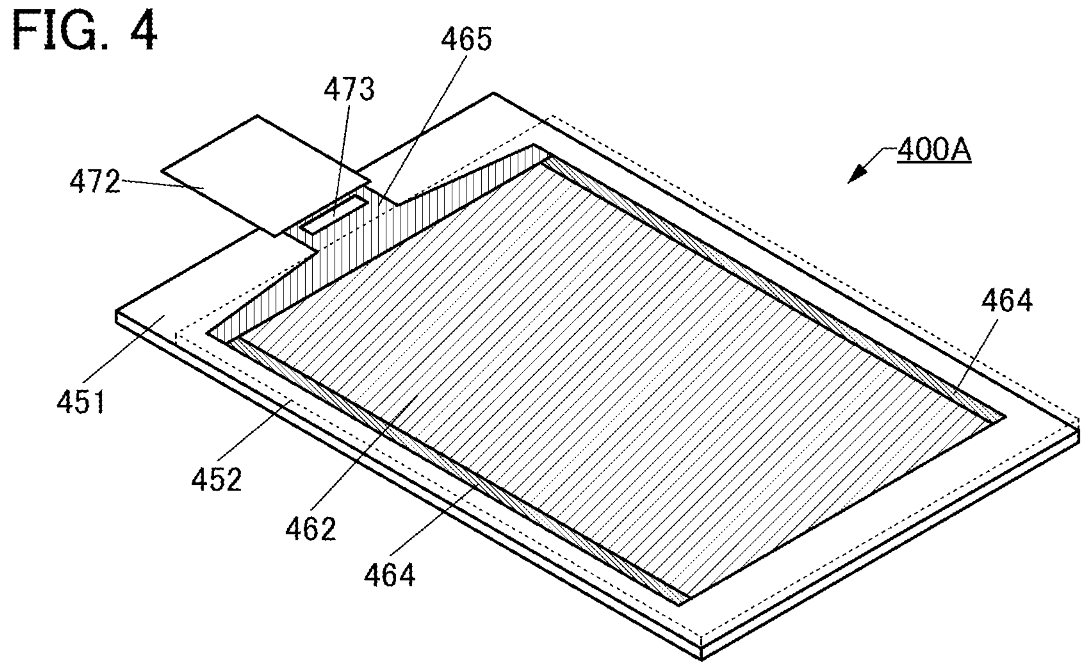
FIG. 4 is a perspective view of a light-emitting apparatus.

FIG. 4 is an external perspective view of a light-emitting apparatus of one embodiment of the present invention, and FIG. 5 is a cross-sectional view of a light-emitting apparatus including a light-emitting device connected to a transistor, of one embodiment of the present invention.

A light-emitting apparatus 400A has a structure in which a substrate 452 and a substrate 451 are bonded to each other. In FIG. 4, the substrate 452 is denoted by a dashed line.

The light-emitting apparatus 400A includes a display portion 462, a circuit 464, a wiring 465, and the like. FIG. 4 illustrates an example in which an IC 473 and an FPC 472 are mounted on the light-emitting apparatus 400A. Thus, the structure illustrated in FIG. 4 can be regarded as a display module including the light-emitting apparatus 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 4 illustrates an example in which the IC 473 is provided for the substrate 451 by a COG (Chip On Glass) method, a COF (Chip on Film) method, or the like. An IC including a scan line driver circuit, a signal line driver circuit, or the like can be used as the IC 473, for example. Note that the light-emitting apparatus 400A and the display module are not necessarily provided with an IC. The IC may be mounted on the FPC by a COF method or the like.

Figures 20A, 20B:
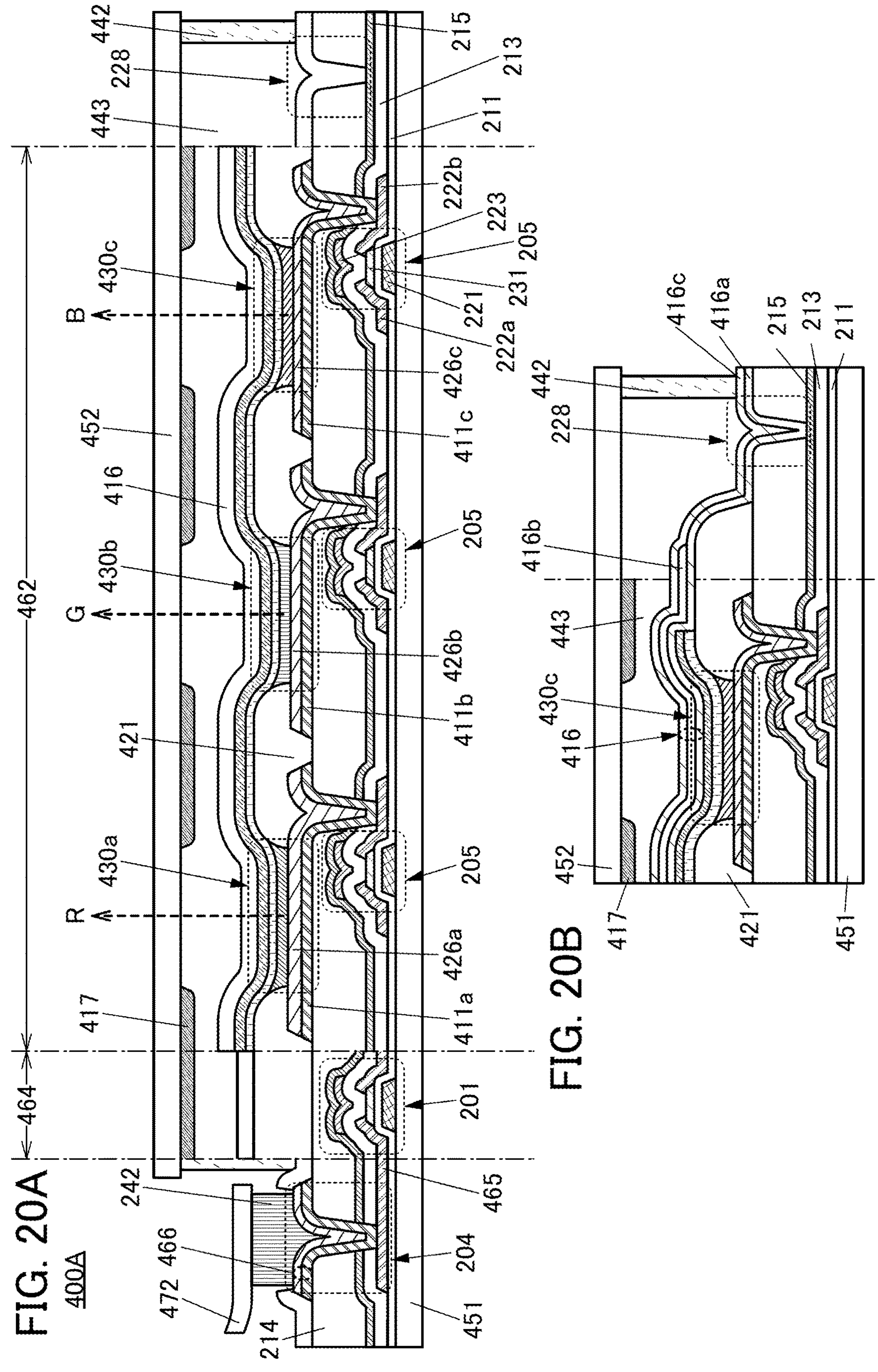
FIG. 20A and FIG. 20B are cross-sectional views of a light-emitting apparatus.

FIG. 5 and FIG. 20A each illustrate an example of cross sections of part of a region including the FPC 472, part of the circuit 464, part of the display portion 462, and part of a region including an end portion of the light-emitting apparatus 400A.

The light-emitting apparatus 400A illustrated in each of FIG. 5 and FIG. 20A includes a transistor 201, a transistor 205, a light-emitting device 430*a* which emits red light, a light-emitting device 430*b* which emits green light, a light-emitting device 430*c* which emits blue light, and the like between the substrate 451 and the substrate 452.

Note that the light-emitting device 430*a*, the light-emitting device 430*b*, and the light-emitting device 430*c* correspond to the light-emitting device 107*a*, the light-emitting device 107*b*, and the light-emitting device 107*c* described above.

In the case where a pixel of the display apparatus includes three kinds of subpixels including light-emitting devices emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure, a hollow sealing structure, or the like can be employed to seal the light-emitting devices. In FIG. 5 and FIG. 20A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting device. The space 443 surrounded by the substrate 452, the adhesive layer 442, and the substrate 451 may be filled with a resin different from that of the adhesive layer 442.

The light-emitting devices 430*a*, 430*b*, and 430*c* may include an optical adjustment layer 426*a*, an optical adjustment layer 426*b*, and an optical adjustment layer 426*c* respectively between the pixel electrodes and the EL layers. Note that the optical adjustment layer 426 (426*a*, 426*b*, and 426*c*) is provided as part of the electrode in FIG. 5A and FIG. 20A: however, the optical adjustment layer 426 may be provided inside the EL layer so as to serve also as a carrier-transport layer.

The pixel electrodes 411*a*, 411*b*, and 411*c* are each connected to the conductive layer 222*b* included in the transistor 205 through an opening provided in the insulating layer 214.

The pixel electrodes include a material that reflects visible light, and a counter electrode includes a material that transmits visible light.

Light from the light-emitting device is emitted toward the substrate 452. For the substrate 452, a material having a high visible-light-transmitting property is preferably used.

The transistor 201 and the transistor 205 are formed over the substrate 451. These transistors can be fabricated using the same material in the same process.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Here, an organic insulating film often has a lower barrier property than an inorganic insulating film. Therefore, the organic insulating film preferably has an opening in the vicinity of an end portion of the light-emitting apparatus 400A. This can inhibit entry of impurities from the end portion of the light-emitting apparatus 400A through the organic insulating film. Alternatively, the organic insulating film may be formed so that an end portion of the organic insulating film is positioned on the inner side compared to the end portion of the light-emitting apparatus 400A, to prevent the organic insulating film from being exposed at the end portion of the light-emitting apparatus 400A.

In a region 228 illustrated in FIG. 5 and FIG. 20A, an opening is formed in the insulating layer 214. This can inhibit entry of impurities into the display portion 462 from the outside through the insulating layer 214 even when an organic insulating film is used as the insulating layer 214. Consequently, the reliability of the light-emitting apparatus 400A can be increased.

Each of the transistor 201 and the transistor 205 includes a conductive layer 221 functioning as a gate electrode, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231. The insulating layer 421 is positioned between the pixel electrodes and functions as a partition for separating pixels of different light emission colors from each other. The insulating layer 421 corresponds to the partition 102 in FIG. 1 and FIG. 17.

There is no particular limitation on the structure of the transistors included in the display apparatus in this embodiment. For example, a planar transistor, a staggered transistor, or an inverted staggered transistor can be used. In addition, the transistor structure may be either a top-gate structure or a bottom-gate structure. Alternatively, gates may be provided above and below a semiconductor layer where a channel is formed.

The structure in which the semiconductor layer where a channel is formed is interposed between two gates is used for the transistor 201 and the transistor 205. The two gates may be connected to each other and supplied with the same signal for driving the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor include a metal oxide (also referred to as an oxide semiconductor). That is, a transistor using a metal oxide in its channel formation region (hereinafter, an OS transistor) is preferably used for the display apparatus in this Alternatively, a semiconductor layer of a transistor may include silicon. Examples of silicon include amorphous silicon and crystalline silicon (e.g., low-temperature polysilicon or single crystal silicon).

Transistors including silicon in semiconductor layers (hereinafter also referred to as Si transistors) are preferably used as the transistor 201 and the transistor 205. As silicon, single crystal silicon, polycrystalline silicon, amorphous silicon, and the like can be given. It is particularly preferable to use transistors including low-temperature polysilicon (LTPS) (hereinafter also referred to as LTPS transistors) in their semiconductor layers. An LTPS transistor has high field-effect mobility and can operate at high speed.

As the semiconductor layer, a material containing indium, M (M is one or more kinds of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, can be used for example. Specifically, M is preferably one or more of aluminum, gallium, yttrium, and tin. An oxide containing indium (In), gallium (Ga), and zinc (Zn) (also referred to as IGZO) is preferably used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

For the transistor 201 and the transistor 205, the above transistor including LTPS as a semiconductor layer and the above transistor including IGZO as a semiconductor layer may be used in combination. By using the transistor including LTPS as a semiconductor layer and the transistor including IGZO as a semiconductor layer in combination, the display apparatus can have a high-speed operation function and a low-power consumption function.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

When the protective layer 416 covering the light-emitting device is provided, which inhibits an impurity such as water from entering the light-emitting device. As a result, the reliability of the light-emitting device can be increased.

In the region 228 in the vicinity of the end portion of the light-emitting apparatus 400A, the insulating layer 215 and the protective layer 416 are preferably in contact with each other through an opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the light-emitting apparatus 400A can be increased.

Figures 5A, 5B:
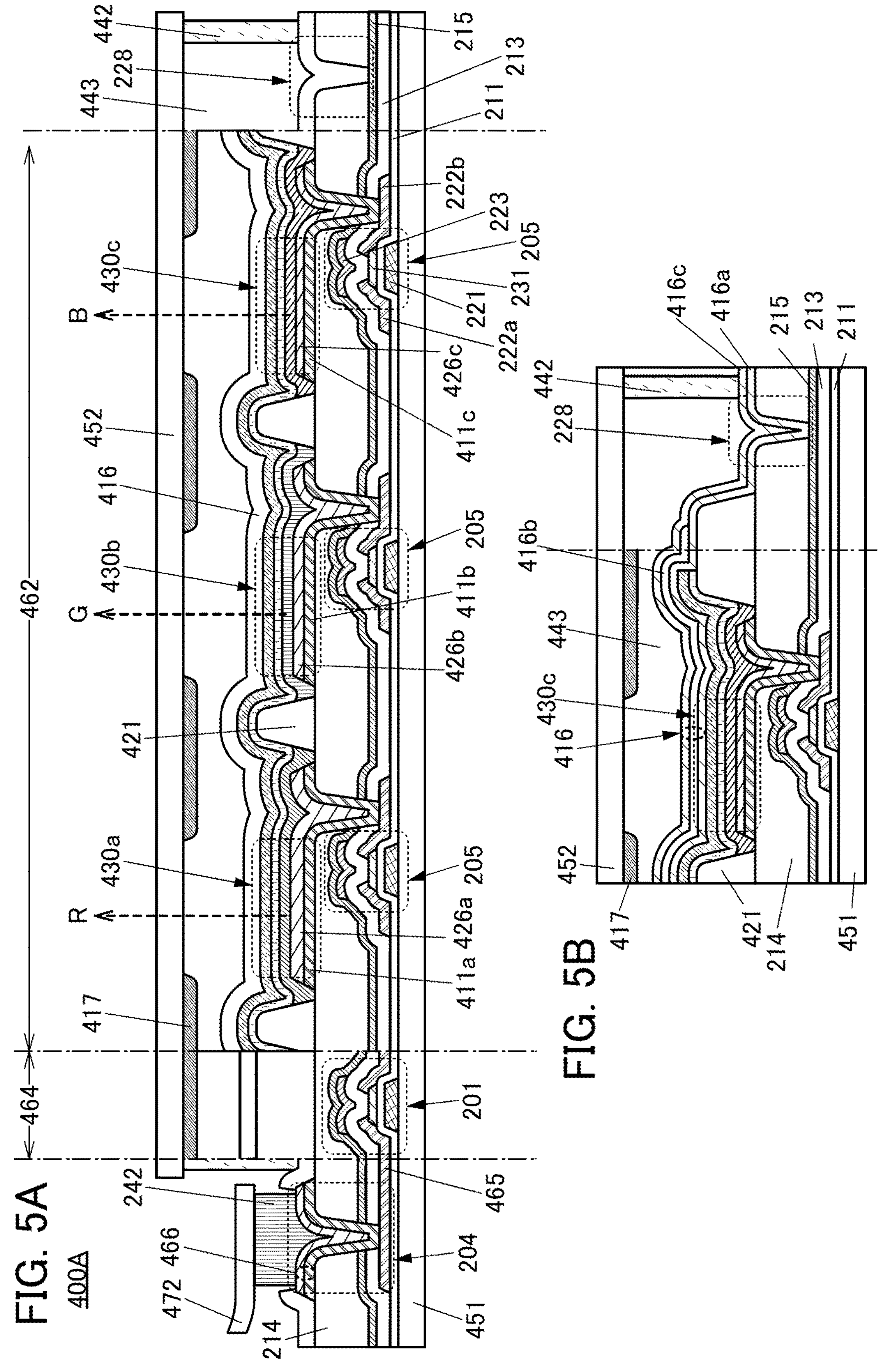
FIG. 5A and FIG. 5B are cross-sectional views of a light-emitting apparatus.

FIG. 5B and FIG. 20B each illustrate an example in which the protective layer 416 has a three-layer structure. In FIG. 5B and FIG. 20B, the protective layer 416 includes an inorganic insulating layer 416*a* over the light-emitting device 430*c*, an organic insulating layer 416*b* over the inorganic insulating layer 416*a*, and an inorganic insulating layer 416*c* over the organic insulating layer 416*b*.

The end portion of the inorganic insulating layer 416*a* and the end portion of the inorganic insulating layer 416*c* extend beyond the end portion of the organic insulating layer 416*b* and are in contact with each other. The inorganic insulating layer 416*a* is in contact with the insulating layer 215 (inorganic insulating layer) through the opening in the insulating layer 214 (organic insulating layer). Accordingly, the light-emitting device can be surrounded by the insulating layer 215 and the protective layer 416, whereby the reliability of the light-emitting device can be increased.

As described above, the protective layer 416 may have a stacked-layer structure of an organic insulating film and an inorganic insulating film. In that case, the end portions of the inorganic insulating films preferably extend beyond the end portion of the organic insulating film.

For each of the substrate 451 and the substrate 452, glass, quartz, ceramics, sapphire, a resin, a metal, an alloy, a semiconductor, or the like can be used. The substrate on the side from which light from the light-emitting device is extracted is formed using a material which transmits the light. When the substrate 451 and the substrate 452 are formed using flexible materials, the flexibility of the display apparatus can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film including any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium: or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Furthermore, a stacked-layer film of the above materials can be used for a conductive layer. For example, a stacked film of an indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Light-Emitting Apparatus 400B]

Figures 6A, 6B:
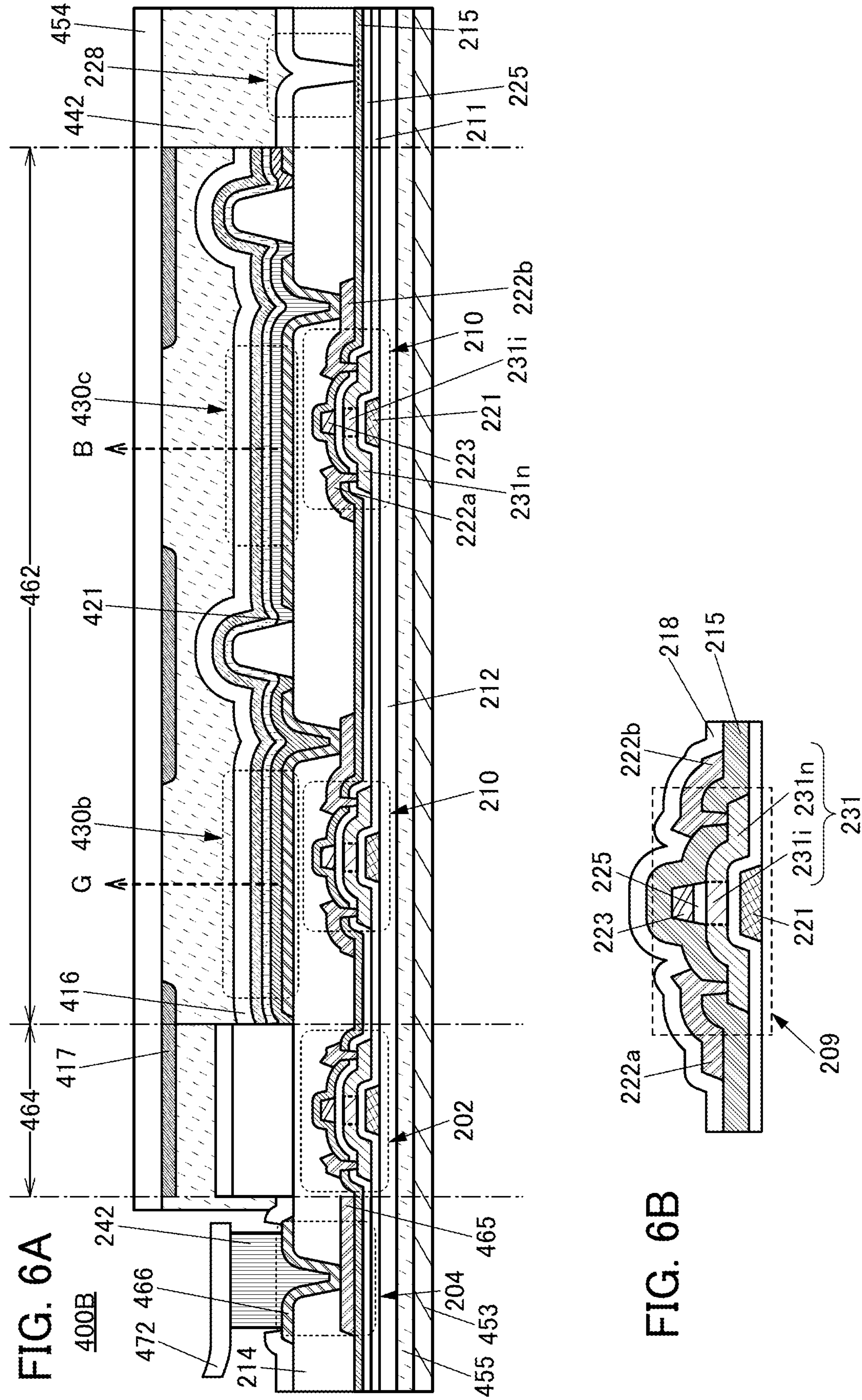
FIG. 6A and FIG. 6B are cross-sectional views of a light-emitting apparatus.
Figures 21A, 21B:
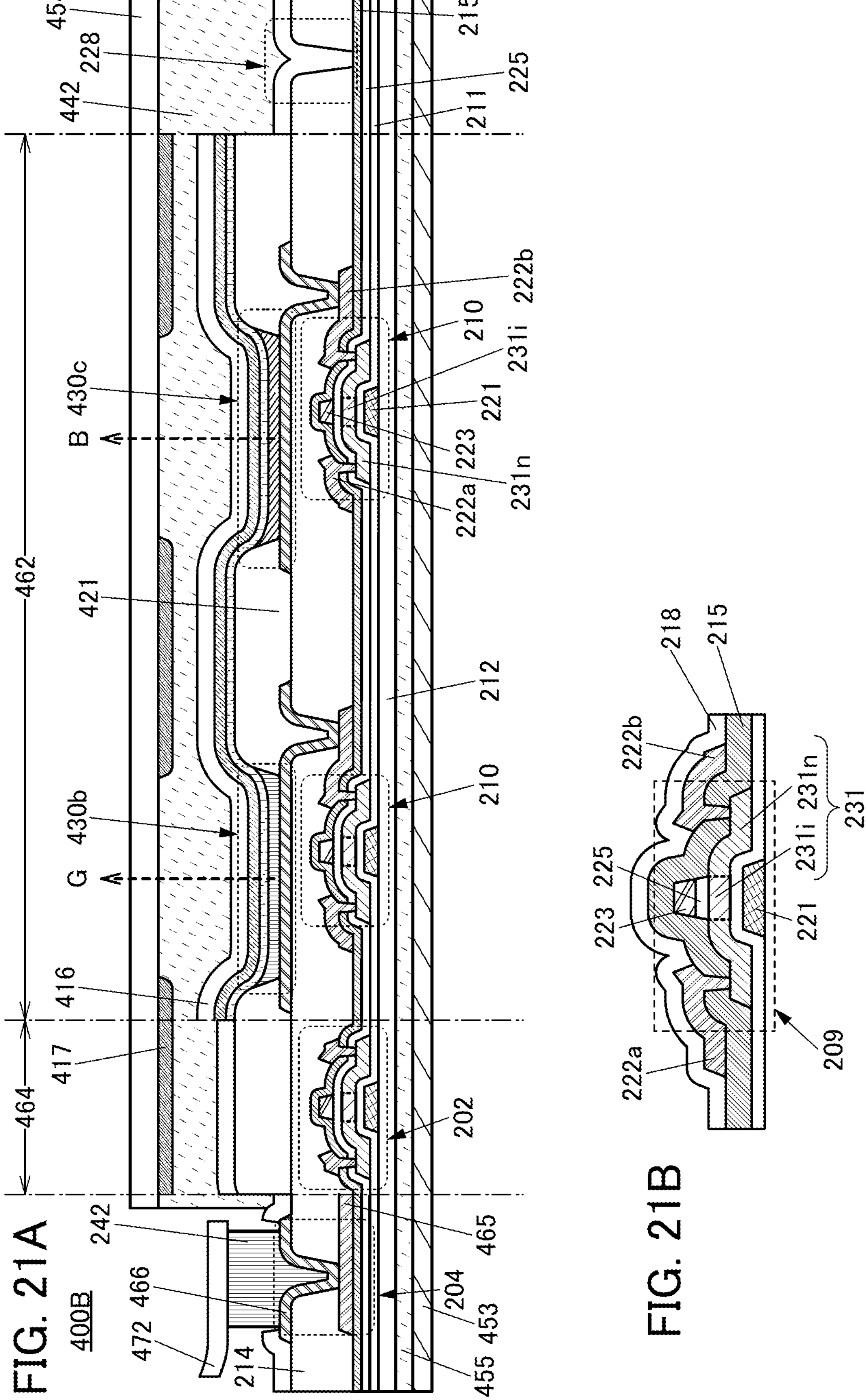
FIG. 21A and FIG. 21B are cross-sectional views of a light-emitting apparatus.

FIG. 6A and FIG. 21A illustrate a cross-sectional view of the light-emitting apparatus 400B. FIG. 6A and FIG. 21A include the light-emitting devices with the structures illustrated in FIG. 1 and FIG. 17, respectively. A perspective view of the light-emitting apparatus 400B is similar to that of the light-emitting apparatus 400A (FIG. 4A). FIG. 6A and FIG. 21A each illustrate an example of cross sections of part of a region including the FPC 472, part of the circuit 464, and part of the display portion 462 in the light-emitting apparatus 400B. FIG. 6A and FIG. 21A each specifically illustrate an example of a cross section of a region including the light-emitting device 430*b*, which emits green light, and the light-emitting device 430*c*, which emits blue light, in the display portion 462. Note that descriptions of portions similar to those of the light-emitting apparatus 400A are omitted in some cases.

The display apparatus 400B illustrated in each of FIG. 6A and FIG. 21A includes a transistor 202, transistors 210, the light-emitting device 430*b*, the light-emitting device 430*c*, and the like between the substrate 453 and the substrate 454.

The substrate 454 and the protective layer 416 are bonded to each other with the adhesive layer 442. The adhesive layer 442 is provided so as to overlap with the light-emitting device 430*b* and the light-emitting device 430*c*; that is, the light-emitting apparatus 400B employs a solid sealing structure.

The substrate 453 and an insulating layer 212 are bonded to each other with an adhesive layer 455.

As a method for manufacturing the light-emitting apparatus 400B, first, a manufacture substrate provided with the insulating layer 212, the transistors, the light-emitting devices, and the like and the substrate 454 provided with the light-blocking layer 417 are bonded to each other with the adhesive layer 442. Then, the substrate 453 is attached to a surface exposed by separation of the manufacture substrate, whereby the components formed over the manufacture substrate are transferred to the substrate 453. The substrate 453 and the substrate 454 are preferably flexible. Accordingly, the flexibility of the light-emitting apparatus 400B can be increased.

The inorganic insulating film that can be used as the insulating layer 211, the insulating layer 213, and the insulating layer 215 can be used as the insulating layer 212.

The pixel electrode is connected to the conductive layer 222*b* included in the transistor 210 through the opening provided in the insulating layer 214. The conductive layer 222*b* is connected to a low-resistance region 23 In through an opening provided in the insulating layer 215 and an insulating layer 225. The transistor 210 has a function of controlling the driving of the light-emitting device.

Light from the light-emitting devices 430*b* and 430*c* is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 23 In through openings provided in the insulating layer 215. One of the conductive layer 222*a* and the conductive layer 222*b* functions as a source, and the other functions as a drain.

FIG. 6A and FIG. 21A each illustrate an example in which the insulating layer 225 covers the top surface and the side surface of the semiconductor layer. The conductive layer 222*a* and the conductive layer 222*b* are connected to the corresponding low-resistance regions 23 In through openings provided in the insulating layer 225 and the insulating layer 215.

In a transistor 209 illustrated in FIG. 6B and FIG. 21B, the insulating layer 225 overlaps with the channel formation region 231*i* of the semiconductor layer 231 and does not overlap with the low-resistance regions 231*n*. The structure illustrated in each of FIG. 6B and FIG. 21B is obtained by processing the insulating layer 225 with the conductive layer 223 as a mask, for example. In FIG. 6B and FIG. 21B, the insulating layer 215 is provided to cover the insulating layer 225 and the conductive layer 223, and the conductive layer 222*a* and the conductive layer 222*b* are connected to the low-resistance regions 231*n* through openings in the insulating layer 215. Furthermore, an insulating layer 218 covering the transistor may be provided.

[Light-Emitting Apparatus 400C]

Figure 7:
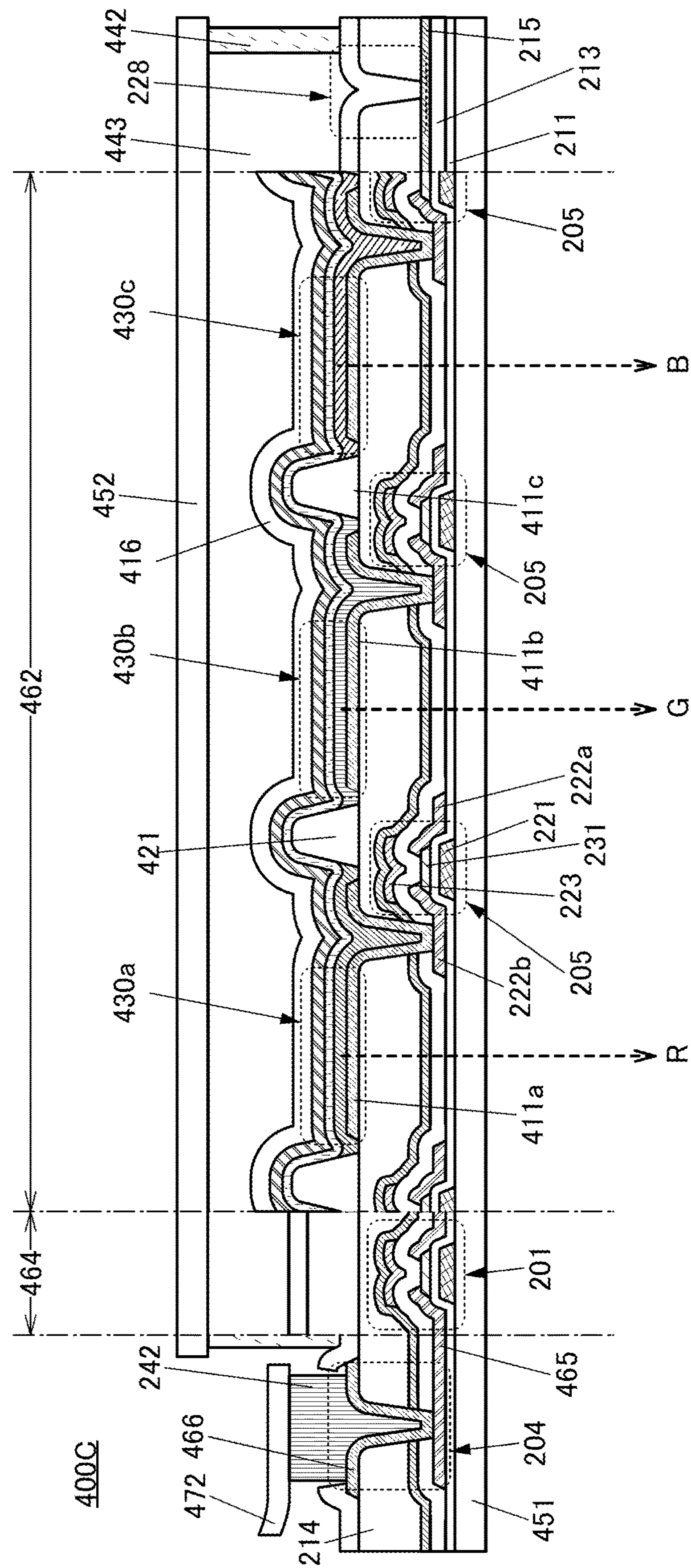
FIG. 7 is a cross-sectional view of a light-emitting apparatus.
Figure 22:
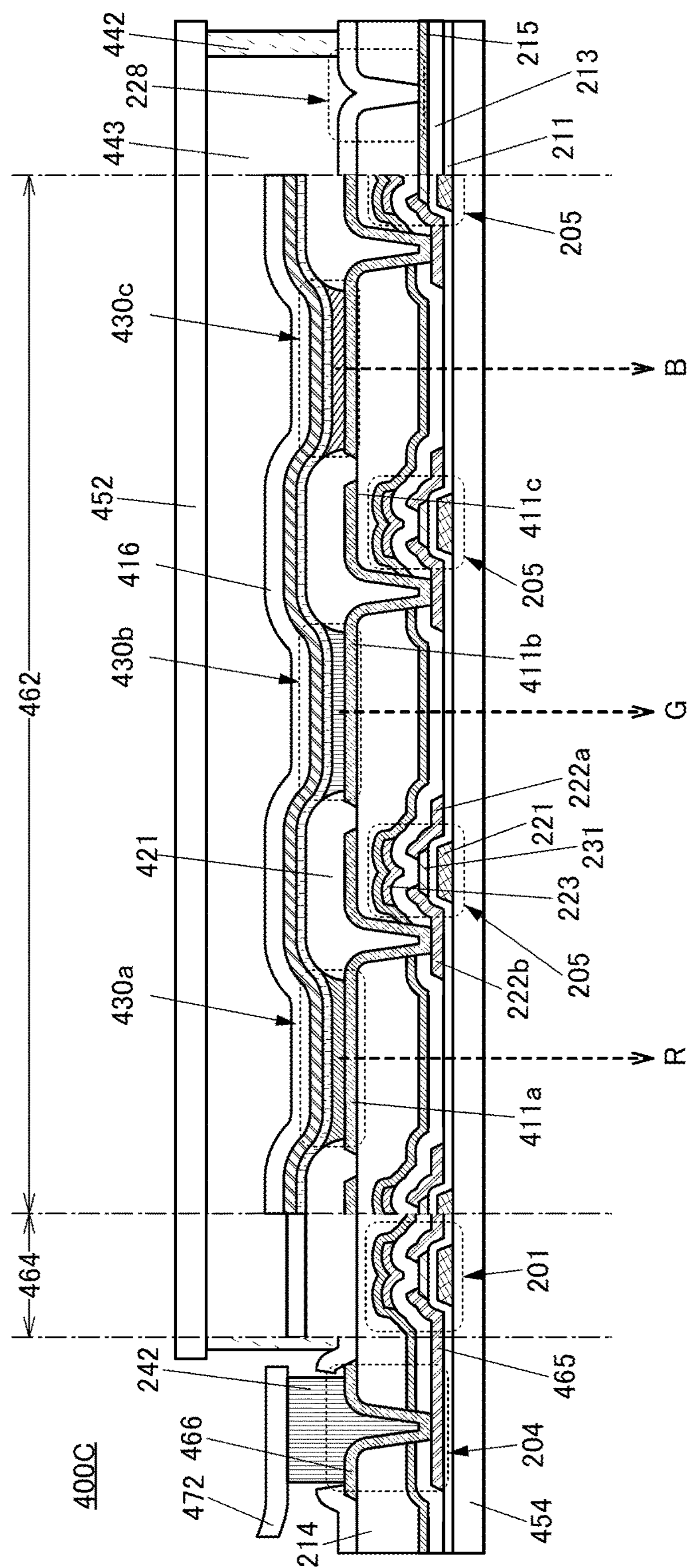
FIG. 22 is a perspective view of a light-emitting apparatus.

FIG. 7A and FIG. 22 each illustrate a cross-sectional view of a light-emitting apparatus 400C. FIG. 7 and FIG. 22 include the structure of the light-emitting device in FIG. 1 and FIG. 17, respectively. A perspective view of the light-emitting apparatus 400C is similar to that of the light-emitting apparatus 400A (FIG. 4). FIG. 7 and FIG. 22 each illustrate an example of cross sections of part of a region including the FPC 472, part of the circuit 464, and part of the display portion 462 in the light-emitting apparatus 400C. Note that descriptions of portions similar to those of the light-emitting apparatus 400A are omitted in some cases.

In the structures of FIG. 7 and FIG. 22, the optical adjustment layers 426*a* to 426*c* in FIG. 5A and FIG. 20A are not provided. The pixel electrodes 411*a* to 411*c* are formed using light-transmitting conductive materials. The second electrode is a reflective electrode.

The light-emitting apparatus 400C having such a structure is a bottom-emission light-emitting apparatus in which light from the light-emitting device is emitted toward the substrate 451. The transistor is formed using an oxide semiconductor and each electrode of the transistor is formed using a light-transmitting material. Thus, light is difficult to block by the transistor formed in the optical path in which light from the light-emitting device is emitted to the outside, so that a light-emitting device having a high aperture ratio and a high resolution can be provided. At least part of this embodiment can be appropriately implemented in combination with the other embodiments described in this specification.

Embodiment 2

In this embodiment, a light-emitting device that can be used in the light-emitting apparatus of one embodiment of the present invention will be described.

<Structure Example of Light-Emitting Device>

As illustrated in FIG. 8A, the light-emitting device includes the EL layer 103 between a pair of electrodes (a lower electrode 21 and an upper electrode 25). The EL layer 103 included in light-emitting device can be formed of a plurality of layers, e.g., a layer 4420, a light-emitting layer 4411, and a layer 4430. The layer 4420 can include, for example, a layer including a substance with a high electron-injection property (an electron-injection layer) and a layer including a substance with a high electron-transport property (an electron-transport layer). The light-emitting layer 4411 includes a light-emitting compound, for example. The layer 4430 can include, for example, a layer including a substance with a high hole-injection property (a hole-injection layer) and a layer including a substance with a high hole-transport property (a hole-transport layer).

FIG. 8B illustrates a variation example of the EL layer 103 included in the light-emitting device 20 illustrated in FIG. 8A. Specifically, the light-emitting device 20 illustrated in FIG. 8B includes a layer 4430-1 over the lower electrode 21, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 25 over the layer 4420-2. For example, when the lower electrode 21 functions as a positive electrode and the upper electrode 25 functions as a negative electrode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a negative electrode and the upper electrode 25 functions as a positive electrode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be increased. Note that the layers included between the light-emitting layer 4411 and the lower electrode 21 and the layers included between the light-emitting layer 4411 and the upper electrode 25 are not limited these layers, and a carrier-block layer, an exciton-block layer, or the like may be provided as appropriate. Moreover, a layer having functions of both a carrier-transport layer and a carrier-injection layer may be used.

In addition, the structure in which a plurality of light-emitting layers (light-emitting layers 4411, 4412, and 4413) are provided between the layer 4420 and the layer 4430 as illustrated in FIG. 8C is also a variation. Light-emitting materials included in the plurality of light-emitting layers are made different (for example, materials emitting light of red, green, and blue are included in the respective light-emitting layers), whereby white light emission can easily obtained from the light-emitting device 20. Although FIG. 8C illustrates the structure provided with three light-emitting layers, two light-emitting layers or four or more light-emitting layers may be formed.

Note that also in FIG. 8C, the layer 4420 and the layer 4430 may each have a stacked-layer structure of two or more layers as illustrated in FIG. 8B.

FIG. 8D is a variation example of the EL layer 103 included in the light-emitting device 20. Specifically, in the light-emitting device 20 in FIG. 8D, the EL layer 103 is configured with a single layer of the light-emitting layer 4411 including a light-emitting material. This is a structure in which a polymer, such as copolymerization of a monomer having a carrier-transport skeleton and a monomer having a light-emitting skeleton, is used to form the light-emitting layer 4411: a structure in which a composition obtained by blending polymers having a carrier-transport function and a light-emitting function is used to form the light-emitting layer 4411: and a structure in which a composition containing low-molecular compounds having a carrier-transport function and a light-emitting function is used to form the light-emitting layer 4411, for example. This structure is advantageous in terms of costs because the number of steps for forming the EL layer 103 is small.

In the case of full color display, there are a method in which all light-emitting devices emit light of white color and a color filter or a color conversion layer is used to exhibit light of desired colors such as blue (B), green (G), and red (R), and a method in which light-emitting devices are formed separately for respective emission colors (e.g., blue (B), green (G), and red (R). The former is referred to as a white single structure and the latter is referred to as SBS (Side by Side) structure in some cases.

In the case where the white single structure and the SBS structure described above are compared with each other, the SBS structure and the white single structure have lower consumption in this order. To reduce power consumption, the SBS structure is preferably employed. Meanwhile, the white single structure is preferable in terms of lower manufacturing cost or higher manufacturing yield because the manufacturing process of the white single structure is simpler than that of the SBS structure.

The emission color of the light-emitting device can be red, green, blue, cyan, magenta, yellow, white, or the like depending on the material that constitutes the EL layer 103. Furthermore, the color purity can be further increased when the light-emitting device has a microcavity structure.

The light-emitting device that emits white light preferably includes two or more kinds of light-emitting substances in the light-emitting layer. To obtain white light emission, two or more light-emitting substances may be selected so that their emission colors are complementary. For example, when emission colors of a first light-emitting layer and a second light-emitting layer are complementary colors, the light-emitting device can be configured to emit white light as a whole. The same applies to a light-emitting device including three or more light-emitting layers.

The light-emitting layer preferably includes two or more light-emitting substances that emit light of R (red), G (green), B (blue), Y (yellow), O (orange), and the like. Alternatively, the light-emitting layer preferably includes two or more light-emitting substances that each emit light containing two or more spectral components of R, G, and B.

In the case where a polymer material is used for the light-emitting layer, white light emission can be obtained with one layer formed by blending polymer materials exhibiting the above emission colors. Alternatively, white emission can be obtained by blending and polymerizing monomers each having a skeleton exhibiting any of the above colors.

FIG. 8E illustrates a variation example of the EL layer 103 included in the light-emitting device 20. Specifically, an EL layer 103*a* and an EL layer 103*b* are stacked with an intermediate layer 4440 therebetween. By stacking two EL layers 103 in series, current efficiency can be doubled when the EL layers including light-emitting materials emitting light of the same color are stacked, and thus a light-emitting device with high reliability can be provided. In the case where EL layers including light-emitting materials emitting light of different colors are stacked, a mixture of light of different colors can be obtained from one light-emitting device. The intermediate layer is a layer that can inject a charge into the EL layer on voltage application between the electrodes.

A specific structure example of the light-emitting device will be described here.

The light-emitting devices include at least the light-emitting layer. The light-emitting device may further include, as a layer other than the light-emitting layer, a layer including a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

For example, the light-emitting device can include, in addition to the above light-emitting layer, one or more layers of carrier-injection layers (such as a hole-injection layer and an electron-injection ayer), carrier-transport layers (a hole-transport layer and an electron-transport layer), carrier-block layers (such as a hole-block layer and an electron-block layer), an exciton-block layer, and a charge-generation layer.

The hole-injection layer is a layer for injecting holes to the hole-transport layer from the positive electrode. Specifically, the hole-injection layer can be formed using a phthalocyanine complex compound, an aromatic amine compound, a high molecular compound such as poly(3,4-ethylenedioxythiophene)/poly(styrenesulfonic acid) (abbreviation: PEDOT/PSS), or the like.

The hole-injection layer may be formed using a substance having an acceptor property. As the substance having an acceptor property, an organic compound having an electron-withdrawing group (a halogen group or a cyano group) can be used. A compound in which electron-withdrawing groups are bonded to a condensed aromatic ring having a plurality of hetero atoms, such as 2,3,6,7,10,11-hexacyano-1,4,5,8,9,12-hexaazatriphenylene (abbreviation: HAT-CN), is particularly preferable because it is thermally stable. Alternatively, a [3]radialene derivative including an electron-withdrawing group (in particular, a cyano group, a halogen group such as a fluoro group, or the like) is preferable because it has a very high electron-accepting property. As the substance having an acceptor property, molybdenum oxide, vanadium oxide, ruthenium oxide, tungsten oxide, manganese oxide, or the like can be used, other than the above-described organic compounds. The substance having an acceptor property can extract electrons from an adjacent hole-transport layer (or hole-transport material) by the application of a voltage between electrodes.

The hole-injection layer may be formed using a composite material containing any of the aforementioned materials having an acceptor property and a material having a hole-transport property. As the material having a hole-transport property used for the composite material, any of a variety of organic compounds such as aromatic amine compounds, heteroaromatic compounds, aromatic hydrocarbons, and high molecular compounds (e.g., oligomers, dendrimers, or polymers) can be used. Note that the material having a hole-transport property used for the composite material preferably has a hole mobility higher than or equal to $1\times10^{-6}$ $cm^2/Vs$. The material having a hole-transport property used in the composite material is preferably a compound having a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable: specifically, a carbazole ring, a dibenzothiophene ring, or a ring in which an aromatic ring or a heteroaromatic ring is further condensed to the carbazole ring or the dibenzothiophene ring is preferable. Another aromatic amine compound can be used as the material having a hole-transport property.

The hole-transport layer is a layer transporting holes, which are injected from a positive electrode by a hole-injection layer, to a light-emitting layer. The hole-transport layer is a layer including a hole-transport material. As the hole-transport material, a substance having a hole mobility greater than or equal to $10^6$ $cm^2/Vs$ is preferable. Note that other substances can also be used as long as they have a property of transporting more holes than electrons. As the hole-transport material, a material having a high hole-transport property, such as a π-electron rich heteroaromatic compound or an aromatic amine, is preferable.

As the π-electron rich heteroaromatic ring, a condensed aromatic ring having at least one of a pyrrole skeleton, a furan skeleton, and a thiophene skeleton is preferable: specifically, a carbazole ring, a dibenzothiophene ring, or a ring in which an aromatic ring or a heteroaromatic ring is further condensed to the carbazole ring or the dibenzothiophene ring is preferable.

The electron-transport layer is a layer that transports electrons, which are injected from a negative electrode by an electron-injection layer, to a light-emitting layer. The electron-transport layer is a layer including an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, a metal complex, an organic compound having a π-electron deficient heteroaromatic ring skeleton, and the like are preferred. Specifically, a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound including a nitrogen-containing heteroaromatic compound, can be used. In particular, the heterocyclic compound having a diazine skeleton, the heterocyclic compound having a triazine skeleton, and the heterocyclic compound having a pyridine skeleton have high reliability and thus are preferable. Among them, the heterocyclic compound having a diazine (pyrimidine, pyrazine, or the like) skeleton or a triazine skeleton has a high electron-transport property and contributes to a reduction in driving voltage.

The electron-injection layer is a layer injecting electrons from the negative electrode to the electron-transport layer, and a layer including a material with a high electron-injection property. As the material with a high electron-injection property, an alkali metal, an alkaline earth metal, or a compound or a complex thereof can be used. As a material of the electron-injection layer, an alkali metal, an alkaline earth metal, or a compound thereof is included in a layer of an electride or a substance having an electron-transport property, can also be used.

In addition, as the above-described electron-injection layer, a material having an electron-transport property may be used. For example, a compound having an unshared electron pair and having an electron deficient heteroaromatic ring can be used as the material having an electron-transport property. Specifically, a compound with at least one of a pyridine ring, a diazine ring (a pyrimidine ring, a pyrazine ring, and a pyridazine ring), and a triazine ring can be used, specifically, 4,7-diphenyl-1,10-phenanthroline (abbreviation: BPhen), 2,9-bis(naphthalen-2-yl)-4,7-diphenyl-1,10-phenanthroline (abbreviation: NBPhen), or the like can be used.

The intermediate layer is a layer (also referred to as a charge-generation layer) that can generate charges by voltage application and can inject the charges into the EL layer, and includes at least a P-type layer. The P-type layer is preferably formed using any of the composite materials given above as the material that can form the hole-injection layer. The P-type layer may be formed by stacking a film including the above acceptor material as a material included in the composite material and a film including the above hole-transport material.

Note that one or both of an electron-relay layer and an electron-injection buffer layer are preferably provided in the intermediate layer in addition to the P-type layer. The electron-injection buffer layer and the electron-relay layer are provided closer to the positive electrode than the P-type layer is, and the electron-relay layer is provided between the electron-injection buffer layer and the P-type layer.

The electron-relay layer includes at least a substance having an electron-transport property and has a function of preventing an interaction between the electron-injection buffer layer and the P-type layer to smoothly transfer electrons. The LUMO level of the substance having an electron-transport property included in the electron-relay layer is preferably between the LUMO level of an acceptor substance in the P-type layer and the LUMO level of a substance included in a layer of the electron-transport layer in contact with the charge-generation layer. As the substance having an electron-transport property used for the electron-relay layer, a phthalocyanine-based material or a metal complex having a metal-oxygen bond and an aromatic ligand is preferably used.

For the electron-injection buffer layer, a substance having a high electron-injection property, such as an alkali metal, an alkaline earth metal, a rare earth metal, a compound of any of these metals, a compound of a rare earth metal, or the like can be used.

In addition, the electron-injection buffer layer may be formed so as to include a substance having a high electron-transport property and a donor substance. In this case, in addition to the above materials, an organic compound such as tetrathianaphthacene (abbreviation: TTN), nickelocene, or decamethylnickelocene can be used. Note that as the substance having an electron-transport property, a material similar to the above-described materials having an electron-transport property can be used for the formation.

The light-emitting layer is a layer including a light-emitting substance. The light-emitting layer can include one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

As the light-emitting substance, a fluorescent material, a phosphorescent material, a thermally activated delayed fluorescence (TADF) material, a quantum dot material, or the like can be used.

As the fluorescent material, a known material can be used: in particular, a heteroaromatic diamine compound or a condensed aromatic diamine compound is preferably used as a fluorescent material for blue. Examples of such a compound include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. In particular, a condensed aromatic diamine compound typified by a pyrenediamine compound is preferable because of its high hole-trapping property, high emission efficiency, and high reliability.

Examples of the phosphorescent material include an organometallic complex (particularly an iridium complex) having a 4H-triazole skeleton, a 1H-triazole skeleton, an imidazole skeleton, a carbene skeleton, a pyrimidine skeleton, a pyrazine skeleton, a pyridine skeleton, or a quinoline skeleton: an organometallic complex (particularly an iridium complex) having a phenylpyridine derivative including an electron-withdrawing group as a ligand: a platinum complex: and a rare earth metal complex.

As the TADF material, a fullerene, a derivative thereof, an acridine, a derivative thereof, an eosin derivative, metal-containing porphyrin, such as a porphyrin containing magnesium (Mg), zinc (Zn), cadmium (Cd), tin (Sn), platinum (Pt), indium (In), palladium (Pd), or the like, or a heterocyclic compound including one or both of a π-electron rich heteroaromatic ring and a π-electron deficient heteroaromatic ring, or the like can be used, for example.

Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor property and favorable reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability: therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Incidentally, a π-electron deficient skeleton and a π-electron rich skeleton can be used instead of at least one of the π-electron deficient heteroaromatic ring and the π-electron rich heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used.

The light-emitting layer may include one or more kinds of organic compounds (e.g., a host material and an assist material) in addition to the light-emitting substance (a guest material). As one or more kinds of organic compounds, one or both of the hole-transport material and the electron-transport material described above can be used. In addition, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

In one embodiment of the present invention, the layers up to and including the light-emitting layer (that is, the layer 4430 and the light-emitting layer 4411) over the lower electrode (pixel electrode) can be formed by a wet method such as an inkjet method or a nozzle printing method, using a composition in which any of various materials described above are dissolved or dispersed in a solvent. In this case, any of various organic solvents can be used as the composition to be applied. Moreover, a composition in which a desired material such as a polymer material, a low-molecular material, or a dendrimer having a desired function is mixed or a composition in which the mixture is dispersed or dissolved in a solvent can be used as the composition to be applied.

When the layer 4430 is to be formed using a polymer, a composition of one kind of monomer of a polymer material to be formed as a film or a plurality of kinds of monomers that are mixed can be discharged to a film-formation surface, and a bond such as cross-linking. condensation, polymerization, coordination, or a salt can be formed by heating, energy light irradiation, or the like to form a desired film.

Note that the composition may contain an organic compound having another function such as a surface active agent or a substance for adjusting viscosity.

Examples of the polymer material include conjugated polymers, non-conjugated polymers, pendant-type polymers, and dye-blend type polymers. Examples of conjugated polymers include a polyparaphenylene vinylene derivative ((poly(p-phenylenevinylene): PPV), a polyalkylthiophene derivative ((poly(3-alkylthiophene): PAT), a polyparaphenylene derivative (poly(1,4-phenylene): PPP system), a polyfluorene derivative (poly(9,9-dialkylfluorene): PDAF), or copolymers thereof. Examples of pendant-type polymers include vinylpolymers, and for example, a polyvinylcarbazole derivative (polyvinylcarbazole: PVK) can be given. Note that polymers can be blended and used.

As the organic solvents that can be used for the above composition, a variety of organic solvents such as benzene, toluene, xylene, mesitylene, tetrahydrofuran, dioxane, ethanol, methanol, n-propanol, isopropanol, n-butanol, t-butanol, acetonitrile, dimethylsulfoxide, dimethylformamide, chloroform, methylene chloride, carbon tetrachloride, ethyl acetate, hexane, and cyclohexane can be used. In particular, a low polarity benzene derivative such as benzene, toluene, xylene, or mesitylene is preferably used because a solution with a suitable concentration can be obtained and a material contained in the composition can be prevented from deteriorating due to oxidation or the like. Furthermore, in light of the uniformity of a formed film or the uniformity of film thickness, the boiling point is preferably 100° C. or higher, and toluene, xylene, or mesitylene is further preferable.

Next, materials for forming the light-emitting device are described in detail.

The lower electrode 21 and the upper electrode 25 are electrodes each functioning as a positive electrode or a negative electrode.

The positive electrode is preferably formed using a metal, an alloy, or a conductive compound having a high work function (specifically, 4.0 eV or more), a mixture thereof, or the like. Specifically, for example, indium oxide-tin oxide (ITO: Indium Tin Oxide), indium oxide-tin oxide containing silicon or silicon oxide, indium oxide-zinc oxide, indium oxide containing tungsten oxide and zinc oxide (IWZO), and the like can be given. These conductive metal oxide films are usually deposited by a sputtering method but may also be formed by application of a sol-gel method or the like. An example of the formation method is a method in which indium oxide-zinc oxide is formed by a sputtering method using a target in which 1 to 20 wt % zinc oxide is added to indium oxide. Indium oxide containing tungsten oxide and zinc oxide (IWZO) can also be formed by a sputtering method using a target containing 0.5 to 5 wt % tungsten oxide and 0.1 to 1 wt % zinc oxide with respect to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given as examples of the material that is used for the positive electrode. Graphene can also be used for the material that is used for the positive electrode. Note that when a composite material described later is used for a layer that is in contact with the positive electrode in the EL layer 103, an electrode material can be selected regardless of its work function.

When the positive electrode is formed using a material having a visible-light-transmitting property, the light-emitting device can emit light from the positive electrode side.

Although the EL layer 103 preferably has a stacked-layer structure as illustrated in FIG. 8, there is no particular limitation on the stacked-layer structure, and any of various layer structures such as a hole-injection layer, a hole-transport layer, a light-emitting layer, an electron-transport layer, an electron-injection layer, a carrier-block layer (a hole-block layer and an electron-block layer), an exciton-block layer, and a charge-generation layer can be employed. Note that one or more of these layers are not necessarily provided.

The hole-injection layer is provided in contact with the positive electrode and has a function of facilitating injection of holes into the EL layer 103. Alternatively, the hole-injection layer can be formed using phthalocyanine (abbreviation: $H_2Pc$) or a phthalocyanine-based complex compound such as copper phthalocyanine (CuPc), an aromatic amine compound such as 4,4'-bis[N-(4-diphenylaminophenyl)-N-phenylamino]biphenyl (abbreviation: DPAB) or 4,4'-bis(N-{4-[N'-(3-methylphenyl)-N'-phenylamino]phenyl}-N-phenylamino)biphenyl (abbreviation: DNTPD), or a high molecule such as poly(3,4-ethylenedioxy thiophene)/poly (styrenesulfonic acid) (PEDOT/PSS).

The hole-injection layer may be formed using a substance having an acceptor property. As the substance having an acceptor property, it is possible to use an organic compound having an electron-withdrawing group (a halogen group, a cyano group, or the like), for example, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a very high electron-accepting property and thus is preferable. Specific examples include α,α,α"-1,2,3-cyclopropanetriylidenetris [4-cyano-2,3,5,6-tetrafluorobenzeneacetonitrile], α,α',α"-1,2,3-cyclopropanetriylidenetris [2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. The substance having an acceptor property can extract electrons from an adjacent hole-transport layer (or hole-transport material) by the application of voltage between electrodes.

The hole-injection layer may be formed using a composite material containing any of the aforementioned materials having an acceptor property and a material having a hole-transport property. As the material having a hole-transport property used for the composite material, any of a variety of organic compounds such as aromatic amine compounds, heteroaromatic compounds, aromatic hydrocarbons, and high molecular compounds (e.g., oligomers, dendrimers, or polymers) can be used. Note that the material having a hole-transport property used for the composite material preferably has a hole mobility higher than or equal to $1\times10^{-6}$ $cm^2/Vs$. The material having a hole-transport property used in the composite material is preferably a compound having a condensed aromatic hydrocarbon ring or a π-electron rich heteroaromatic ring. As the condensed aromatic hydrocarbon ring, an anthracene ring, a naphthalene ring, or the like is preferable. As the π-electron rich heteroaromatic ring, a condensed aromatic ring having at least one of a pyrrole skeleton, a furan skeleton, and a thiophene skeleton is preferable: specifically, a carbazole ring, a dibenzothiophene ring, or a ring in which an aromatic ring or a heteroaromatic ring is further condensed to the carbazole ring or the dibenzothiophene ring is preferable.

The material having a hole-transport property preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the material having a hole-transport property preferably has an N,N-bis(4-biphenyl)amino group because a light-emitting device having a favorable lifetime can be fabricated. Specific examples of the material having a hole-transport property include N-(4-biphenyl)-6, N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBBIBP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBBITP), N-[4-(dibenzothiophen-4-yl)phenyl]-N-phenyl-4-biphenylamine (abbreviation: ThBAIBP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6:1'-binaphthyl-2-yl)triphenylamine (abbreviation: BBAβNβNB), 4,4'-diphenyl-4"-(7:1'-binaphthyl-2-yl)triphenylamine (abbreviation: BBAαNpβNB-03), 4,4'-diphenyl-4"-(7-phenyl)naphthyl-2-yltriphenylamine (abbreviation: BBAPβNB-03), 4,4'-diphenyl-4"-(6:2'-binaphthyl-2-yl)triphenylamine (abbreviation: BBA(βN2)B), 4,4'-diphenyl-4"-(7:2'-binaphthyl-2-yl)triphenylamine (abbreviation: BBA(βN2)B-03), 4,4'-diphenyl-4"-(4:2'-binaphthyl-1-yl)triphenylamine (abbreviation: BBAβNαNB), 4,4'-diphenyl-4"-(5:2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBAIBP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBilBP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi(9H-fluoren)-2-amine (abbreviation: PCBNBSF), N,N-bis ([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9)-phenylfluoren-9)-yl)triphenylamine (abbreviation: BPAFLP), 4-phenyl-3'-(9-phenylfluoren-9-yl)triphenylamine (abbreviation: mBPAFLP), 4-pheny 1-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBAIBP), 4,4'-diphenyl-4"-(9)-phenyl-9H-carbazol-3-yl)triphenylamine (abbreviation: PCBBilBP), 4-(1-naphthyl)-4'-(9)-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9),9-dimethyl-9H-fluoren-2-yl)-9,9'-spirobi-9H-fluoren-4-amine, N,N-bis(9),9-dimethyl-9H-fluoren-2-yl)-9,9'-spirobi-9H-fluoren-3- amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

For another aromatic amine compound as the material having a hole-transport property. N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis {4-[bis(3-methylphenyl) amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), or the like can also be used.

The hole-transport layer can be formed using a material having a hole-transport property. As the material having a hole-transport property, any of the materials having a hole-transport property that can be used as a composite material in the above hole-injection layer can be used.

Note that in one embodiment of the present invention, the layer 4430 is formed by a droplet-discharge method: however, in the case where the lower electrode 21 (the pixel electrode 101) is a positive electrode, the layer 4430 serves as the hole-injection layer and/or the hole-transport layer, and preferably includes both a skeleton having a high hole-transport property and a material having an acceptor property. In the case where the layer 4430 is formed by a droplet-discharge method, a sulfonic acid compound, a fluorine compound, a trifluoroacetic acid compound, a propionic acid compound, a metal oxide, or the like can be used as the material having an acceptor property In the case where the layer 4430 is formed by application of a composition of mixed monomers and polymerization, a secondary amine and arylsulfonic acid are preferably used as the monomers.

As a secondary amine, a substituted or unsubstituted aryl group having 6 to 14 carbon atoms and a substituted or unsubstituted π-electron rich type heteroaryl group having 6 to 12 carbon atoms can be used. As an aryl group, for example, a phenyl group, a biphenyl group, a naphthyl group, a fluorenyl group, a phenanthrenyl group, an anthryl group, or the like can be used, and a phenyl group is preferable because it has high solubility and is inexpensive. As a heteroaryl group, a carbazole skeleton, a pyrrole skeleton, a thiophene skeleton, a furan skeleton, an imidazole skeleton, or the like can be used. In addition, a plurality of bondings with an arylamine or a heteroaryl amine are preferably provided because film quality is improved, and oligomers and polymers may be formed. In the case where a plurality of amines are included, part of the amine may be a tertiary amine and the proportion of a secondary amine is preferably higher than the proportion of a tertiary amine. The number of amines is preferably less than or equal to 1000, further preferably less than or equal to 10, and the molecular weight is preferably less than or equal to 100000. Substitution by fluorine is preferable because it improves compatibility with a compound in which fluorine is substituted.

For example, an organic compound represented by General Formula (Gam2) shown below, or the like is preferably used as a secondary amine, and an organic compound represented by General Formula (Gam3) shown below, or the like is preferably used as a tertiary amine.

[Chemical formula 1]

(Gam2)

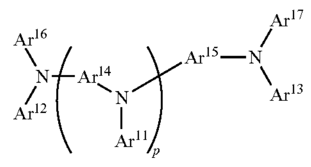

Note that in General Formula (Gam2) above, one or more of $Ar^{11}$ to $Ar^{13}$ represent hydrogen, the others thereof represent substituted or unsubstituted aromatic rings each having 6 to 14 carbon atoms, and $Ar^{14}$ to $Ar^{17}$ represent substituted or unsubstituted aromatic rings each having 6 to 14 carbon atoms. Note that $Ar^{12}$ and $Ar^{16}$ may be bonded to each other to form a ring, $Ar^{14}$ and $Ar^{16}$ may be bonded to each other to form a ring, $Ar^{11}$ and $Ar^{14}$ may be bonded to each other to form a ring, $Ar^{14}$ and $Ar^{15}$ may be bonded to each other to form a ring, $Ar^{15}$ and $Ar^{17}$ may be bonded to each other to form a ring, and $Ar^{13}$ and $Ar^{17}$ may be bonded to each other to form a ring. Furthermore, p represents an integer of 0 to 1000, and preferably represents 0 to 3. Note that the molecular weight of the organic compound represented by General Formula (Gam2) is preferably less than or equal to 100000. As the aromatic ring having 6 to 14 carbon atoms, a benzene ring, a bisbenzene ring, a naphthalene ring, a fluorene ring, a phenanthrene ring, an anthracene ring, or the like can be used.

[Chemical formula 2]

(Gam3)

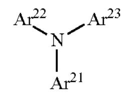

Note that in General Formula (Gam3) shown above, $Ar^{21}$ to $Ar^{23}$ represent a substituted or unsubstituted aryl group having 6 to 14 carbon atoms and may be bonded to each other to form rings. In the case where $Ar^{21}$ to $Ar^{23}$ each have a substituent, the substituent may be a group in which a plurality of diarylamino groups or carbazolyl groups are bonded.

Specific examples of a secondary amine (having NH groups), organic compounds represented by Structural Formula (Am2-1) to Structural Formula (Am2-32) shown below are preferably used. The conductivity of an amine compound is improved by mixing with a sulfonic acid compound (p doping). In the case of using a secondary amine, bondings with a mixed sulfonic acid compound can be formed by a dehydration reaction, or the like, which is preferable. In the case where a sulfonic acid compound or other mixed compounds are fluoride, fluoride is preferably used as in Structural Formulas (Am2-1), (Am2-22) to (Am-2-28), and (Am2-31) below to improve compatibility.

[Chemical Formula 3]
(Am2-1)
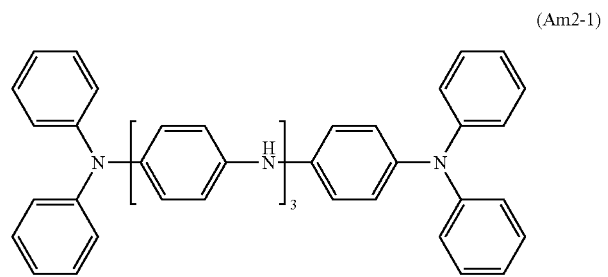
(Am2-2)
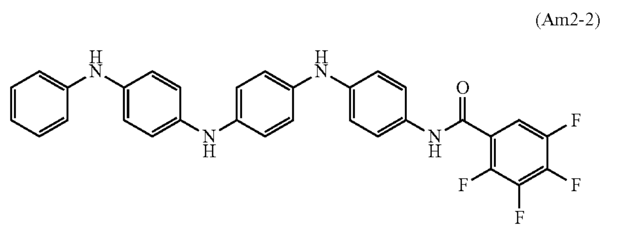
(Am2-3)
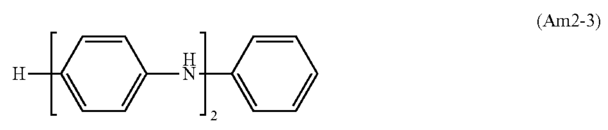
(Am2-4)
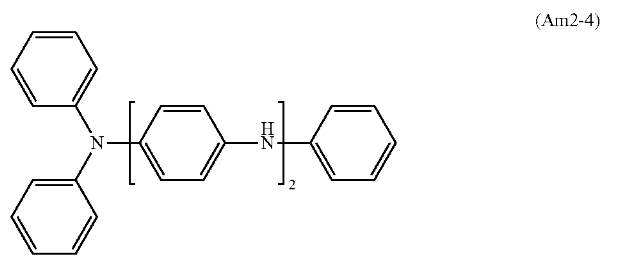
(Am2-5)
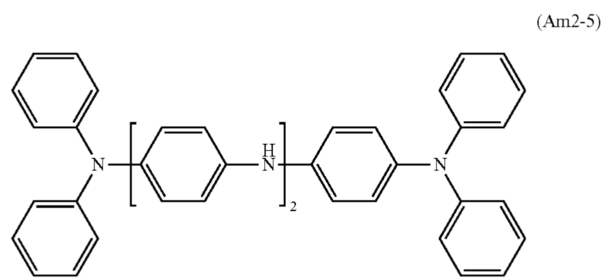
(Am2-6)
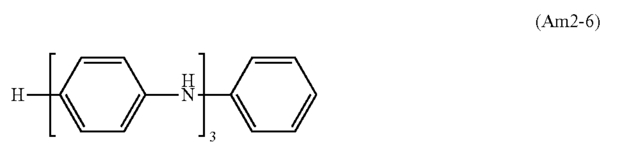
(Am2-7)
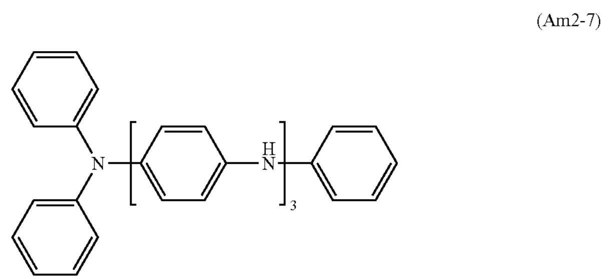
(Am2-8)
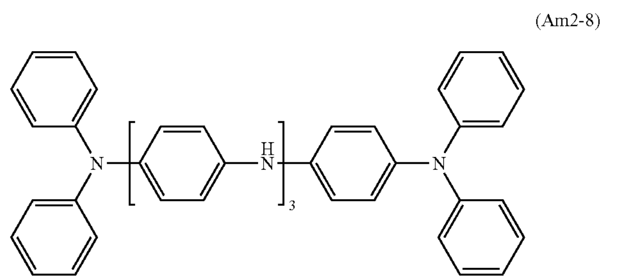
(Am2-9)
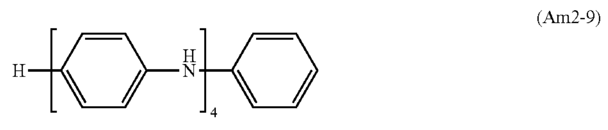
(Am2-10)
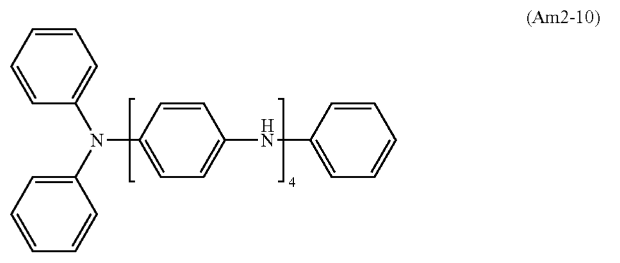
(Am2-11)
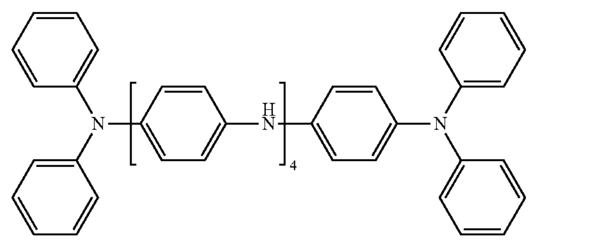

-continued
[Chemical formula 4]
(Am2-12)
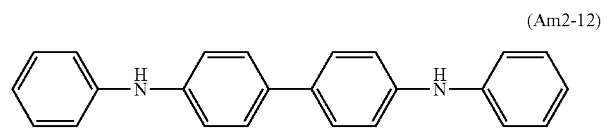
(Am2-13)
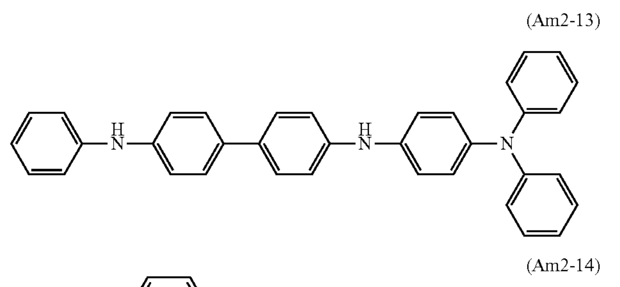
(Am2-14)
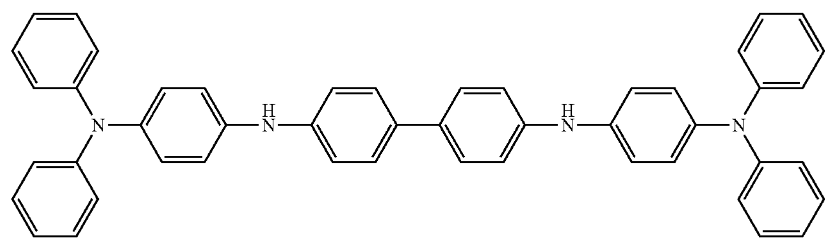
(Am2-15)
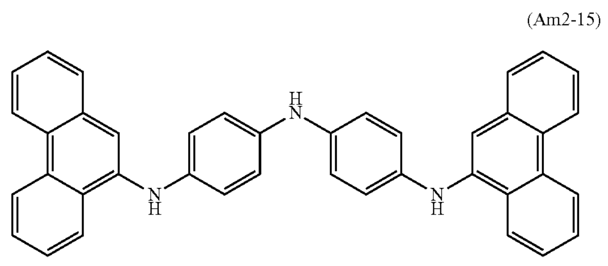
(Am2-16)
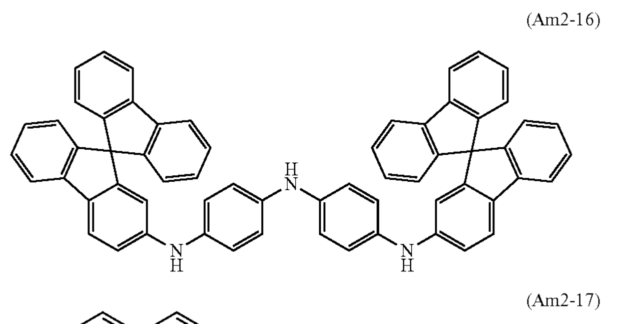
(Am2-17)
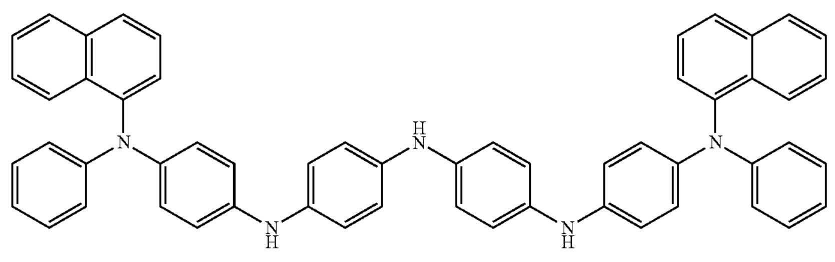
(Am2-18)
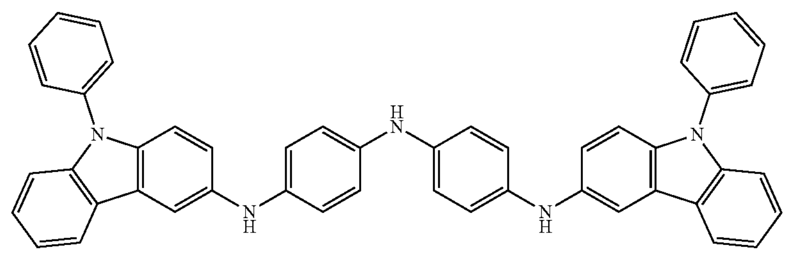
[Chemical formula 5]
(Am2-19)
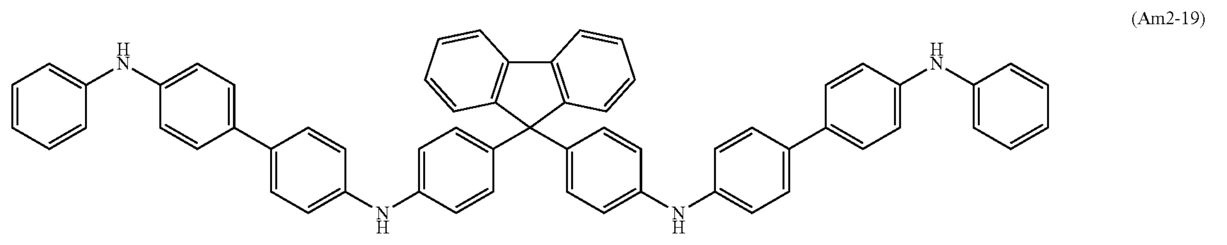

-continued
(Am2-20)
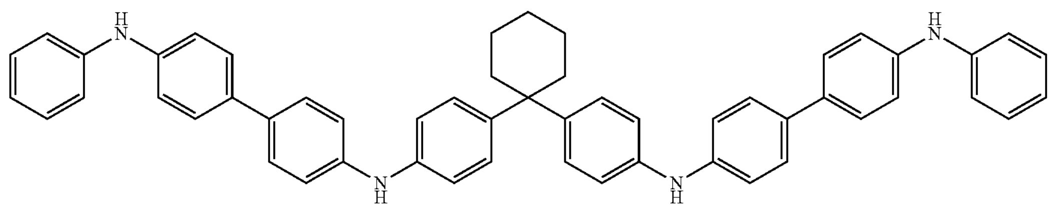
(Am2-21)
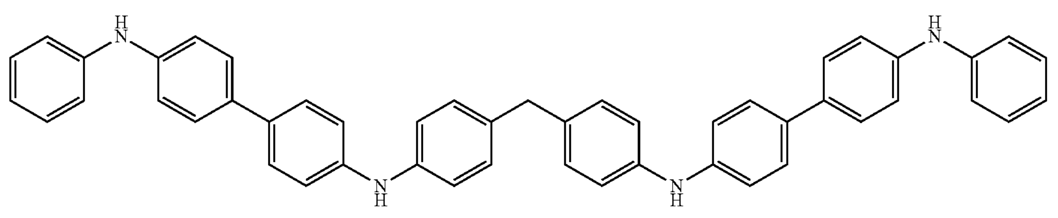
(Am2-22)
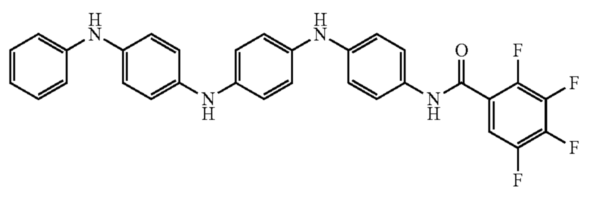
(Am2-23)
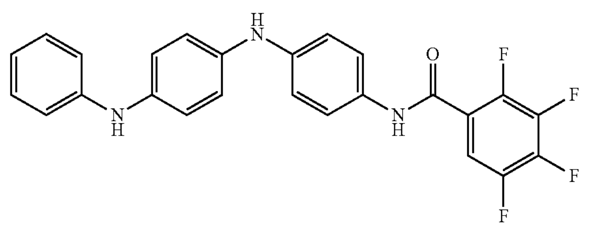
[Chemical formula 6]
(Am2-24)
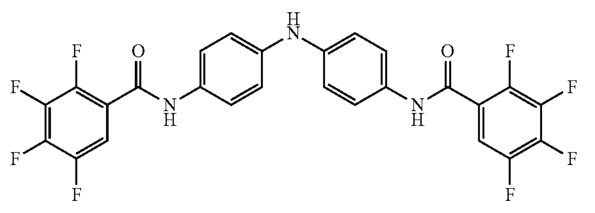
(Am2-25)
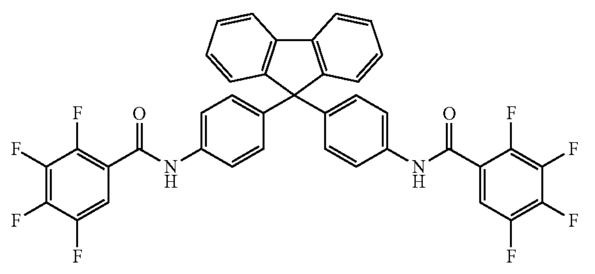
(Am2-26)
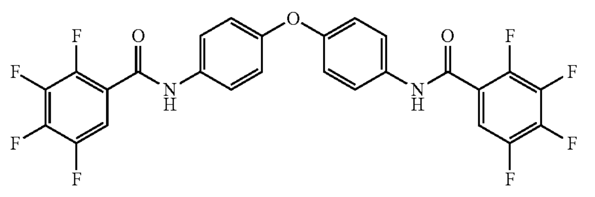
(Am2-27)
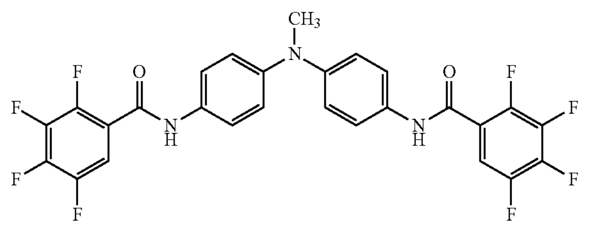
(Am2-28)
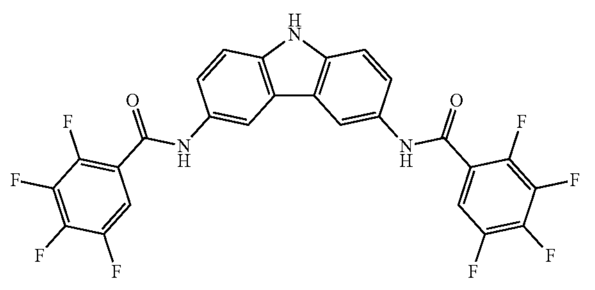
(Am2-29)
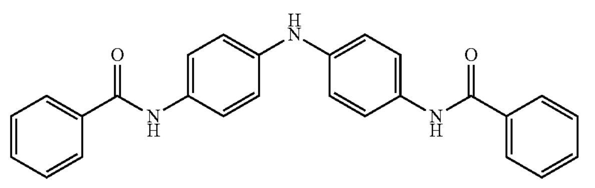

-continued

[Chemical formula 7]

(Am2-30)

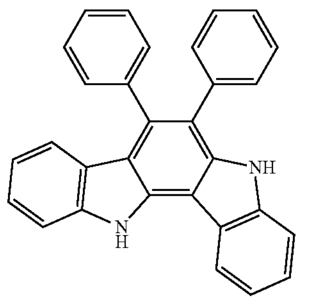

(Am2-31)

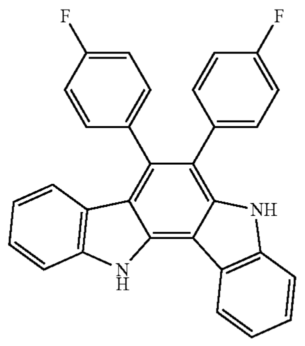

(Am2-32)

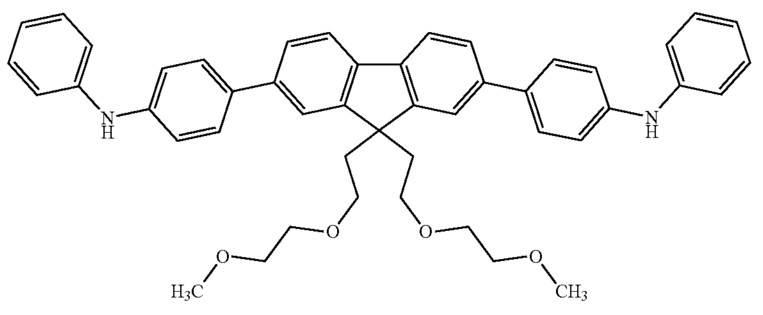

Note that a thiophene derivative may be used instead of the secondary amine. Preferred specific examples of the thiophene derivative include organic compounds represented by Structural Formula (T-1) to Structural Formula (T-4) below, polythiophene, and poly(3,4-ethylenedioxythiophene) (PEDOT). The conductivity of the thiophene derivative is improved by mixing with a sulfonic acid compound (p doping).

[Chemical formula 8]

(T-1)

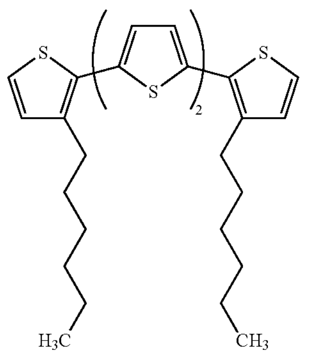

(T-2)

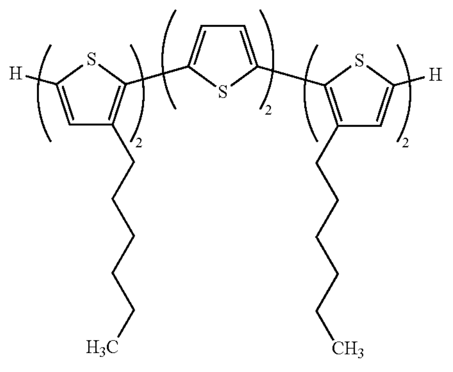

(T-3)

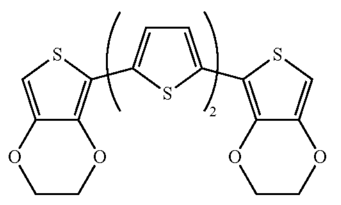

-continued (T-4)

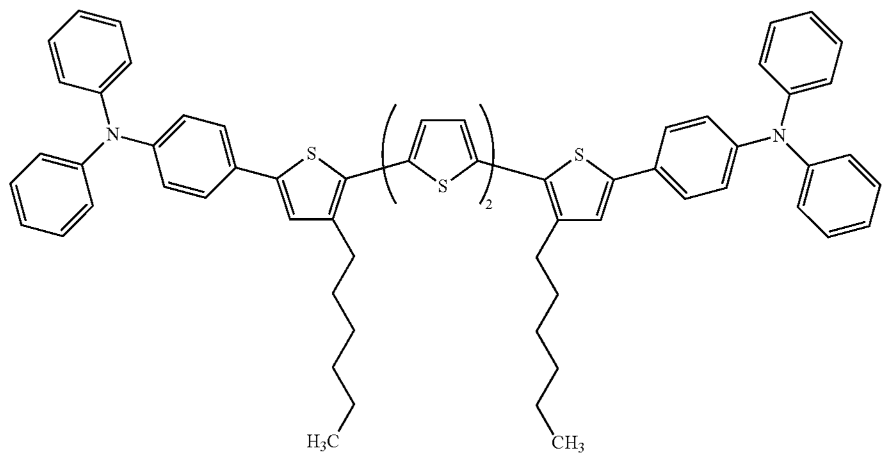

It is only required that the arylsulfonic acid has a sulfo group: a sulfonic acid, a sulfonate, an alkoxysulfonic acid, a halogenated sulfonic acid, or a sulfonic acid anion can be used. Specifically, any of the above-described groups can be used as the sulfo group. A plurality of these sulfo groups may be included. As the aryl group of the arylsulfonic acid, a substituted or unsubstituted aryl group having 6 to 16 carbon atoms can be used. As the aryl group, for example, a phenyl group, a biphenyl group, a naphthyl group, a fluorenyl group, a phenanthrenyl group, an anthryl group, a pyrenyl group, or the like can be used, and a naphthyl group is preferable because it has favorable solubility in an organic solvent and a favorable transport property. These arylsulfonic acid may have a plurality of aryl groups, and an aryl group substituted by fluorine is preferably included because the LUMO level can be adjusted deeply (widely shifted to the negative direction). An ether bond, a sulfide bond, or a bond via an amine may be included: any of these bonds is preferably present between a plurality of aryl groups, in which case the solubility in an organic solvent is improved. Also when an alkyl group is included as a substituent, the alkyl group may be bonded through an ether bond, a sulfide bond, or a bond via an amine. A plurality of the arylsulfonic acids may be substituted in a polymer. Polyethylene, nylon, polystyrene, polyfluorenylene, or the like can be used as a polymer, and polystyrene or polyfluorenylene is preferred in terms of having high conductivity.

Specific examples of an arylsulfonic acid compound, for example, organic compounds represented by Structural Formula (S-1) to Structural Formula (S-15) below are preferable. A polymer having a sulfo group such as poly(4-styrenesulfonic acid) (PSS) can also be used. Electrons from an electron donor with a shallow HOMO (such as an amine compound, a carbazole compound, or a thiophene compound) can be accepted by using an arylsulfonic acid compound, and a hole-injection or hole-transport property from an electrode can be obtained by mixing with an electron donor. When a fluorine compound is employed, the LUMO level can be adjusted to be deeper (the energy level can be higher in the negative direction).

[Chemical formula 9]

NSO-1

(S-1)

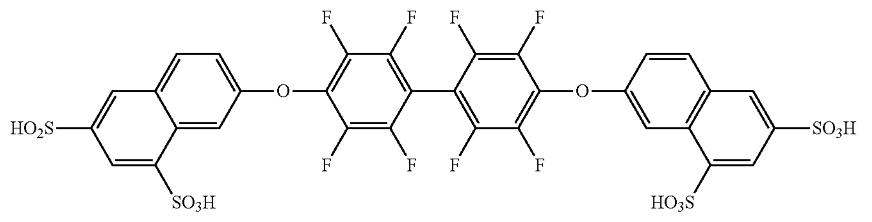

NSO-2

(S-2)

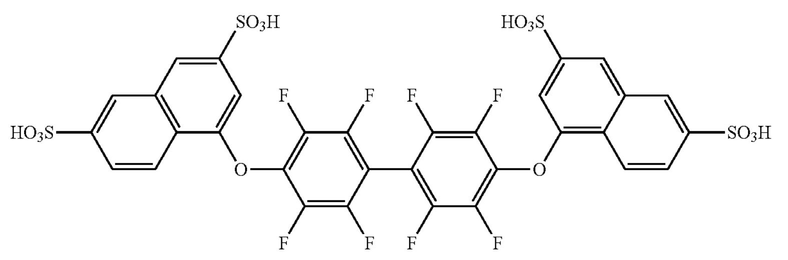

-continued
(S-3)
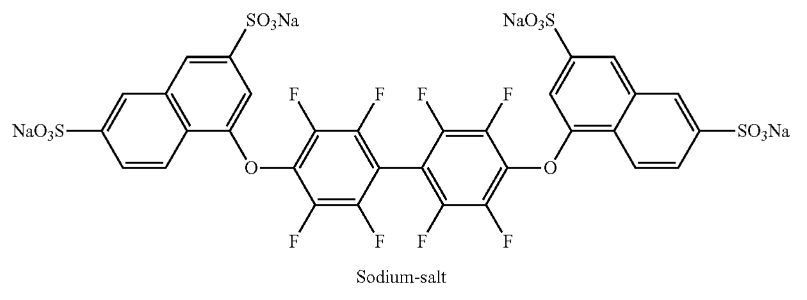
Sodium-salt
(S-4)
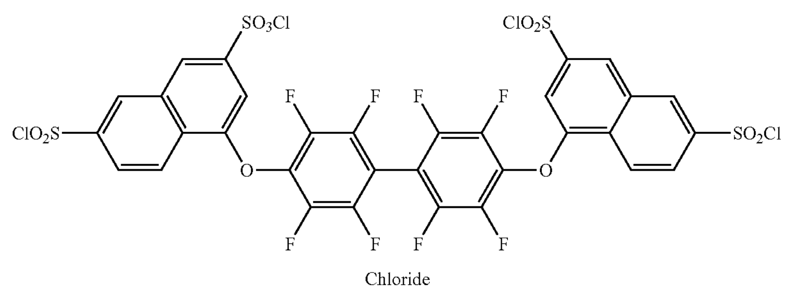
Chloride
NSO-2-PGME
(S-5)
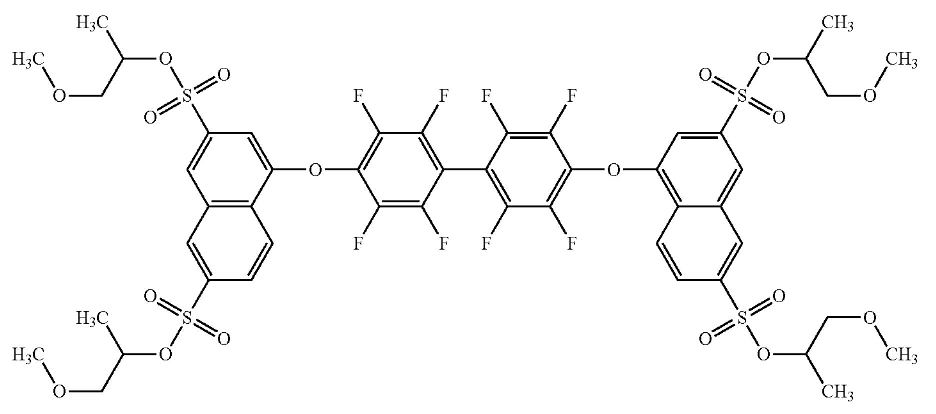
[Chemical formula 10]
NSO-2-PGEE
(S-6)
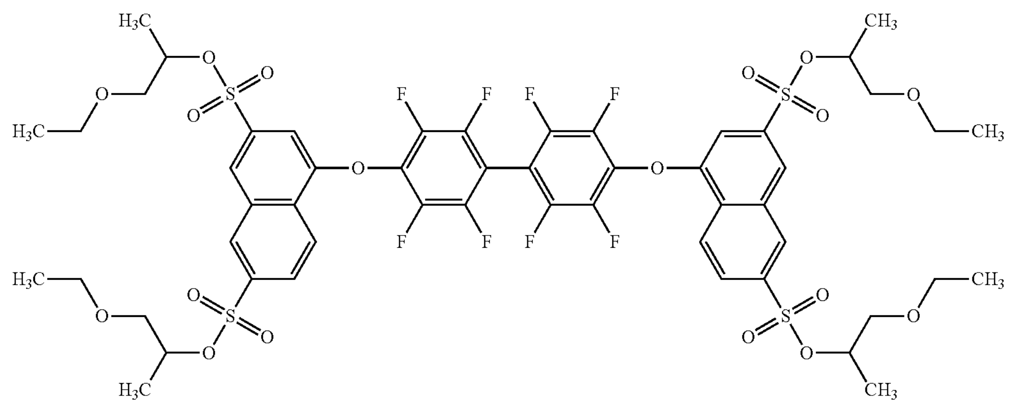

-continued
NSO-2-PGBE
(S-7)
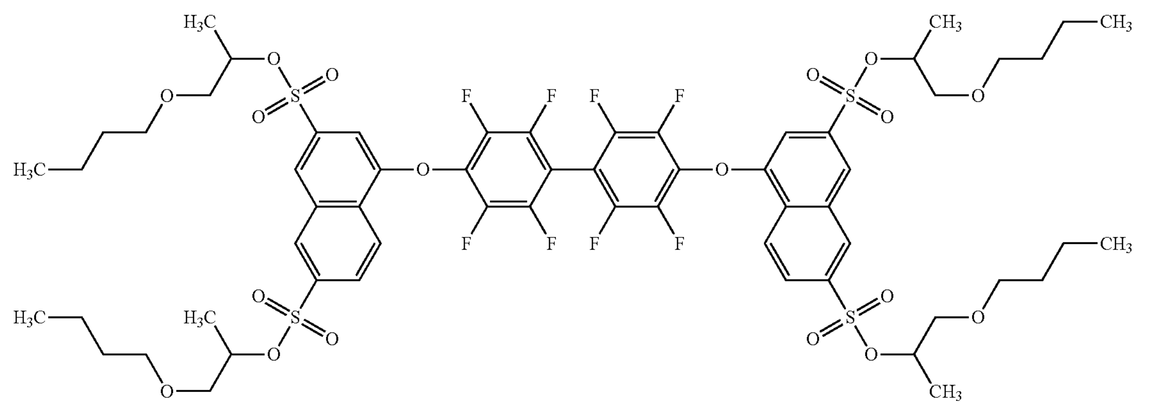
NSO-2-POP
(S-8)
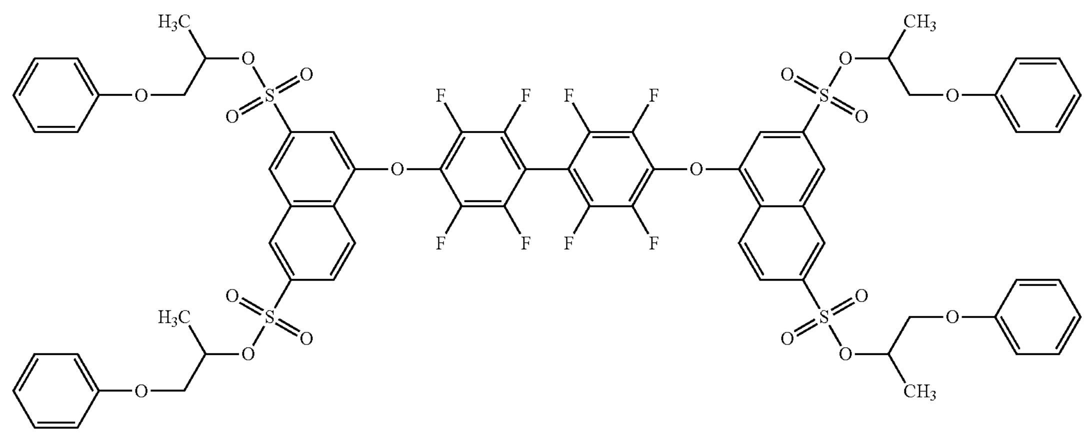
BOSO-2
(S-9)
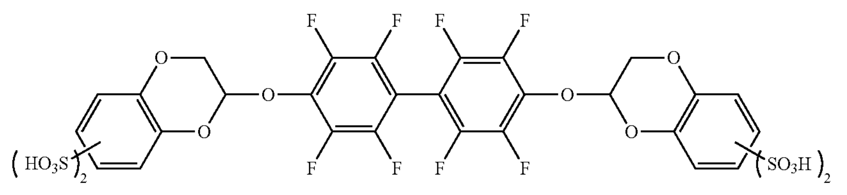

-continued
[Chemical formula 11]
7FNS-1
(S-10)
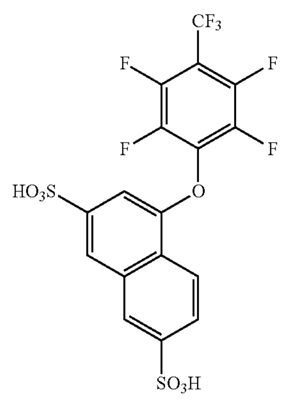
9FNS-1
(S-11)
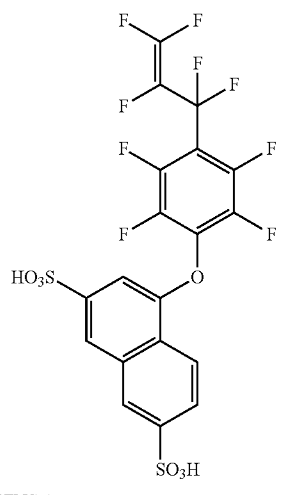
3FNS-1
(S-12)
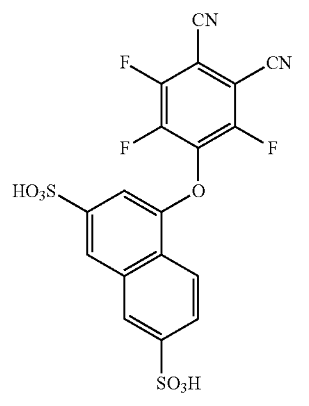
4FNS-1
(S-13)
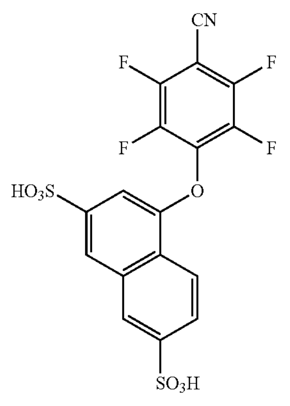
[Chemical formula 12]
(S-14)
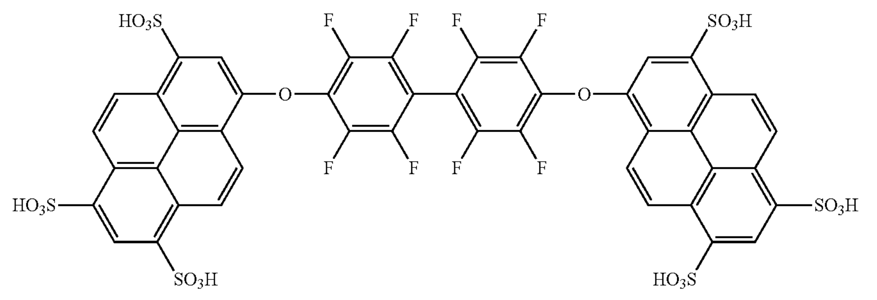
(S-15)
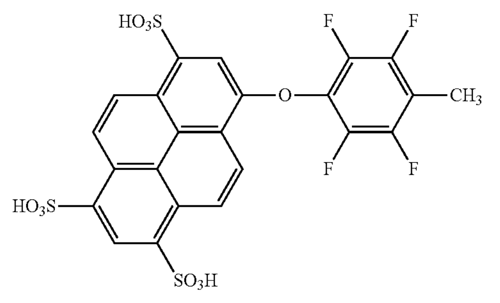

In an ink mixing a secondary amine described above and sulfonic acid, a tertiary amine is further preferable than the secondary amine because a tertiary amine is electrochemically and photochemically stable and has a favorable hole-transport property when mixed. As the tertiary amine, for example, organic compounds represented by Structural Formula (Am3-1) to Structural Formula (Am3-7) shown below are preferable. Besides, a material having a hole-transport property may be mixed as appropriate.

[Chemical formula 13]

(Am3-1)

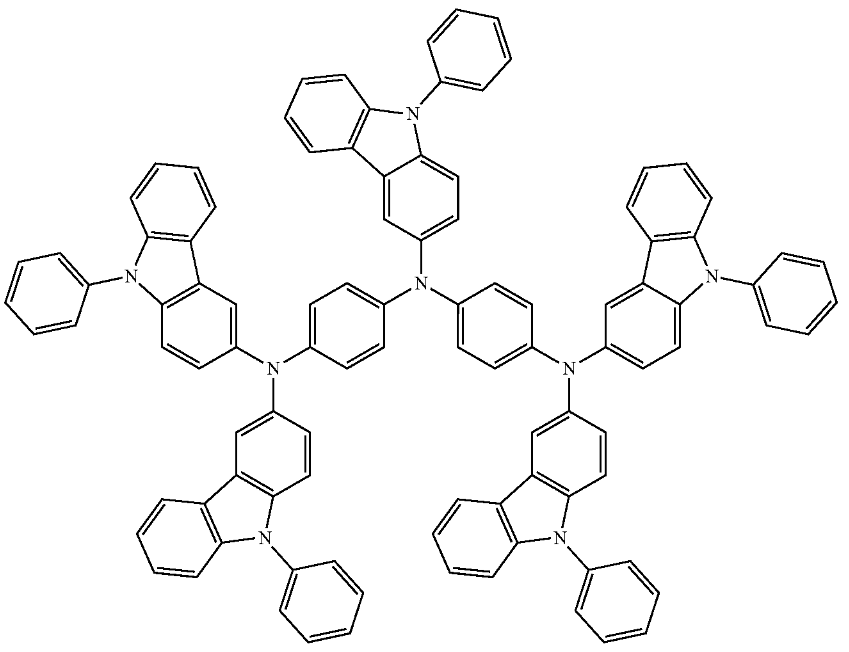

(Am3-2)

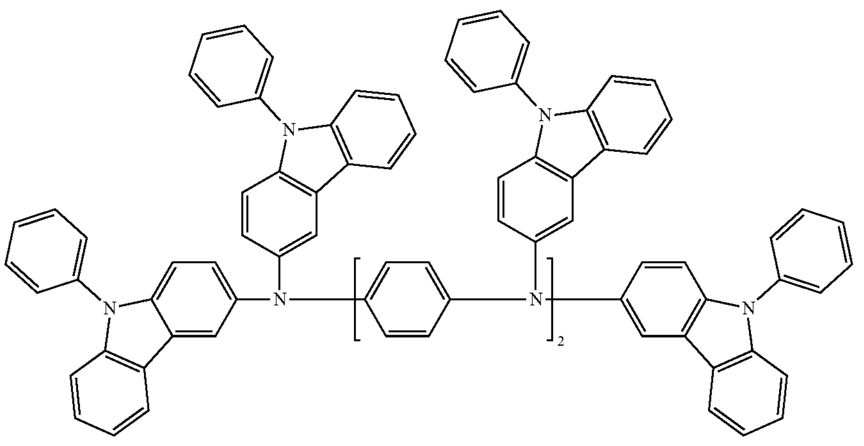

-continued
[Chemical formula 14]
(Am3-3)
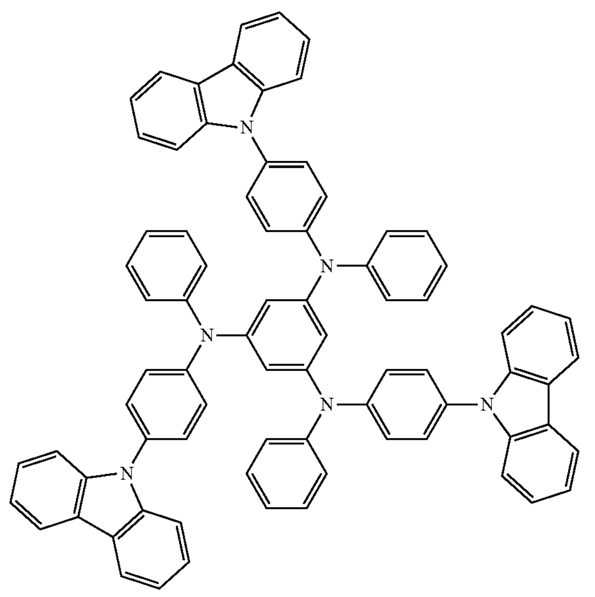
(Am3-4)
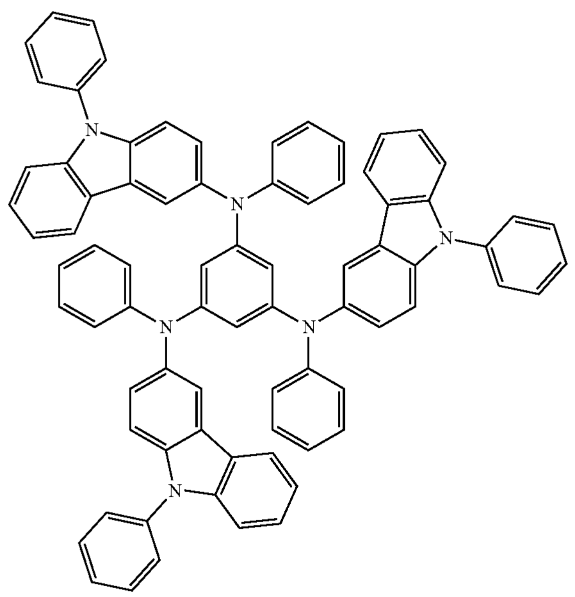
(Am3-5)
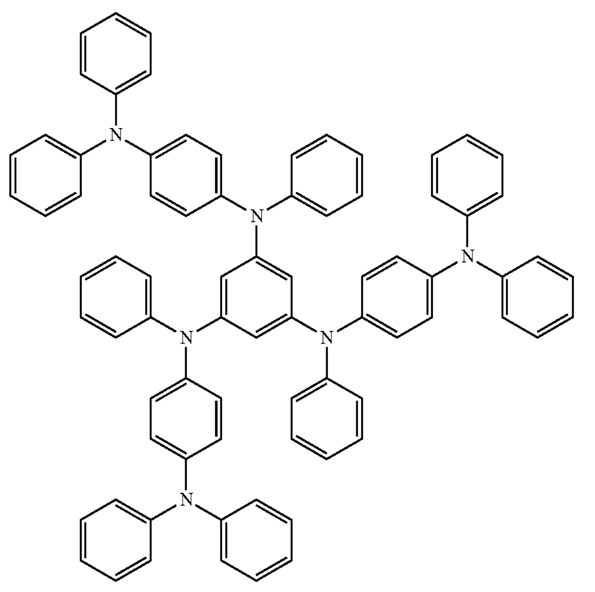
(Am3-6)
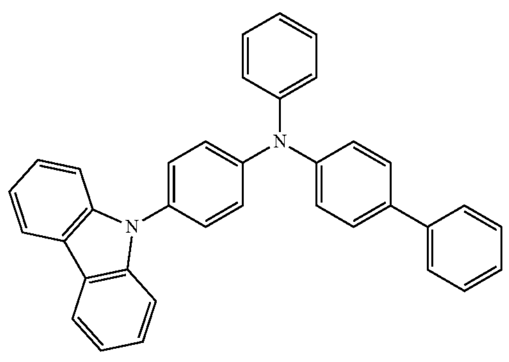

-continued (Am3-7)

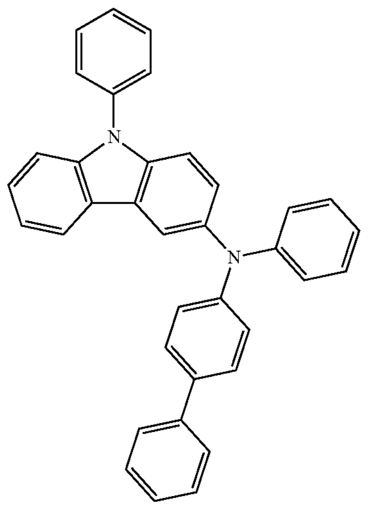

Other than the arylsulfonic acid compound, a cyano compound such as a tetracyanoquinodimethane compound can be used as an electron acceptor. Specifically, 2,3,5,6-tetrafluoro-7,7,8,8-tetracyano-quinodimethane (F4TCNQ), dipyrazino[2,3-f:2',3'-h]quinoxaline-2,3,6,7,10,11-hexacarbonitrile (HAT-CN6), and the like can be given.

Note that an ink in which a monomer described above is mixed preferably includes one or both of a 3,3,3-trifluoropropyltrimethoxysilane compound and a phenyltrimethoxysilane compound because the wettability can be improved when deposited in a wet method.

As described above, a layer deposited by a wet film formation method with an ink including at least 2 monomers of an electron donor such as a secondary amine (or thiophene, or the like) and arylsulfonic acid is measured by ToF-SIMS, whereby a signal is observed at around m/z=80 in the result of a negative mode. At this time, a signal derived from an amine monomer is less likely to be observed. In the case where these analysis results are shown in the light-emitting device, the fact that the light-emitting device functions as a light-emitting device is an evidence that the layer has a sufficient hole-transport property. The fact that a skeleton having a hole-transport property is not observed though having a sufficient hole-transport property suggests that the monomers are bonded to each other to form a high molecular compound film. That is, it means that the layer is formed by a wet film formation method. The m/z=80 corresponds to a signal derived from an $SO_3$ anion in arylsulfonic acid.

Note that as the arylsulfonic acid compound, a sulfonic acid compound represented by Structural Formula (S-1) or (S-2) shown above is preferable because the sulfonic acid compound has many sulfo groups and a three-dimensional bonding with an amine can be formed, so that film quality is likely to be stable. With the layer formed by using an arylsulfonic acid compound, a signal at m/z=901 can be observed in a negative mode similarly in addition to the above signal of m/z=80. In addition, a signal at around m/z=328 can be observed as a product ion.

The light-emitting layer includes at least a light-emitting substance. The light-emitting layer may include another material such as a host material or an assist material as well. Alternatively, the light-emitting layer may be a stack of a plurality of layers with different compositions.

The light-emitting substance may be a fluorescent substance, a phosphorescent substance, a substance exhibiting thermally activated delayed fluorescence (TADF), or another light-emitting substance.

Examples of the material that can be used as a fluorescent substance in the light-emitting layer are as follows. Fluorescent substances other than those can also be used.

The examples of the material include 5,6-bis[4-(10-phenyl-9-anthryl)phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9)-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N'N'-triphenyl-1,4-phenylenediamine (abbreviation: 2DPAPPA), N,N,N',N',N",N",N'"N'"-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone, (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b:6,7-b']bisbenzofuran (abbreviation: 3,10PCA2Nbf(IV)-02), and 3,10-bis[N-(dibenzofuran-3-yl)-N-phenylamino]naphtho[2,3-b:6,7-b']bisbenzofuran (abbreviation: 3,10FrA2Nbf(IV)-02). In particular, a condensed aromatic diamine compound typified by a pyrenediamine compound such as 1,6FLPAPrn, 1,6mMemFLPAPrn, and 1,6BnfAPrn-03 is preferable because of its high hole-trapping property, high emission efficiency, and high reliability.

In the case where a phosphorescent substance is used as the light-emitting substance in the light-emitting layer, the following substances can be used, for example.

An organometallic iridium complex having a 4H-triazole skeleton, such as tris {2-[5-(2-methylphenyl)-4-(2,6-dimethylphenyl)-4H-1,2,4-triazol-3-yl-κ$N^2$]phenyl-κC}iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), or tris[4-(3-biphenyl)-5-isopropyl-3-phenyl-4H-1,2,4-triazolato]iridium(III) (abbreviation: $[Ir(iPrptz\text{-}3b)_3]$): an organometallic iridium complex having a skeleton, such as tris[3-methyl-1-(2-methylphenyl)-5-phenyl-1H-1,2,4-1H-triazole triazolato]iridium(III) (abbreviation: $[Ir(Mptz1\text{-}mp)_3]$) or tris(1-methyl-5-phenyl-3-propyl-1H-1,2,4-triazolato)iridium(III) (abbreviation: $[Ir(Prptz1\text{-}Me)_3]$): an organometallic iridium complex having an imidazole skeleton, such as fac-tris[1-(2,6-diisopropylphenyl)-2-phenyl-1H-imidazole]iridium(III) (abbreviation: $[Ir(iPrpmi)_3]$) or tris[3-(2,6-dimethylphenyl)-7-methylimidazo[1,2-f]phenanthridinato]iridium(III) (abbreviation: $[Ir(dmpimpt\text{-}Me)_3]$): and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis {2-[3',5'-bis(trifluoromethyl)phenyl]pyridinato-N,$C^{2'}$}iridium(III) picolinate (abbreviation: $[Ir(CF3ppy)_2(pic)]$), or bis[2-(4',6'-difluorophenyl)pyridinato-N,$C^{2'}$]iridium(III) acetylacetonate (abbreviation: Flracac) can be given. These compounds exhibit blue phosphorescence and have an emission peak in the wavelength range of 440 nm to 520 nm.

Moreover, an organometallic iridium complex having a pyrimidine skeleton, such as tris(4-methyl-6-phenylpyrimidinato)iridium(III) (abbreviation: $[Ir(mppm)_3]$), tris(4-tert-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (abbreviation: 35 (acetylacetonato)bis[6-(2-norbornyl)-4-phenylpyrimidinato]iridium(III) $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), or (acetylacetonato)bis(4,6-diphenylpyrimidinato)iridium(III) (abbreviation: $[Ir(dppm)_2(acac)]$), an organometallic iridium complex having a pyrazine skeleton, such as (acetylacetonato)bis(3,5-(abbreviation: $[Ir(mppr\text{-}Me)_2(acac)]$) or dimethyl-2-phenylpyrazinato)iridium(III) (acetylacetonato)bis(5-isopropyl-3-methyl-2-phenylpyrazinato)iridium(III) (abbreviation: $[Ir(mppr\text{-}iPr)_2(acac)]$), an organometallic iridium complex having a pyridine skeleton, such as tris(2-phenylpyridinato-N,$C^{2'}$)iridium(III) (abbreviation: $[Ir(ppy)_3]$), bis(2-phenylpyridinato-acetylacetonate (abbreviation: $[Ir(ppy)_2(acac)]$), N,$C^{2'}$)iridium(III) bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), or bis(2-phenylquinolinato-N,$C^{2'}$)iridium(III) acetylacetonate (abbreviation: $[Ir(pq)_2(acac)]$), and a rare earth metal complex such as tris(acetylacetonato) (monophenanthroline)terbium(III) (abbreviation: $[Tb(acac)_3(Phen)]$) can be given. These are mainly compounds that exhibit green phosphorescence and have an emission peak in the wavelength range of 500 nm to 600 nm. Note that an organometallic iridium complex having a pyrimidine skeleton is particularly preferable because of its distinctively high reliability and emission efficiency. Note that in the light-emitting device of one embodiment of the present invention, it is particularly preferable that the iridium complex represented by a structural formula shown below be used as a light-emitting material. The iridium complex below has an alkyl group, so that it can easily be dissolved in an organic solvent and make it easy to adjust a composition for application.

[Chemical formula 15]

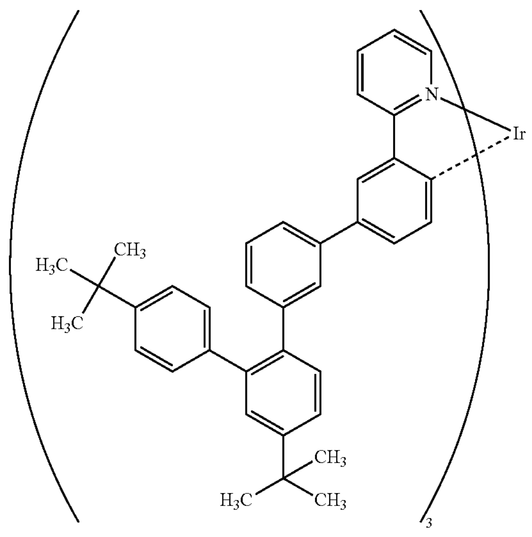

When the light-emitting layer including the iridium complex represented by the above structural formula is measured by ToF-SIMS, it has been found that a signal appears at m/z=1676, and m/z=1181 and m/z=685 each of which corresponds to a product ion, in the result of a positive mode.

Examples also include an organometallic iridium complex having a pyrimidine skeleton, as (diisobutyrylmethanato)bis[4,6-bis(3-methylphenyl)pyrimidinato]iridium(III) such (abbreviation: [Ir(5mdppm)$_2$(dibm)]), bis[4,6-bis(3-methylphenyl)pyrimidinato] (dipivaloylmethanato)iridium (III) (abbreviation: [Ir(5mdppm)$_2$(dpm)]), or bis[4,6-di (naphthalen-1-yl)pyrimidinato] (dipivaloylmethanato) iridium(III) (abbreviation: [Ir(d1npm)$_2$(dpm)]), an organometallic iridium complex having a pyrazine skeleton, such as (acetylacetonato)bis(2,3,5-triphenylpyrazinato) iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir (Fdpq)$_2$(acac)]), an organometallic iridium complex having a pyridine skeleton, such as tris(1-phenylisoquinolinato-N, C2')iridium(III) (abbreviation: [Ir(piq)$_3$]) or bis(1-phenylisoquinolinato-N,C$^{2'}$)iridium(III) acetylacetonate (abbreviation: [Ir(piq)$_2$(acac)]), a platinum complex such as 2,3,7,8,12,13,17,18-octaethyl-21H,23H-porphyrin platinum(II) (abbreviation: PtOEP), and a rare earth metal complex such as tris(1,3-diphenyl-1,3-propanedionato)(monophenanthroline)europium(III) (abbreviation: [Eu(DBM)$_3$(Phen)]) or tris [1-(2-thenoyl)-3,3,3-trifluoroacetonato] (monophenanthroline)europium(III) (abbreviation: [Eu(TTA);(Phen)]). These compounds exhibit red phosphorescence and have an emission peak in the wavelength range of 600 nm to 700 nm. Furthermore, from the organometallic iridium complex having a pyrazine skeleton, red light emission with favorable chromaticity can be obtained.

Besides the above phosphorescent compounds, a known phosphorescent compound may be selected and used.

As a TADF material, a fullerene, a derivative thereof, an acridine, a derivative thereof, an eosin derivative, or the like can be used. Other examples include a metal-containing porphyrin containing magnesium (Mg), zinc (Zn), cadmium (Cd), tin (Sn), platinum (Pt), indium (In), palladium (Pd), or the like. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP), which are represented by the following structural formulas.

[Chemical formula 16]

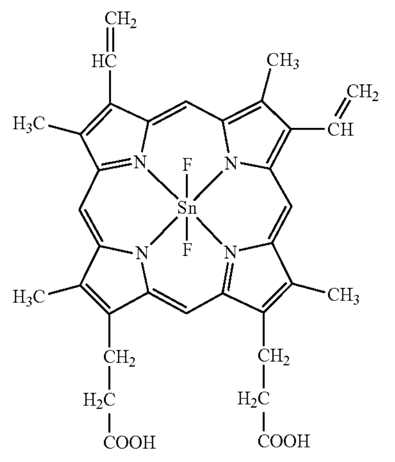

$SnF_2$(Proto IX)

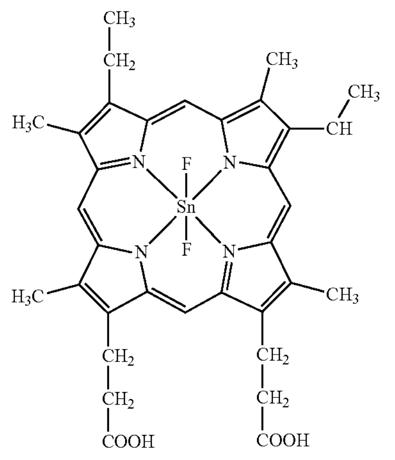

$SnF_2$(Meso IX)

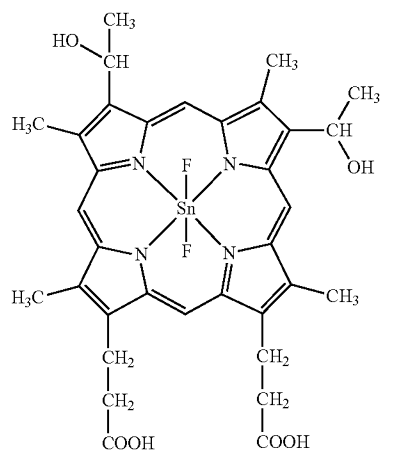

$SnF_2$(Hemato IX)

-continued

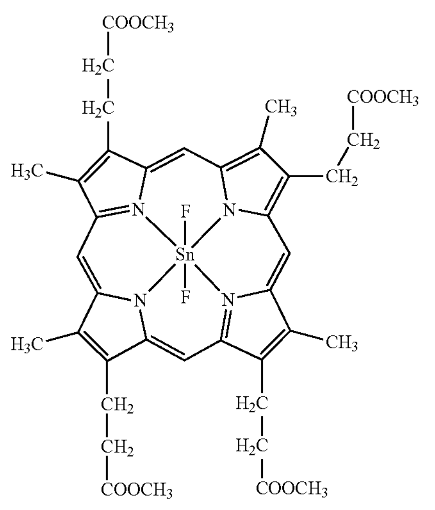

$SnF_2$(Copro III-4Me)

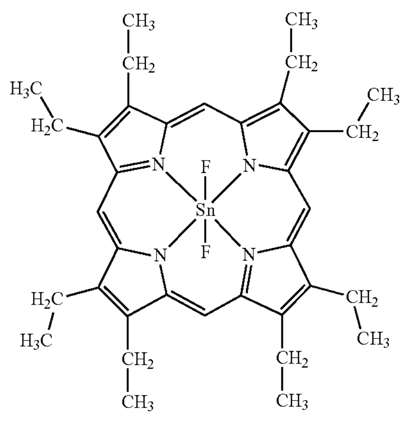

$SnF_2$(OEP)

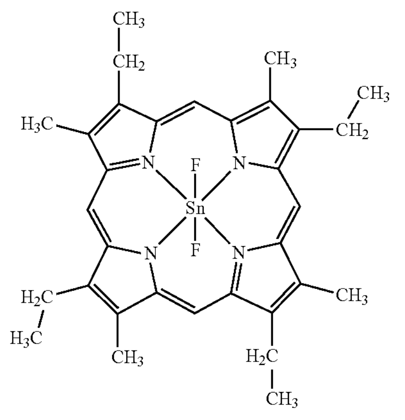

$SnF_2$(Etio I)

-continued

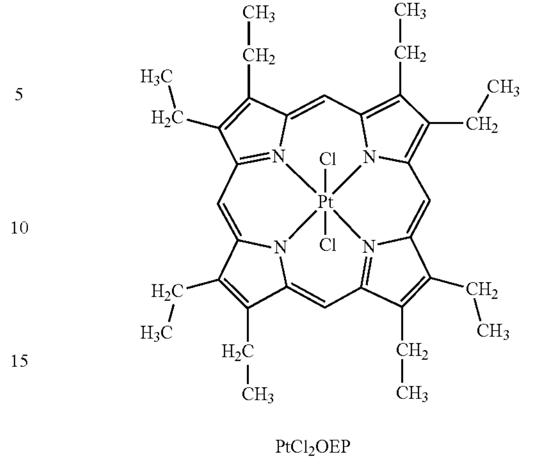

$PtCl_2OEP$

Alternatively, a heterocyclic compound having one or both of a π-electron rich heteroaromatic ring and a π-electron deficient heteroaromatic ring that is represented by any of the following structural formulas, such as 2-(biphenyl-4-yl)-4,6-bis(12-phenylindolo[2,3-α]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA), can be used. Such a heterocyclic compound is preferable because of having excellent electron-transport property and hole-transport property owing to a π-electron rich heteroaromatic ring and a π-electron deficient heteroaromatic ring. Among skeletons having a π-electron deficient heteroaromatic ring, a pyridine skeleton, a diazine skeleton (a pyrimidine skeleton, a pyrazine skeleton, and a pyridazine skeleton), and a triazine skeleton are particularly preferable because of their stability and favorable reliability. In particular, a benzofuropyrimidine skeleton, a benzothienopyrimidine skeleton, a benzofuropyrazine skeleton, and a benzothienopyrazine skeleton are preferable because of their high acceptor property and favorable reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the electron-donating property of the π-electron rich heteroaromatic ring and the electron-acceptor property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical formula 17]

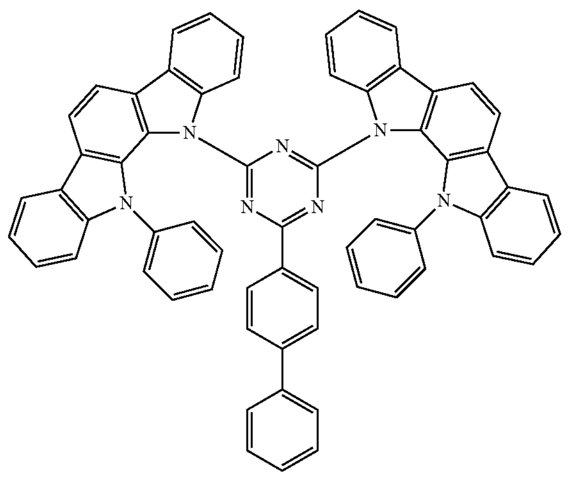

PIC-TRZ

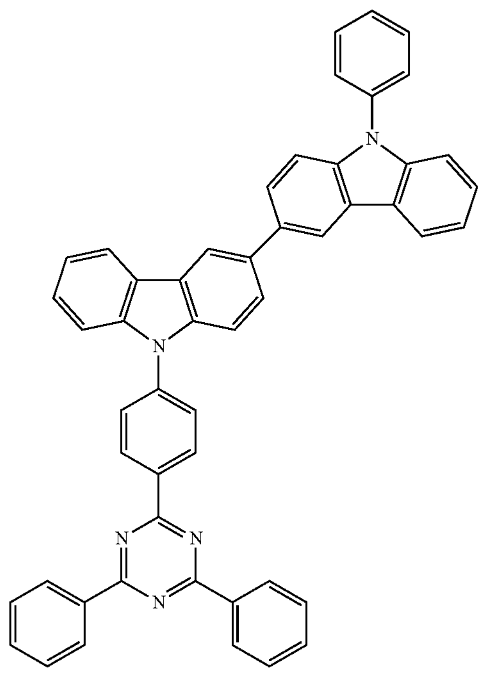

PCCzPTzn

-continued

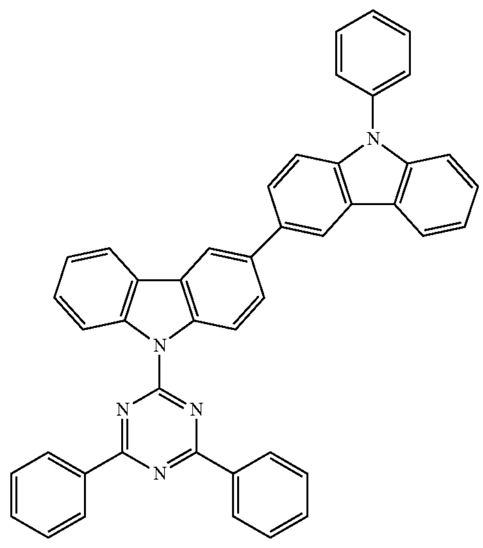

PCCzTzn

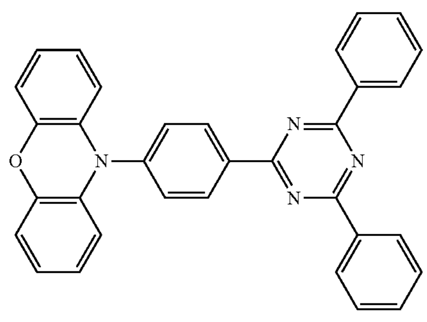

PXZ-TRZ

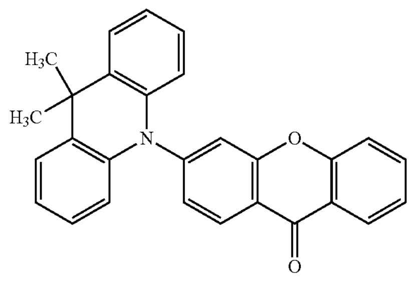

ACRXTN

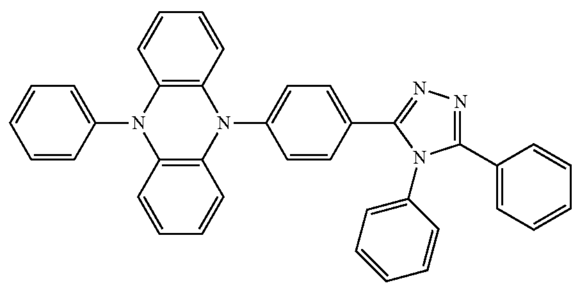

PPZ-3TPT

-continued

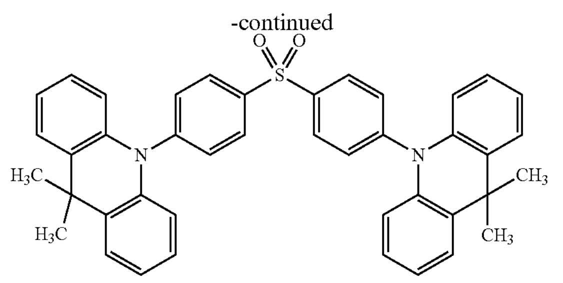

DMAC-DPS

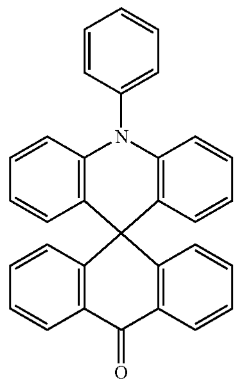

ACRSA

Note that the TADF material is a material that has a small difference between the S1 level and the T1 level and has a function of converting triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

As the host material in the light-emitting layer, various carrier-transport materials such as a material having an electron-transport property, a material having a hole-transport property, and the TADF material can be used.

The material having a hole-transport property preferably has a hole mobility higher than or equal to $1\times10^{6}$ $cm^2/Vs$. The material having a hole-transport property is particularly preferably an organic compound having an amine skeleton or a π-electron rich heteroaromatic ring skeleton, examples of which include a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBAIBP), 4,4'-diphenyl-4"-(9-phenyl-9H-carbazol-3-yl)triphenylamine (abbreviation: PCBBiIBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF): a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: C/TP), or 3,3'-bis(9-phenyl-9H-carbazole) (abbreviation: PCCP): a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II), Among the above materials, the compound having an aromatic amine skeleton and the compound having a carbazole skeleton are preferable because these compounds are highly reliable and have high hole-transport properties to contribute to a reduction in driving voltage, In addition, N-(4-biphenyl)-6, N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBIBBITP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBABβBi), 4,4'-diphenyl-4"-(6:1'-binaphthyl-2-yl)triphenylamine (abbreviation: BBAaNβNB), 4,4'-diphenyl-4"-(7:1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6:2'-binaphthyl-2-yl)triphenylamine (abbreviation: BBA(βN2)B), 4,4'-diphenyl-4"-(7:2'-binaphthyl-2-yl)triphenylamine (abbreviation: BBA(βN2)B-03), 4,4'-diphenyl-4"-(4:2'-binaphthyl-1-yl)triphenylamine (abbreviation: BBAβNαNB), 4,4'-diphenyl-4"-(5:2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiABNB), 4-(3-biphenylyl)-4'-[4-(2-naphthyl)phenyl]-4"-phenyltriphenylamine (abbreviation: mTPBiABNBi), 4-(4-biphenylyl)-4'-[4-(2-naphthyl)phenyl]-4"-phenyltriphenylamine (abbreviation: TPBiABNBi), 4-phenyl-4'-(1-naphthyl)triphenylamine (abbreviation: aNBAIBP), 4,4'-bis(1-naphthyl)triphenylamine (abbreviation: αNBBIBP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBilBP-02), 4-diphenyl-4'-(2-naphthyl)-4"-{9-(4-biphenylyl)carbazole)}triphenylamine (abbreviation: YGTBiBNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9)-phenylfluoren-9)-yl)triphenylamine (abbreviation: mBPAFLP), 4-phenyl-4'-[4-(9-phenylfluoren-9-yl)phenyl]triphenylamine (abbreviation: $BPAFLB_1$), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)- N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, N,N-bis(9,9-dimethyl-9H-fluoren-2-yl)-9,9'-spirobi-9H-fluoren-1-amine, or the like can also be suitably used, As the material having an electron-transport property, for example, a metal complex such as bis(10-hydroxy benzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ), or an organic compound having a π-electron deficient heteroaromatic ring skeleton is preferable. Examples of the organic compound having a π-electron deficient heteroaromatic ring skeleton include a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBT-BIm-II): a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II): a heterocyclic compound having a pyridine skeleton, such as 3,5-bis[3-(9H-carbazol-9-yl)phenyl]pyridine (abbreviation: 35DC/PPy) or 1,3,5-tri[3-(3-pyridyl)phenyl]benzene (abbreviation: TmPyPB): and a heterocyclic compound having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPT/n), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPT/n), or 2-{3-[3-(benzo[b]naphtho[1,2-d]furan-6-yl)phenyl]phenyl}-4,6-diphenyl-1,3,5-triazine (abbreviation: mBnfBPTzn-02). Among the above materials, the heterocyclic compound having a diazine skeleton, the heterocyclic compound having a pyridine skeleton, and the heterocyclic compound having a triazine skeleton have high reliability and thus are preferable. In particular, the heterocyclic compound having a diazine (pyrimidine or pyrazine) skeleton and the heterocyclic compound having a triazine skeleton have a high electron-transport property to contribute to a reduction in driving voltage.

As the TADF material that can be used as the host material, the above-mentioned materials given as TADF materials can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. At this time, the TADF material functions as an energy donor, and the light-emitting substance functions as an energy acceptor.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups.

The substituent having no π bond has a poor carrier-transport property: thus, the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

In the case where a fluorescent substance is used as the light-emitting substance, a material having an anthracene skeleton is suitable for the host material. The use of a substance having an anthracene skeleton as a host material for a fluorescent substance makes it possible to achieve a light-emitting layer with a favorable emission efficiency and durability. As the substance having an anthracene skeleton that is used as the host material, a substance having a diphenylanthracene skeleton, in particular, a substance having a 9,10-diphenylanthracene skeleton, is preferable because of its chemical stability. The host material preferably has a carbazole skeleton, in which case the hole-injection and hole-transport properties are improved: further preferably, the host material has a benzocarbazole skeleton in which a benzene ring is further condensed to carbazole, in which case the HOMO level thereof is shallower than that of carbazole by approximately 0.1 eV and thus holes enter the host material easily. In particular, the host material having a dibenzocarbazole skeleton is preferable because its HOMO level is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9)-anthryl)phenyl]-9H-carbazole (abbreviation: PC2PA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBC/PA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). In particular. CzPA, cgDBC/PA2mBnfPPA, and PC/PA exhibit excellent properties and thus are preferably selected.

Note that a host material may be a material of a mixture of a plurality of kinds of substances: in the case of using a mixed host material, it is preferable to mix a material having an electron-transport property with a material having a hole-transport property. When the material having an electron-transport property is mixed with the material having a hole-transport property, the transport property of the light-emitting layer can be easily adjusted and a recombination region can be easily controlled. The weight ratio between the content of the material having a hole-transport property and the content of the material having an electron-transport property may be as follows: the material having a hole-transport property:the material having an electron-transport property=1:19 to 19:1. Note that the carrier-transport material that is included in a smaller amount may be referred to as an assist material.

Note that a phosphorescent substance can be used as part of the mixed material. When a fluorescent substance is used as the light-emitting substance, the phosphorescent substance can be used as an energy donor for supplying excitation energy to the fluorescent substance.

An exciplex may be formed by these mixed materials. A combination is preferably selected so as to form an exciplex that exhibits light emission overlapping with the wavelength of a lowest-energy-side absorption band of a light-emitting substance, in which case energy can be transferred smoothly and light emission can be efficiently obtained. The use of the structure is preferable because the driving voltage is also reduced.

Note that at least one of the materials forming an exciplex may be a phosphorescent substance. In this case, triplet excitation energy can be efficiently converted into singlet excitation energy by reverse intersystem crossing.

A combination of a material having an electron-transport property and a material having a hole-transport property whose HOMO level is higher than or equal to the HOMO level of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by a cyclic voltammetry (CV) measurement.

The formation of an exciplex can be confirmed by a phenomenon in which the emission spectrum of the mixed film in which the material having a hole-transport property and the material having an electron-transport property are mixed is shifted to a longer wavelength than the emission spectrum of each of the materials (or has another peak on the longer wavelength side) observed in comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as a phenomenon in which the transient photoluminescence (PL) lifetime of the mixed film has a longer lifetime component or has a larger proportion of delayed component than that of each of the materials, observed in comparison of transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed in comparison of the transient EL of the material having a hole-transport property, the transient EL of the material having an electron-transport property, and the transient EL of the mixed film of these materials.

Note that the electron-transport layer having this structure also serves as the electron-injection layer in some cases.

Preferably, in the case where the electron-transport layer includes an alkali metal or a metal complex of an alkali metal, there is a difference in the concentration (including 0) of the alkali metal or the metal complex of the alkali metal in the thickness direction.

A layer including an alkali metal, an alkaline earth metal, a compound thereof, or a complex thereof such as lithium fluoride (LiF), cesium fluoride (CsF), calcium fluoride ($CaF_2$), or 8-hydroxy quinolinato-lithium (abbreviation: Liq) may be provided as the electron-injection layer between the electron-transport layer and the negative electrode. An electride in which an alkali metal, an alkaline earth metal, or a compound thereof is included in a layer that is formed using a substance having an electron-transport property can be used as the electron-injection layer. Examples of the electride include a substance in which electrons are added at high concentration to a mixed oxide of calcium and aluminum.

Sodium fluoride is preferably used to improve the electron-transport property and water resistance of the light-emitting device. When an electron-injection layer of a light-emitting device including sodium fluoride in the electron-injection layer is analyzed by ToF-SIMS, signals are observed which are attributed to anions or cations such as $Na_2F^+$, $NaF_2^-$, and $Na_2F_3^-$ being different in the number of bonds between sodium and fluorine.

Furthermore, a layer including an alkaline earth metal such as barium may be provided in contact with the negative electrode. This structure is preferably employed to make the property of electron injection from the negative electrode favorable.

The above layer including barium may also include a heteroaromatic compound. As the heteroaromatic compound, an organic compound having a phenanthroline skeleton is preferable and 2-phenyl-9-[3-(9-phenyl-1,10-phenanthrolin-2-yl)phenyl]-1,10-phenanthroline, which is represented by a structural formula shown below, or the like is particularly preferable.

[Chemical formula 18]

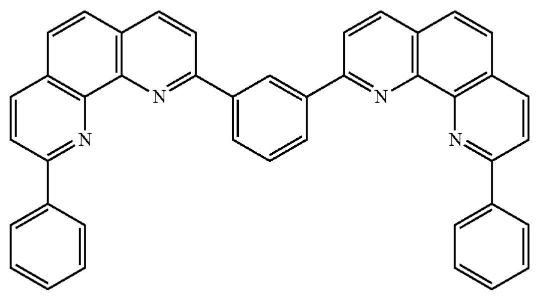

When a layer including 2-phenyl-9-[3-(9-phenyl-1,10-phenanthrolin-2-yl)phenyl]-1,10-phenanthroline is analyzed by ToF-SIMS, a signal is observed at m/z=587 in both a positive mode and a negative mode. In the case where a film of the same material is formed and the same layer or a layer in contact with the layer includes an alkali metal, an alkaline earth metal, or a compound thereof, an ion of an alkali metal complex (e.g., m/z=609 in the case of a Na complex), an alkaline earth metal complex (e.g., m/z=724 in the case of a Ba complex), or the like is sometimes detected.

Note that as the electron-injection layer, it is possible to use a layer that includes a substance having an electron-transport property (preferably an organic compound having a bipyridine skeleton) and further includes a fluoride of the alkali metal or the alkaline earth metal at a concentration higher than or equal to that at which the electron-injection layer becomes in a microcrystalline state (50 wt % or higher). Since the layer has a low refractive index, a light-emitting device having more favorable external quantum efficiency can be provided.

Instead of the electron-injection layer, a charge-generation layer may be provided. The charge-generation layer refers to a layer capable of injecting holes into a layer in contact with the negative electrode side of the charge-generation layer and electrons into a layer in contact with the positive electrode side thereof when a potential is applied. The charge-generation layer includes at least a P-type layer. The P-type layer is preferably formed using any of the composite materials given above as the material that can form the hole-injection layer. The P-type layer may be formed by stacking a film including the above acceptor material as a material included in the composite material and a film including the above hole-transport material. When a potential is applied to the P-type layer, electrons are injected into the electron-transport layer and holes are injected into the negative electrode which is a negative electrode; thus, the light-emitting device operates.

Note that one or both of an electron-relay layer and an electron-injection buffer layer are preferably provided in the charge-generation layer in addition to the P-type layer. The electron-injection buffer layer and the electron-relay layer are provided closer to the positive electrode than the P-type layer is, and the electron-relay layer is provided between the electron-injection buffer layer and the P-type layer.

The electron-relay layer includes at least a substance having an electron-transport property and has a function of preventing an interaction between the electron-injection buffer layer and the P-type layer to smoothly transfer electrons. The LUMO level of the substance having an electron-transport property included in the electron-relay layer is preferably between the LUMO level of an acceptor substance in the P-type layer and the LUMO level of a substance included in a layer of the electron-transport layer in contact with the charge-generation layer. A specific energy level of the LUMO level of the substance having an electron-transport property used for the electron-relay layer is preferably higher than or equal to −5.0 eV, further preferably higher than or equal to −5.0 eV and lower than or equal to −3.0 eV. Note that as the substance having an electron-transport property used for the electron-relay layer, a phthalocyanine-based material or a metal complex having a metal-oxygen bond and an aromatic ligand is preferably used.

For the electron-injection buffer layer, a substance having a high electron-injection property, such as an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

In the case where the electron-injection buffer layer is formed so as to include the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)). As the substance having an electron-transport property, it is possible to use a material similar to the above-listed materials having an electron-transport property which can be used as a host material.

The charge-generation layer can be used as the intermediate layer, and with the use of the intermediate layer, the light-emitting device having a tandem structure and with high current efficiency can be provided.

As a substance of the negative electrode, any of metals, alloys, and electrically conductive compounds with a low work function (specifically, lower than or equal to 3.8 eV), mixtures thereof, and the like can be used. As specific examples of such a negative electrode material, elements belonging to Group 1 or Group 2 of the periodic table, including magnesium (Mg), calcium (Ca), and strontium (Sr), and alkali metals such as lithium (Li) and cesium (Cs), alloys containing these (MgAg and AlLi), rare earth metals such as europium (Eu) and ytterbium (Yb), alloys containing these rare earth metals, and the like can be given. However, when the electron-injection layer is provided between the negative electrode and the electron-transport layer, any of a variety of conductive materials such as Al, Ag, ITO, or indium oxide-tin oxide containing silicon or silicon oxide can be used for the negative electrode regardless of the work function.

In the case where the negative electrode is formed using a material having a visible-light-transmitting property, the light-emitting device can emit light from the negative electrode side. In the case where the positive electrode is formed on the substrate side, the light-emitting device including such a negative electrode can be what is called a top-emission light-emitting device.

Different deposition methods may be used to form the electrodes or the layers described above.

The structure of the layers provided between the positive electrode and the negative electrode is not limited to the above-described structure. However, a light-emitting region where holes and electrons recombine is preferably positioned away from the positive electrode and the negative electrode so as to inhibit quenching due to the proximity of the light-emitting region and a metal used for electrodes or carrier-injection layers.

Furthermore, in order that transfer of energy from an exciton generated in the light-emitting layer can be inhibited, preferably, the hole-transport layer or the electron-transport layer, which is in contact with the light-emitting layer, particularly a carrier-transport layer closer to the recombination region in the light-emitting layer, is preferably formed using a substance having a wider band gap than the light-emitting material of the light-emitting layer or the light-emitting material included in the light-emitting layer.

At least part of the structure examples, the drawings corresponding thereto, and the like described in this embodiment as an example can be combined with any of the other structure examples, the other drawings, and the like as appropriate.

At least part of this embodiment can be appropriately implemented in combination with any of the other embodiments described in this specification.

Embodiment 3

Figure 9:
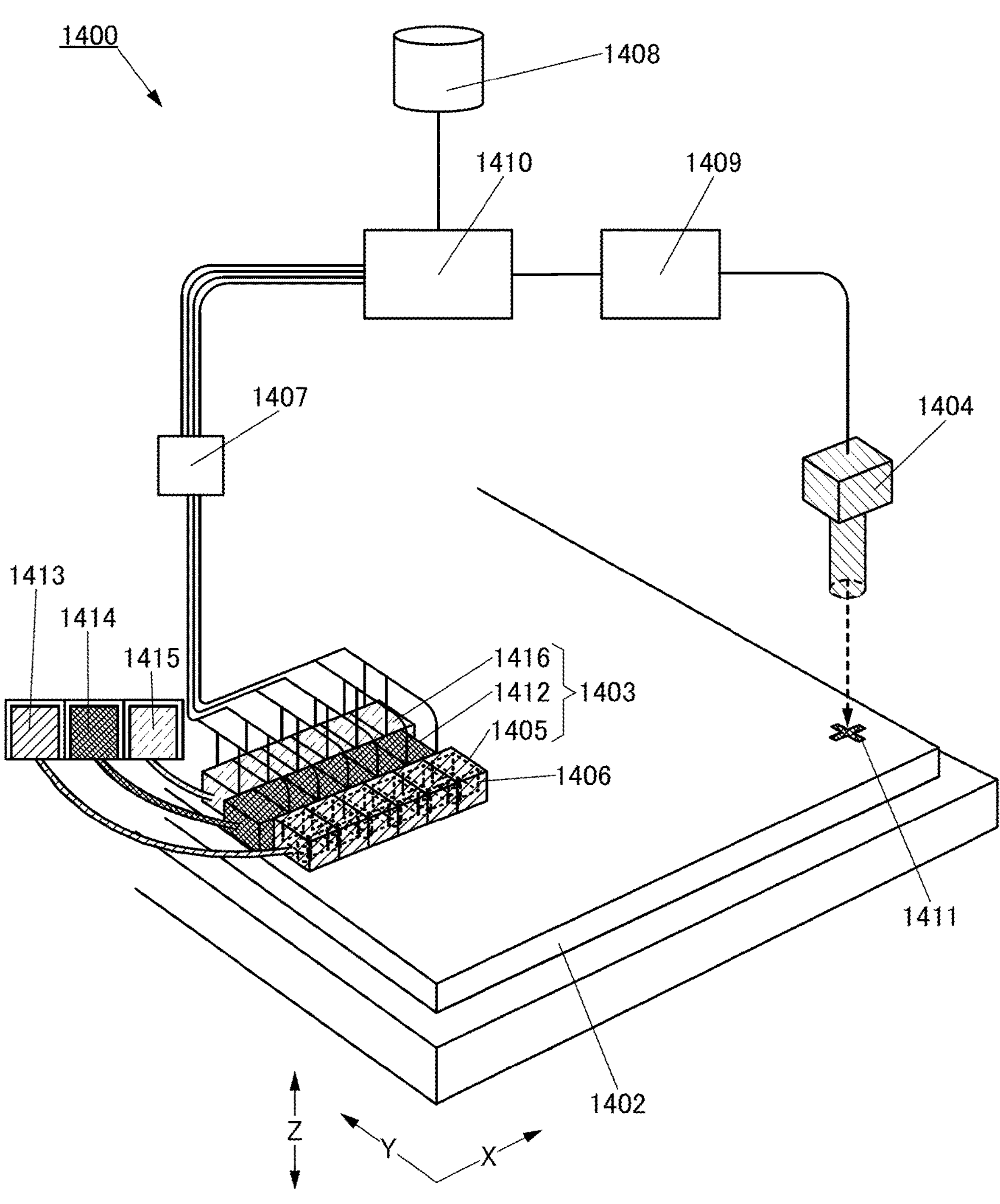
FIG. 9 is a conceptual diagram illustrating a droplet-discharge apparatus.

Next, a droplet-discharge apparatus used for the droplet-discharge method will be described with reference to FIG. 9. FIG. 9 is a conceptual diagram illustrating a droplet-discharge apparatus 1400.

The droplet-discharge apparatus 1400 includes a droplet-discharge means 1403. The droplet-discharge means 1403 further includes a head 1405, a head 1412, and a head 1416.

The head 1405, the head 1412, and the head 1416 are connected to a control means 1407 that is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an image-capturing means 1404 and converted into a digital signal by an image processing means 1409. The computer 1410 recognizes the digital signal, generates a control signal, and transmits the control signal to the control means 1407.

An image sensor or the like utilizing a charge coupled device (CCD) or a complementary metal-oxide-semiconductor (CMOS) can be used as the image-capturing means 1404. Note that information on a pattern to be formed on the substrate 1402 is stored in a storage medium 1408, and a control signal is transmitted to the control means 1407 on the basis of the information, so that the head 1405, the head 1412, and the head 1416 of the droplet-discharge means 1403 can be individually controlled. Materials to be discharged are supplied to the head 1405, the head 1412, and the head 1416 from a material supply source 1413, a material supply source 1414, and a material supply source 1415, respectively, through pipes.

Inside the head 1405, the head 1412, and the head 1416, a space indicated by a dotted line 1406 to be filled with a liquid material and a nozzle serving as a discharge outlet are provided. Although not illustrated, the inside structure of the head 1412 is similar to that of the head 1405. When the nozzle sizes of the head 1405 and the head 1412 are different from each other, different materials with different widths can be discharged simultaneously. Each head can discharge a plurality of kinds of light-emitting materials or the like to draw a pattern. In the case of drawing a pattern over a large area, the same material can be simultaneously discharged from a plurality of nozzles in order to improve throughput. When a large substrate is used, the head 1405, the head 1412, and the head 1416 can freely scan the substrate in the directions of arrows X, Y, and Z in FIG. 9, a region in which a pattern is drawn can be freely set, and the same patterns can be drawn on one substrate.

Furthermore, the step of discharging the composition may be performed under reduced pressure. The substrate may be heated at the time of discharging. The discharge of the composition is followed by one or both of a drying step and a baking step. Both the drying and baking steps are heat treatments but different in purpose, temperature, and time. The drying step and the baking step are performed by laser light irradiation, rapid thermal annealing, heating in a heating furnace, or the like under normal pressure or reduced pressure in the air or an inert atmosphere such as nitrogen. Note that there is no particular limitation on the timing of the heat treatment and the number of times of the heat treatment. The temperature for adequately performing the drying and baking steps depends on the material of the substrate and the properties of the composition.

In the above-described manner, the EL layer can be formed with the droplet-discharge apparatus.

Note that the above-described structure can be combined with another embodiment or another structure in this embodiment as appropriate.

Embodiment 4

[Pixel Circuit]

Next, a structural example of a pixel circuit and an example of a driving method thereof, which are applicable to the display apparatus of one embodiment of the present invention, will be described below.

[Structure Example of Pixel Circuit]

Figure 10A:
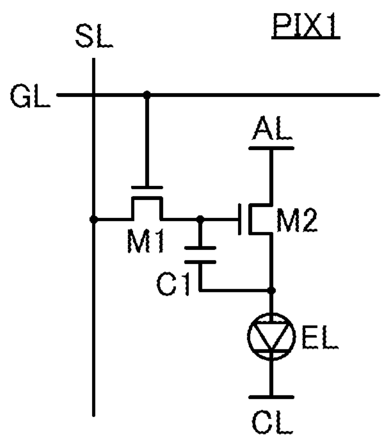
FIG. 10A to FIG. 10D are each a circuit diagram of a light-emitting apparatus.

A pixel circuit PIX1 illustrated in FIG. 10A includes a transistor M1, a transistor M2, a capacitor C1, and a light-emitting device EL. A wiring SL, a wiring GL, a wiring AL, and a wiring CL are electrically connected to the pixel circuit PIX1.

A gate of the transistor M1 is electrically connected to the wiring GL, one of a source and a drain of the transistor M1 is electrically connected to the wiring SL, and the other of the source and the drain of the transistor M1 is electrically connected to a gate of the transistor M2 and one electrode of the capacitor C1. One of a source and a drain of the transistor M2 is electrically connected to the wiring AL and the other of the source and the drain of the transistor M2 is electrically connected to an anode of the light-emitting device EL. The other electrode of the capacitor C1 is electrically connected to the anode of the light-emitting device EL. A cathode of the light-emitting device EL is electrically connected to the wiring CL.

The transistor M1 can be referred to as a selection transistor and functions as a switch for controlling selection/non-selection of the pixel. The transistor M2 can be referred to as a driver transistor and has a function of controlling a current flowing to the light-emitting device EL. The capacitor C1 functions as a storage capacitor and has a function of retaining a gate potential of the transistor M2. A capacitor such as a MIM capacitor may be used as the capacitor C1; alternatively, capacitance between wirings, a gate capacitance of the transistor, or the like may be used as the capacitor C1.

The wiring SL is supplied with a source signal. The wiring SL can be formed using the same conductive layer as the conductive layer functioning as a source or a drain of a transistor. The wiring GL is supplied with a gate signal. The wiring GL can be formed using the same conductive layer as the conductive layer functioning as a gate of a transistor. The wiring AL and the wiring CL are each supplied with a constant potential. The wiring AL and the wiring CL can each be formed using the conductive layer functioning as a source or a drain, the conductive layer functioning as a gate, or the conductive layer functioning as a source or a drain and the conductive layer functioning as a gate. The wiring AL and the wiring CL can each be formed using the same conductive layer as the conductive layer functioning as a source or a drain or the same conductive layer as the conductive layer functioning as a gate.

Figure 10B:
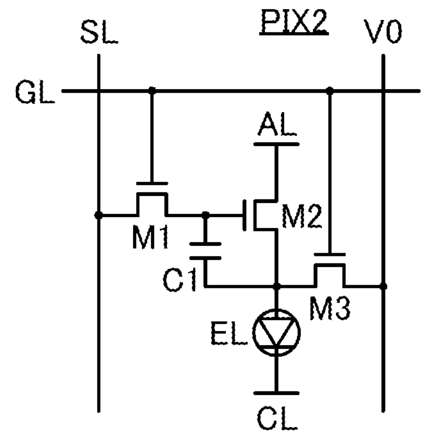

The anode side of the light-emitting device EL can be set to a high potential and the cathode side is set to a lower potential than the anode side, and the anode can correspond to a positive electrode and the cathode can correspond to a negative electrode. The pixel circuit PIX2 illustrated in FIG. 10B has a structure in which a transistor M3 is added to the pixel circuit PIX1. In addition, a wiring V0 is electrically connected to the pixel circuit PIX2.

A gate of the transistor M3 is electrically connected to the wiring GL, one of a source and a drain of the transistor M3 is electrically connected to the anode of the light-emitting device EL, and the other of the source and the drain of the transistor M3 is electrically connected to the wiring V0.

The wiring V0 is supplied with a constant potential when data is written to the pixel circuit PIX2. Thus, a variation in the gate-source voltage of the transistor M2 can be inhibited.

Figure 10C:
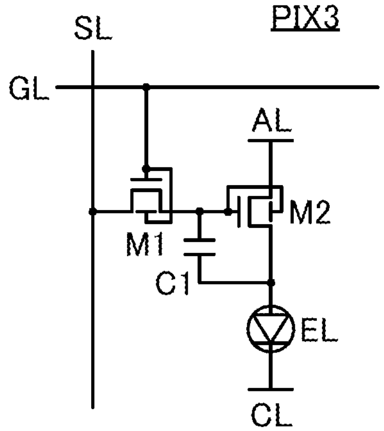
Figure 10D:
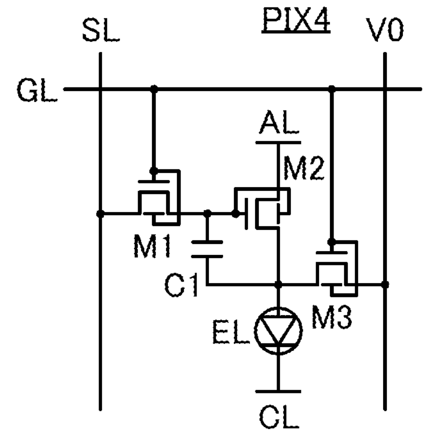

A pixel circuit PIX3 illustrated in FIG. 10C is an example in the case where transistors having a pair of gates electrically connected to each other are used as the transistor M1 and the transistor M2 of the pixel circuit PIX1. A pixel circuit PIX4 illustrated in FIG. 10D is an example in the case where transistors having a pair of gates electrically connected to each other are used in the pixel circuit PIX2. Thus, the current that can flow through the transistors can be increased. Note that transistors having a pair of gates electrically connected to each other are used as all the transistors in this example, but one embodiment of the present invention is not limited thereto. A transistor that includes a pair of gates electrically connected to different wirings may be used. When, for example, a transistor in which one of gates is electrically connected to a source is used, the reliability can be increased.

A pixel circuit PIX5 illustrated in FIG. 11A has a structure in which a transistor M4 is added to the pixel circuit PIX2. Three wirings (wirings GL1, GL2, and GL3) functioning as gate lines are electrically connected to the pixel circuit PIX5.

A gate of the transistor M4 is electrically connected to the wiring GL3, one of a source and a drain of the transistor M4 is electrically connected to the gate of the transistor M2, and the other of the source and the drain of the transistor M4 is electrically connected to the wiring V0. The gate of the transistor M1 is electrically connected to the wiring GL1, and the gate of the transistor M3 is electrically connected to the wiring GL2. The wiring V0 can be formed using the same conductive layer as the conductive layer functioning as the source or the drain, the same conductive layer as the conductive layer functioning as the gate, or the both conductive layers. The wiring V0 may be arranged to intersect with the wiring AL.

When the transistor M3 and the transistor M4 are turned on at the same time, the source and the gate of the transistor M2 have the same potential, so that the transistor M2 can be turned off. Thus, a current flowing to the light-emitting device EL can be blocked forcibly. Such a pixel circuit is suitable for the case of using a display method in which a display period and a non-lighting period are alternately provided.

A pixel circuit PIX6 illustrated in FIG. 11B is an example in the case where a capacitor C2 is added to the pixel circuit PIX5. The capacitor C2 functions as a storage capacitor.

A pixel circuit PIX7 illustrated in FIG. 11C and a pixel circuit PIX8 illustrated in FIG. 11D are each an example in the case where a transistor including a pair of gates is used in the pixel circuit PIX5 or the pixel circuit PIX6. A transistor in which a pair of gates are electrically connected to each other is used as each of the transistors M1, M3, and M4, and a transistor in which one of gates is electrically connected to a source is used as the transistor M2.

[Driving Method Example]

An example of a method for driving a display apparatus in which the pixel circuit PIX5 is used will be described below. Note that a similar driving method can be applied to the pixel circuits PIX6, PIX7, and PIX8.

Figure 12:
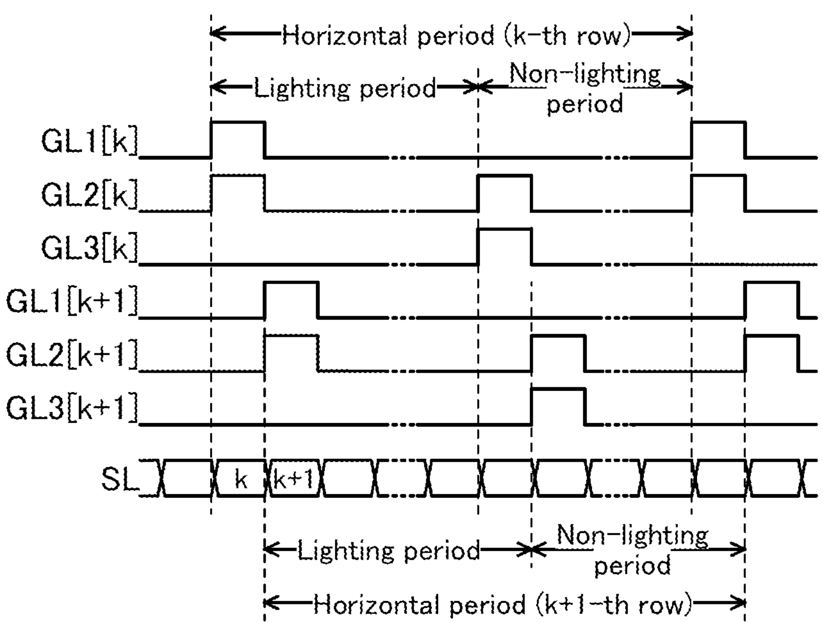
FIG. 12 is a timing chart of a light-emitting apparatus.

FIG. 12 shows a timing chart of a method for driving the display apparatus in which the pixel circuit PIX5 is used. Changes in the potentials of wirings GL1[*k*], GL2[*k*], and GL3[*k*] that are gate lines of the k-th row and changes in the potentials of wirings GL1[*k*+1], GL2[*k*+1], and GL3[*k*+1] that are gate lines of the k+1-th row are shown here. FIG. 12 also shows the timing of supplying a signal to the wiring SL functioning as a source line.

In the example of the driving method described here, one horizontal period is divided into a lighting period and a non-lighting period. A horizontal period of the k-th row is shifted from a horizontal period of the k+1-th row by a selection period of the gate line.

In the lighting period of the k-th row, first, the wirings GL1[*k*] and GL2[*k*] are supplied with a high-level potential and the wiring SL is supplied with a source signal. Thus, the transistor M1 and the transistor M3 are turned on, so that a potential corresponding to the source signal is written from the wiring SL to the gate of the transistor M2. After that, the wirings GL1[*k*] and GL2[*k*] are supplied with a low-level potential, so that the transistor M1 and the transistor M3 are turned off and the gate potential of the transistor M2 is retained.

Subsequently, in a lighting period of the k+1-th row, data is written by operation similar to that described above.

Next, the non-lighting period is described. In the non-lighting period of the k-th row, the wirings GL2[*k*] and GL3[*k*] are supplied with a high-level potential. Accordingly, the transistor M3 and the transistor M4 are turned on, and the source and the gate of the transistor M2 are supplied with the same potential, so that almost no current flows through the transistor M2. Therefore, the light-emitting device EL is turned off. As a result, all the subpixels that are positioned in the k-th row are turned off. The subpixels of the k-th row remain in the off state until the next lighting period.

Subsequently, in a non-lighting period of the k+1-th row, all the subpixels of the k+1-th row are turned off in a manner similar to that described above.

Such a driving method described above, in which the subpixels are not constantly on through one horizontal period and a non-lighting period is provided in one horizontal period, can be called duty driving. With duty driving, an afterimage phenomenon can be inhibited at the time of displaying moving images: therefore, a display apparatus with high performance in displaying moving images can be achieved. Particularly in a VR device and the like, a reduction in an afterimage can reduce what is called VR sickness.

In the duty driving, the proportion of the lighting period in one horizontal period can be called a duty cycle. For example, a duty cycle of 50% means that the lighting period and the non-lighting period have the same lengths. Note that the duty cycle can be set freely and can be adjusted appropriately within a range higher than 0% and lower than or equal to 100%, for example.

Embodiment 5

In this embodiment, electronic devices of one embodiment of the present invention are described with reference to FIG. 13 to FIG. 16.

An electronic device in this embodiment includes the display apparatus of one embodiment of the present invention. For the display apparatus of one embodiment of the present invention, increases in resolution, definition, and sizes are easily achieved. Thus, the display apparatus of one embodiment of the present invention can be used for display portions of a variety of electronic devices.

The display apparatus of one embodiment of the present invention can be manufactured at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine: a camera such as a digital camera or a digital video camera: a digital photo frame: a mobile phone: a portable game console: a portable information terminal: and an audio reproducing device.

In particular, a display apparatus of one embodiment of the present invention can have a high resolution, and thus can be favorably used for an electronic device having a relatively small display portion. As such an electronic device, a watch-type or bracelet-type information terminal device (wearable device); and a wearable device worn on a head, e.g., a device for VR such as a head mounted display and a glasses-type device for AR can be given, for example. Examples of wearable devices include a device for SR and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display apparatus with high definition and high resolution, the electronic device can provide higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 13A:
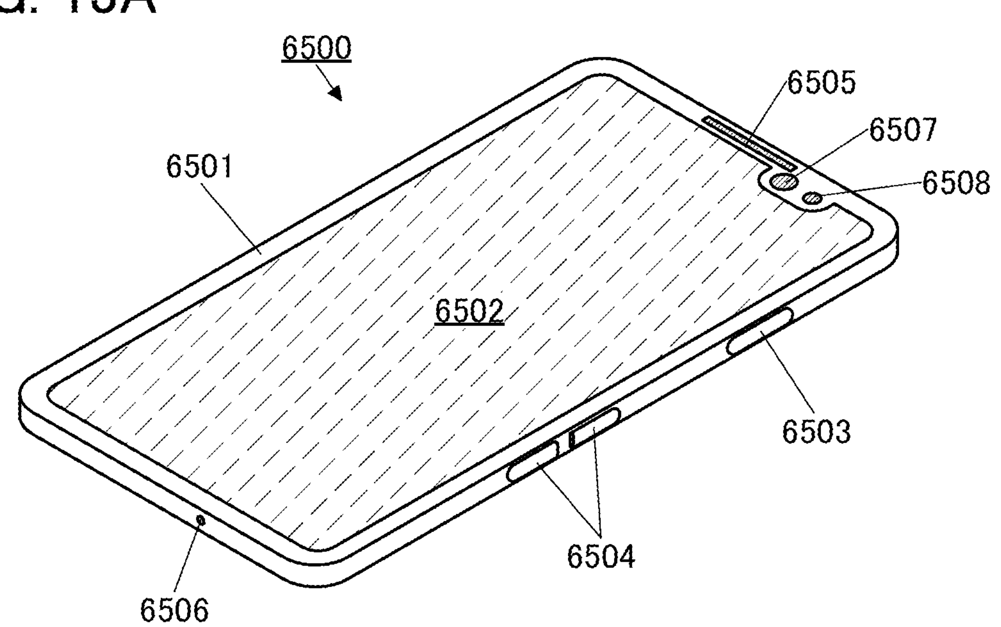
FIG. 13A and FIG. 13B are diagrams illustrating an example of electronic equipment.

An electronic device 6500 in FIG. 13A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 13B:
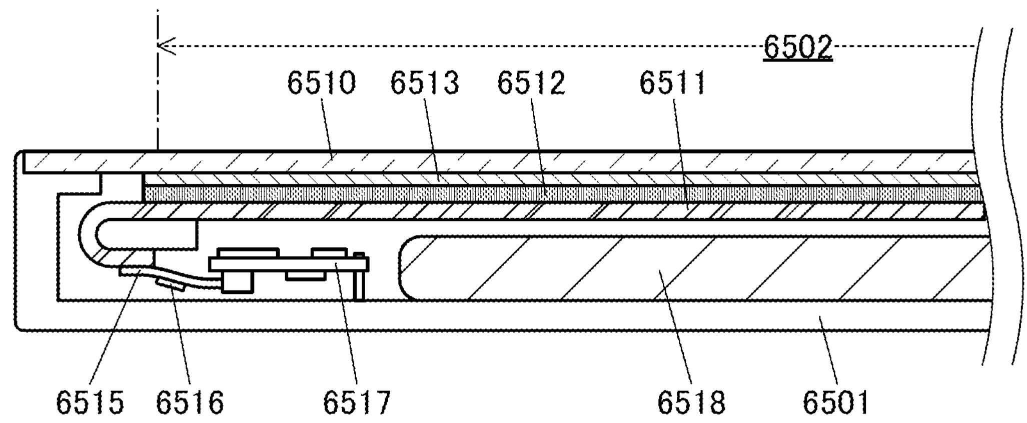

FIG. 13B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (flexible display device) of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is kept small. Moreover, part of the display panel 6511 is folded back so that a connection portion with the FPC 6515 is provided on the back side of the pixel portion, whereby an electronic device with a narrow bezel can be achieved.

Figures 14A, 14B, 14C, 14D:
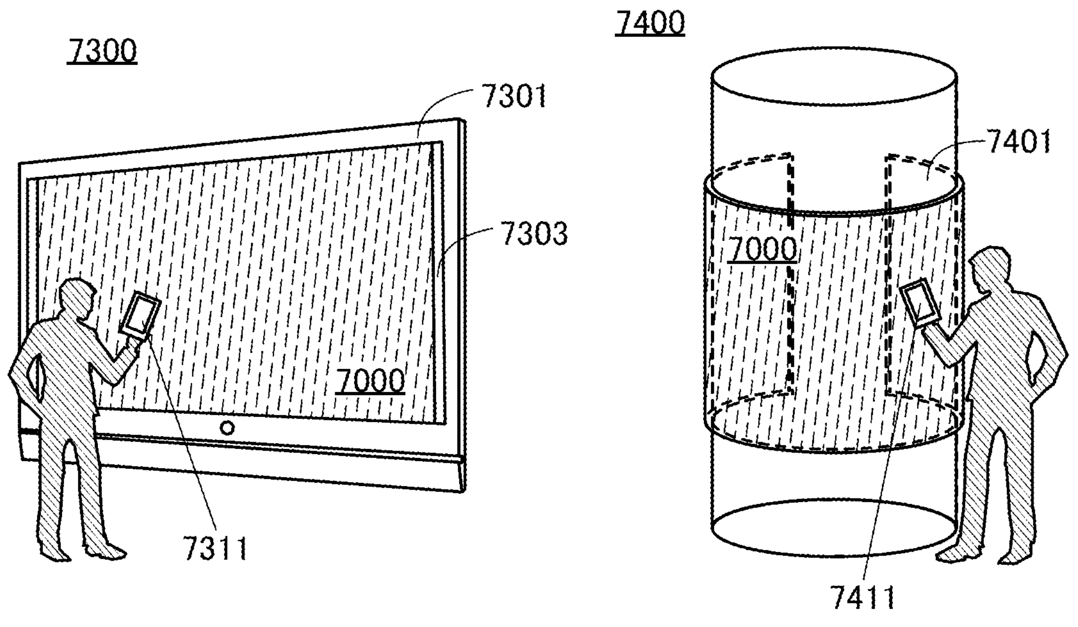
FIG. 14A to FIG. 14D are diagrams each illustrating an example of electronic equipment.

FIG. 14A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 14A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 14B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIGS. 14C and 14D illustrate examples of digital signage.

A digital signage 7300 illustrated in FIG. 14C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 14D illustrates a digital signage 7400 mounted on a cylindrical pillar 7401. The digital signage 7400 includes the display portion 7000 provided along a curved surface of the pillar 7401.

The display apparatus of one embodiment of the present invention can be used in the display portion 7000 illustrated in each of FIG. 14C and FIG. 14D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 14C and FIG. 14D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

FIG. 15A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

A display apparatus of one embodiment of the present invention can be used in the display portion 8002 of the camera 8000 and the display portion 8102 of the finder 8100. Note that a finder may be incorporated in the camera 8000.

FIG. 15B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display apparatus of one embodiment of the present invention can be used in the display portion 8204.

FIG. 15C to FIG. 15E are external views of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved so that the user can feel high realistic sensation. Another image displayed in another region of the display portion 8302 is viewed through the lenses 8305, so that three-dimensional display using parallax or the like can be performed. Note that the structure is not limited to the structure in which one display portion 8302 is provided: two display portions 8302 may be provided and one display portion may be provided per eye of the user.

The display apparatus of one embodiment of the present invention can be used for the display portion 8302. The display apparatus of one embodiment of the present invention achieves extremely high resolution. For example, a pixel is not easily seen by the user even when the user sees display that is magnified by the use of the lenses 8305 as illustrated in FIG. 15E. In other words, a video with a strong sense of reality can be seen by the user with use of the display portion 8302.

FIG. 15F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only by wearing the head-mounted display. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. It is preferable that the member in contact with user's skin, such as the cushion 8403 or the mounting portion 8402, be detachable for easy cleaning or replacement.

Electronic devices illustrated in FIG. 16A to FIG. 16F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 16A to FIG. 16F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display apparatus of one embodiment of the present invention can be used for the display portion 9001.

The electronic devices illustrated in FIG. 16A to FIG. 16F will be described in detail below.

Figures 16A, 16B, 16C, 16D, 16E, 16F:
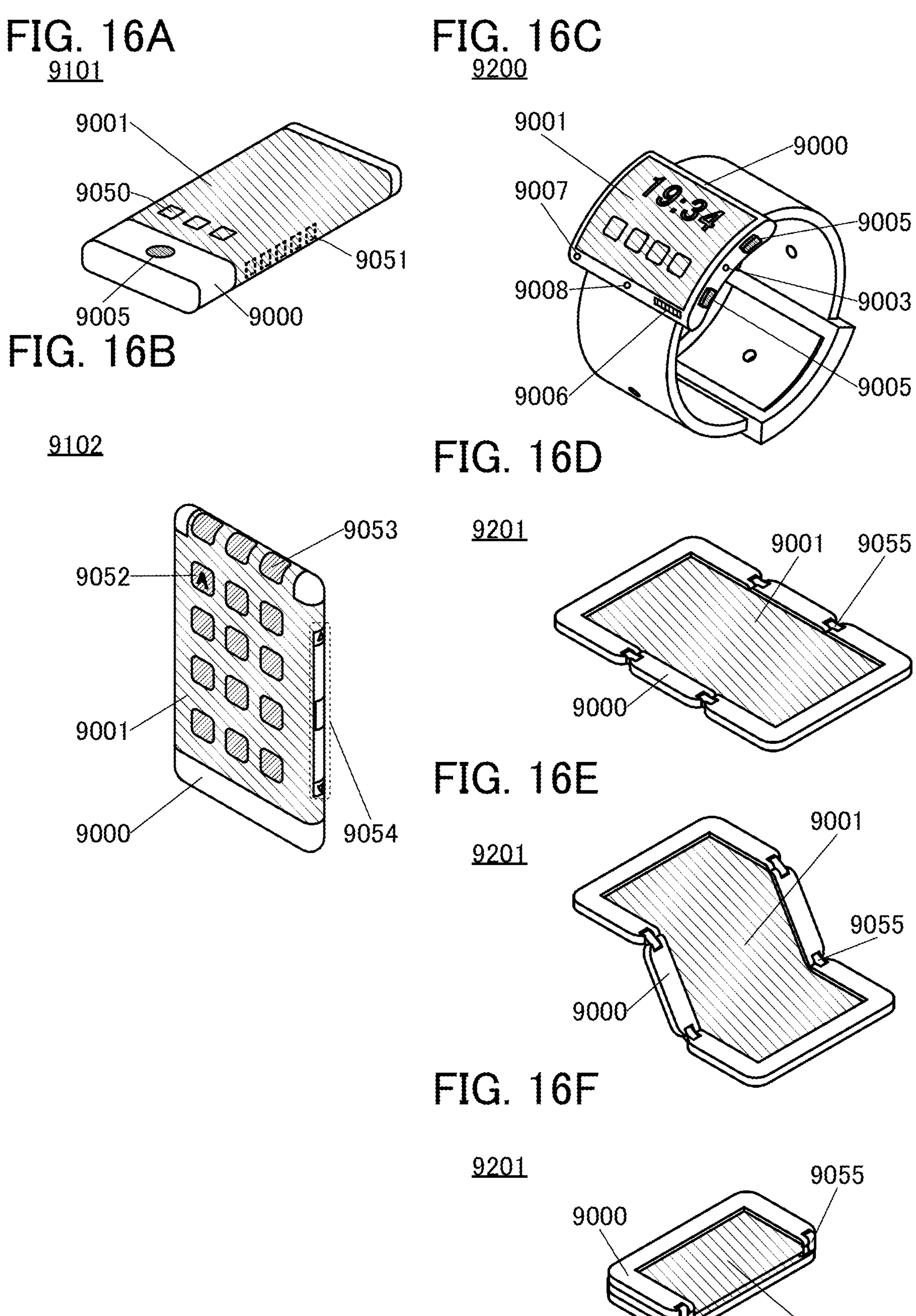
FIG. 16A to FIG. 16F are diagrams each illustrating an example of electronic equipment.
Figures 17A, 17B, 17C, 17D:
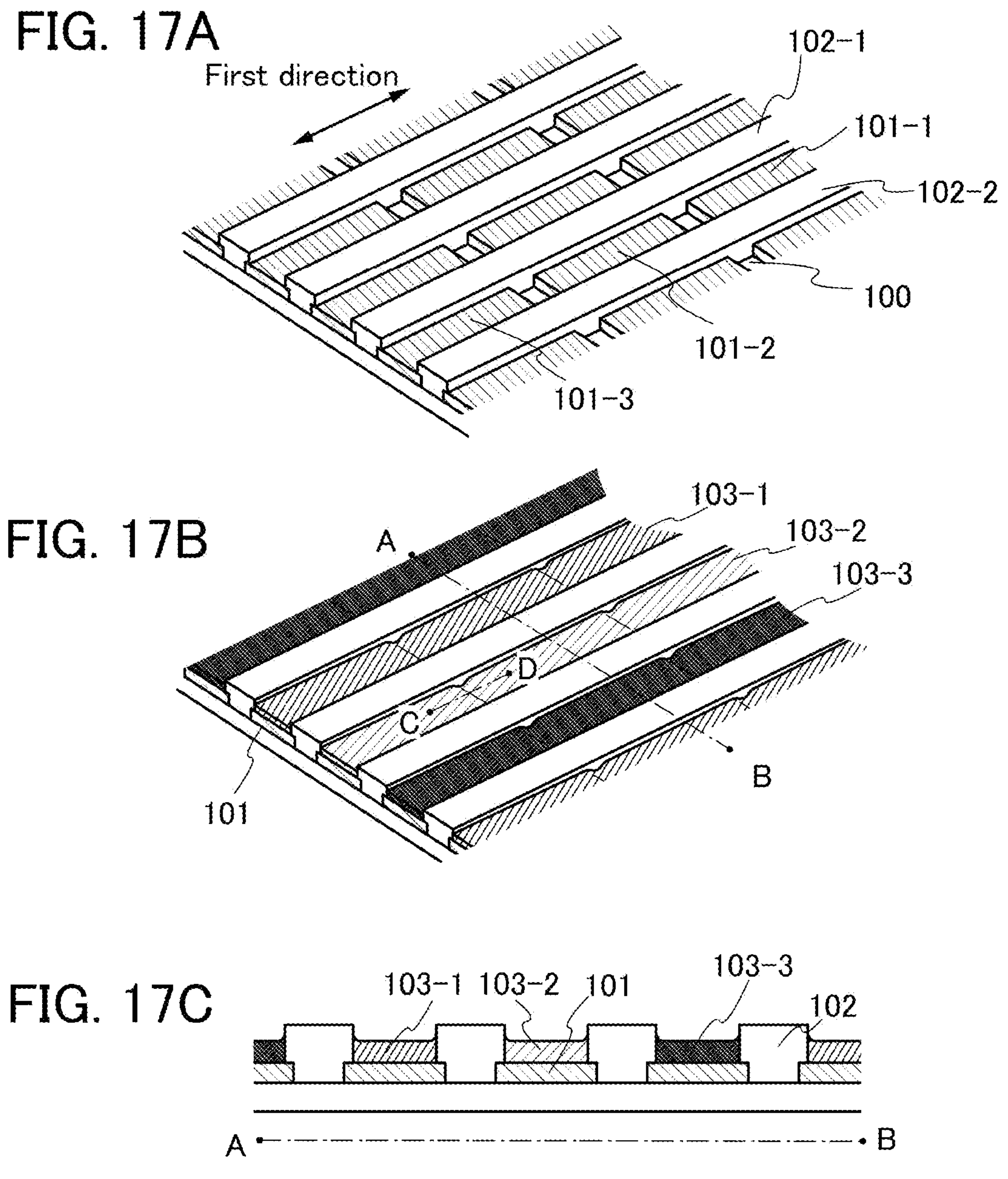
FIG. 17A, FIG. 17B, FIG. 17C and FIG. 17D are perspective views and cross-sectional views of a light-emitting apparatus.
Figure 18A:
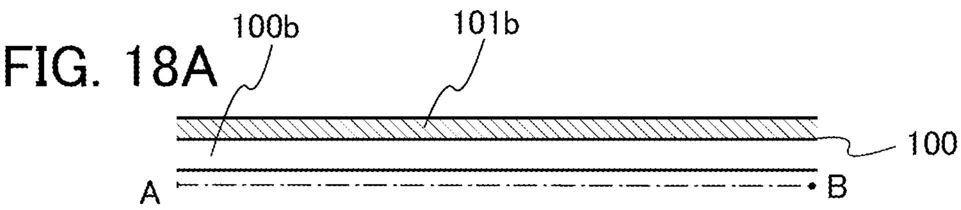
FIG. 18A to FIG. 18F are cross-sectional views illustrating manufacturing steps of a light-emitting apparatus.
Figure 18B:
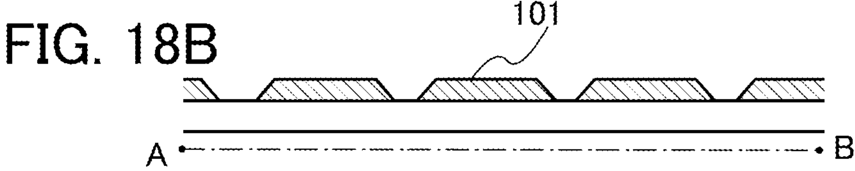
Figure 18C:
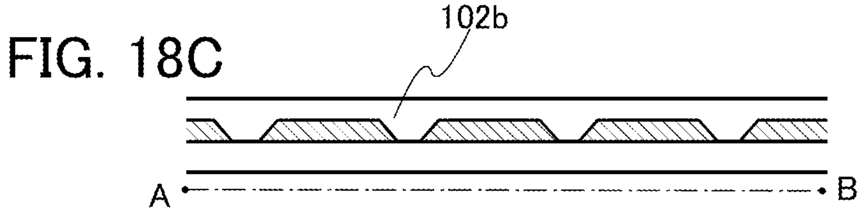
Figure 18D:
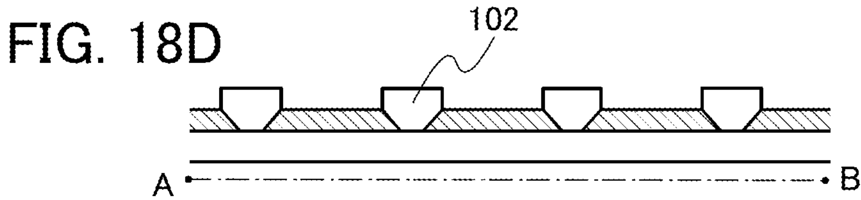
Figure 18E:
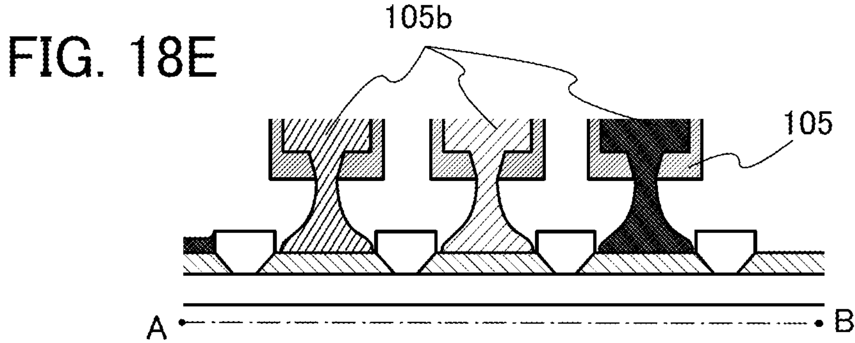
Figure 18F:
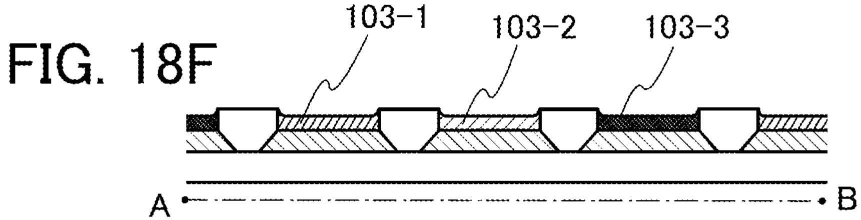

FIG. 16A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 16A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the intensity of antenna reception. Alternatively, the icon 9050 or the like may be displayed at the position where the information 9051 is displayed.

FIG. 16B is a perspective view showing a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

FIG. 16C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

FIG. 16D to FIG. 16F are perspective views illustrating a foldable portable information terminal 9201. FIG. 16D is a perspective view of an opened state of the portable information terminal 9201, FIG. 16F is a perspective view of a folded state thereof, and FIG. 16E is a perspective view of a state in the middle of change from one of FIG. 16D and FIG. 16F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with any of the other structure examples, the other drawings, and the like as appropriate.

At least part of this embodiment can be appropriately implemented in combination with any of the other embodiments described in this specification.

REFERENCE NUMERALS

20: light-emitting device, 21: lower electrode, 25: upper electrode, 100: insulating surface, 100*b*: insulator, 101: pixel electrode, 101*b*: conductive film, 102: partition, 102*b*: insulating film, 103: EL layer, 103-1: EL layer, 103-2: EL layer, 103-3: EL layer, 103*a*: EL layer, 103*b*: EL layer, 104: portion, 105*b*: material, 106: second electrode, 107*a*: light-emitting device, 107*b*: light-emitting device, 107*c*: light-emitting device, 108: carrier-transport layer, 109: carrier-injection layer, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 242: connection layer, 400A: light-emitting apparatus, 400B: light-emitting apparatus, 400C: light-emitting apparatus, 411*a*: pixel electrode, 411*b*: pixel electrode, 411*c*: pixel electrode, 413: second electrode, 416: protective layer, 416*a*: inorganic insulating layer, 416*b*: organic insulating layer, 416*c*: inorganic insulating layer, 417: light-blocking layer, 421: insulating layer, 426: optical adjustment layer, 426*a*: optical adjustment layer, 426*b*: optical adjustment layer, 426*c*: optical adjustment layer, 430*a*: light-emitting device, 430*b*: light-emitting device, 430*c*: light-emitting device, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 1400: droplet-discharge apparatus, 1402: substrate, 1403: droplet-discharge means, 1404: image-capturing means, 1405: head, 1406: dotted line, 1407: control means, 1408: storage medium, 1409: image processing means, 1410: computer, 1411: marker, 1413: material supply source, 1412: head, 1414: material supply source, 1415: material supply source, 1416: head, 4440: intermediate layer, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: key board, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: information terminal, 9102: information terminal, 9200: information terminal, 9201: information terminal.

The invention claimed is:

1. A light-emitting apparatus comprising:

a first partition and a second partition over an insulating surface, the first partition and the second partition extending in a first direction;

a first pixel electrode, a second pixel electrode, and a third pixel electrode over the insulating surface, the first pixel electrode and the second pixel electrode between the first partition and the second partition;

an EL layer over the first pixel electrode and the second pixel electrode;

a carrier-transport layer over the EL layer, the third pixel electrode, and the first partition between the first pixel electrode and the third pixel electrode; and a second electrode over the carrier-transport layer, wherein the first partition and the second partition have an insulating property, and wherein the EL layer is in contact with the insulating surface in a region between the first pixel electrode and the second pixel electrode.

2. A light-emitting apparatus comprising:

a first partition and a second partition over an insulating surface, the first partition and the second partition extending in a first direction;

a first pixel electrode, a second pixel electrode, and a third pixel electrode over the insulating surface, the first pixel electrode and the second pixel electrode between the first partition and the second partition;

an EL layer over the first pixel electrode and the second pixel electrode;

a carrier-transport layer over the EL layer, the third pixel electrode, and the first partition between the first pixel electrode and the third pixel electrode; and a second electrode over the carrier-transport layer, wherein the first partition and the second partition have an insulating property, wherein one of end portions of the first pixel electrode and one of end portions of the second partition are covered by the first partition, wherein the other of end portions of the first pixel electrode and the other of end portions of the second partition are covered by the second partition, and wherein the EL layer is in contact with the insulating surface in a region between the first pixel electrode and the second pixel electrode.

3. The light-emitting apparatus according to claim 1, wherein the EL layer is continuous and provided over the first pixel electrode and the second pixel electrode.

4. The light-emitting apparatus according to claim 1, wherein an EL layer is provided over the third pixel electrode, and wherein the EL layer over the first pixel electrode and the second pixel electrode and the EL layer over the third pixel electrode comprises different light-emitting materials.

5. The light-emitting apparatus according to claim 1, wherein the EL layer is formed by a droplet-discharge method.

6. The light-emitting apparatus according to claim 1, wherein when the EL layer is measured by ToF-SIMS, a signal is detected at around m/z=80 in a measurement result of a negative mode.

7. The light-emitting apparatus according to claim 1, wherein at least parts of the one of end portions of the first pixel electrode and at least parts of the one of the end portions of the second pixel electrode have a tapered shape.

8. The light-emitting apparatus according to claim 7, wherein a taper angle is greater than or equal to 5° and less than or equal to 90°.

9. A display apparatus comprising the light-emitting apparatus according to claim 1.

10. Electronic equipment comprising:

the light-emitting apparatus according to claim 1, a sensor, an operation button, and a speaker or a microphone.

11. A lighting device comprising:

the light-emitting apparatus according to claim 1, and a housing.

12. The light-emitting apparatus according to claim 2, wherein an EL layer is provided over the third pixel electrode, and wherein the EL layer over the first pixel electrode and the second pixel electrode and the EL layer over the third pixel electrode comprises different light-emitting materials.

13. The light-emitting apparatus according to claim 2, wherein the EL layer is formed by a droplet-discharge method.

14. The light-emitting apparatus according to claim 2, wherein when the EL layer is measured by ToF-SIMS, a signal is detected at around m/z=80 in a measurement result of a negative mode.

15. The light-emitting apparatus according to claim 2, wherein at least parts of the one of end portions of the first pixel electrode and at least parts of the one of the end portions of the second pixel electrode have a tapered shape.

16. The light-emitting apparatus according to claim 15, wherein a taper angle is greater than or equal to 5° and less than or equal to 90°.

17. A display apparatus comprising the light-emitting apparatus according to claim 2.

18. Electronic equipment comprising:

the light-emitting apparatus according to claim 2, a sensor, an operation button, and a speaker or a microphone.

19. A lighting device comprising:

the light-emitting apparatus according to claim 2, and a housing.

20. The light-emitting apparatus according to claim 2, wherein the EL layer is continuous and provided over the first pixel electrode and the second pixel electrode.

* * * * *